(12) United States Patent
Kajiwara

(10) Patent No.: US 8,822,321 B2
(45) Date of Patent: Sep. 2, 2014

(54) PATTERN FORMING METHOD

(71) Applicant: Kabushiki Kaisha Toshiba, Minato-ku (JP)

(72) Inventor: Seiji Kajiwara, Mie (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/013,996

(22) Filed: Aug. 29, 2013

(65) Prior Publication Data

US 2014/0004691 A1 Jan. 2, 2014

Related U.S. Application Data

(62) Division of application No. 13/364,624, filed on Feb. 2, 2012, now Pat. No. 8,551,875.

(30) Foreign Application Priority Data

May 13, 2011 (JP) ................................ 2011-108532

(51) Int. Cl.
*H01L 21/3205* (2006.01)

(52) U.S. Cl.
USPC ...................................... 438/588; 365/185.17

(58) Field of Classification Search
CPC ............................................ H01L 2224/27912
USPC ........................................................ 438/46
See application file for complete search history.

(56) References Cited

U.S. PATENT DOCUMENTS

| | | | |
|---|---|---|---|
| 5,510,639 A | 4/1996 | Okuda et al. | |
| 6,835,662 B1 | 12/2004 | Erhardt et al. | |
| 7,425,498 B2 | 9/2008 | Shimizu | |
| 7,592,271 B2 | 9/2009 | Jung | |
| 7,604,926 B2 | 10/2009 | Kamigaki et al. | |
| 7,776,747 B2 | 8/2010 | Ban et al. | |
| 7,851,305 B2 | 12/2010 | Okajima | |
| 7,883,964 B2 | 2/2011 | Goda et al. | |
| 8,114,736 B2 | 2/2012 | Chan et al. | |
| 8,158,333 B2 | 4/2012 | Hashimoto | |

(Continued)

FOREIGN PATENT DOCUMENTS

| | | |
|---|---|---|
| JP | 2006-303022 | 11/2006 |
| JP | 2007-305970 | 11/2007 |

(Continued)

OTHER PUBLICATIONS

Office Action issued Jun. 3, 2014 in Japanese Patent Application No. 2011-108532 filed May 13, 2011 (with English Translation).

*Primary Examiner* — Michael Jung
*Assistant Examiner* — Ankush Singal
(74) *Attorney, Agent, or Firm* — Oblon, Spivak, McClelland, Maier & Neustadt, L.L.P.

(57) ABSTRACT

According to one embodiment, an opening pattern is formed in the core film above a processing target, and a mask film is conformally formed above the processing target. Next, etchback of the mask film is performed so that the mask film remains on a side surface of the core film. After that, lineand-space shaped core patterns, made of the core film, is formed in an area other than an area forming the opening pattern. Next, sidewall patterns are formed around the core patterns, and the core patterns are removed. Next, the processing target is patterned by using the mask film and the sidewall patterns.

11 Claims, 60 Drawing Sheets

(56) References Cited

U.S. PATENT DOCUMENTS

| | | |
|---|---|---|
| 8,309,463 B2 | 11/2012 | Lee |
| 8,357,966 B2 | 1/2013 | Minemura et al. |
| 2002/0058371 A1 | 5/2002 | Ohuchi |
| 2004/0241993 A1 | 12/2004 | Lin |
| 2005/0082602 A1* | 4/2005 | Okajima ............... 257/321 |
| 2006/0014327 A1 | 1/2006 | Cho et al. |
| 2006/0030137 A1 | 2/2006 | Kim et al. |
| 2006/0128098 A1 | 6/2006 | Jeon et al. |
| 2006/0138526 A1 | 6/2006 | Okajima |
| 2006/0231822 A1 | 10/2006 | Kim |
| 2007/0034938 A1 | 2/2007 | Kang et al. |
| 2007/0063291 A1 | 3/2007 | Shimizu |
| 2007/0128823 A1 | 6/2007 | Lee et al. |
| 2007/0238053 A1 | 10/2007 | Hashimoto |
| 2008/0003775 A1 | 1/2008 | Yamada et al. |
| 2008/0293201 A1 | 11/2008 | Goda et al. |
| 2009/0017615 A1 | 1/2009 | Oh et al. |
| 2009/0050951 A1 | 2/2009 | Inaba et al. |
| 2009/0096007 A1 | 4/2009 | Omura et al. |
| 2009/0130852 A1* | 5/2009 | Kewley ............... 438/694 |
| 2009/0221147 A1 | 9/2009 | Kikutani et al. |
| 2010/0048024 A1 | 2/2010 | Sugimura |
| 2010/0155813 A1 | 6/2010 | Murata et al. |
| 2010/0221665 A1 | 9/2010 | Hashimoto |
| 2010/0264547 A1 | 10/2010 | Yanagidaira et al. |
| 2010/0330806 A1 | 12/2010 | Wang et al. |
| 2011/0059403 A1 | 3/2011 | Sukekawa |
| 2011/0097888 A1 | 4/2011 | Omura et al. |
| 2011/0124196 A1 | 5/2011 | Lee |
| 2011/0217835 A1 | 9/2011 | Sel et al. |
| 2012/0238099 A1 | 9/2012 | Shundo et al. |

FOREIGN PATENT DOCUMENTS

| | | |
|---|---|---|
| JP | 2009-49338 | 3/2009 |
| JP | 2010-153481 | 7/2010 |
| JP | 2010-153899 | 7/2010 |

* cited by examiner

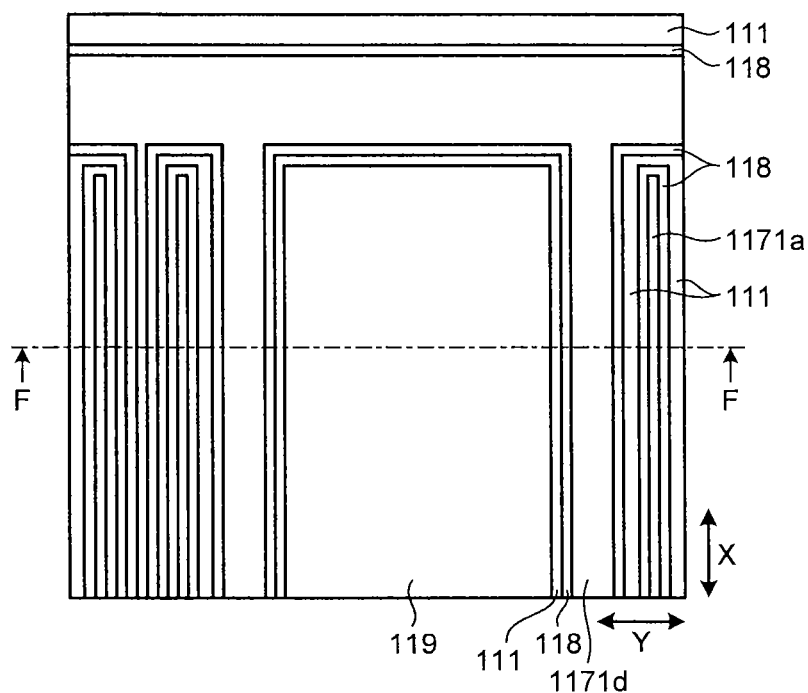
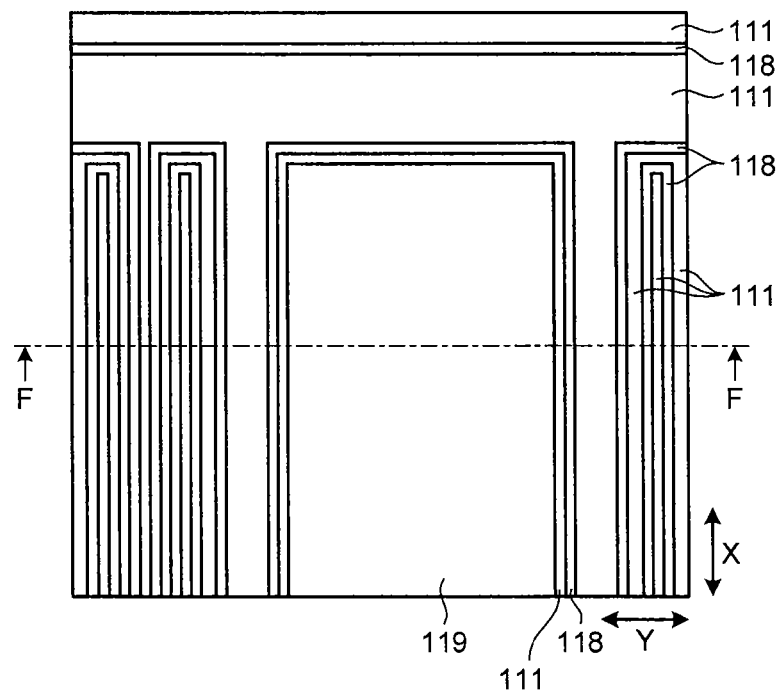

PATTERN FORMING METHOD

CROSS-REFERENCE TO RELATED APPLICATIONS

This application is a divisional of U.S. application Ser. No. 13/364,624 filed Feb. 2, 2012, and is based upon and claims the benefit of priority from Japanese Patent Application No. 2011-108532, filed on May 13, 2011; the entire contents of each of which are incorporated herein by reference.

FIELD

Embodiments described herein relate generally to a pattern forming method.

BACKGROUND

With downsizing of semiconductor devices, it becomes difficult to form a line-and-space pattern having a width narrower than the resolution limit of lithography. In order to solve this problem, a sidewall transferring process has been proposed.

In the related arts, for example, a NAND type flash memory is manufactured by using the following method which uses the sidewall transferring process. First, in a semiconductor substrate on which a tunnel insulating film, a floating gate electrode film, an inter-electrode insulating film, and a control gate electrode film are stacked, a mask film and a hard mask film are further stacked on a processing target film. Next, a resist pattern used to form selection gate lines or peripheral circuits is formed on the hard mask film by using a general photolithography technique, and the hard mask film is etched with the resist pattern as an etching mask by using an RIE (Reactive Ion Etching) method so as to form a hard mask pattern. After that, in an area for forming word lines, line-and-space shaped resist patterns having a first pitch are formed on the mask film by using the general photolithography technique. After a sliming process is performed on the resist patterns, the mask film is etched with the resist patterns and the hard mask patterns as etching masks by using the RIE method so as to form mask patterns. Next, a sidewall film is conformally formed on the processing target film with use of the mask patterns formed thereon. After performing an etch-back process, the mask patterns in the area for word lines are removed, so that closed-loop-shaped sidewall patterns are formed. Next, the processing target film is processed by using the closed-loop-shaped sidewall patterns in the area for word lines while it is processed by using the mask pattern in the other areas. Accordingly, the word lines, the selection gate lines, and the peripheral circuits of the NAND type flash memory are formed.

In this manner, since an exposure process cannot be formed simultaneously for fine patterns and relatively large-scale patterns with the photolithography technique of the related art, the line-and-space patterns for forming word lines having the smallest size in a semiconductor device and the patterns for forming selection gate lines or peripheral circuits having relatively large sizes are formed by using different exposure processes.

In addition, in a case where the mask is formed by using the photolithography technique and the processing target film is processed by using the mask through the RIE method as described above, conversion difference generally occurs in which the processed pattern becomes larger in size than the mask, which hinders patterns from being formed with high accuracy.

DETAILED DESCRIPTION

In general, according to embodiments, a first core film is formed above a processing target, an opening pattern is formed in a predetermined area of the first core film, and a mask film is conformally formed above the processing target above which the opening pattern is formed. Next, etch-back of the mask film is performed until an upper surface of the first core film is exposed so that the mask film remains on a side surface of the first core film. After that, line-and-space shaped first core patterns that are made of the first core film and in which widths of line patterns have smaller than a width of the mask film remaining on the side surface of the first core film is formed in an area other than an area forming the opening pattern. Next, a first sidewall film is conformally formed above the processing target above which the mask film and the first core patterns are formed, etch-back of the first sidewall film is performed so that upper surfaces of the first core patterns are exposed. Then, the first sidewall patterns which are made of the first sidewall film are formed above the processing target by removing the first core patterns. Next, the processing target is patterned by using the mask film and the first sidewall patterns.

Exemplary embodiments of a pattern forming method will be explained below in detail with reference to the accompanying drawings. The present invention is not limited to the following embodiments. In addition, cross-sectional views of a non-volatile semiconductor memory device used for the following embodiments are schematic views, and relation between thicknesses and widths of layers, ratios of thickness of layers, or the like may be different from those of a real device. In addition, the thicknesses of layers indicated hereinafter are exemplary ones, and the present invention is not limited thereto.

(First Embodiment)

Hereinafter, the case where the embodiment is applied to a NAND type flash memory device will be described. The NAND type flash memory device includes a memory cell area where a plurality of memory cell transistors (hereinafter, referred to as memory cells) are disposed in a matrix shape and a peripheral circuit area where the peripheral circuit transistors are included to drive the memory cells.

Figure 1:
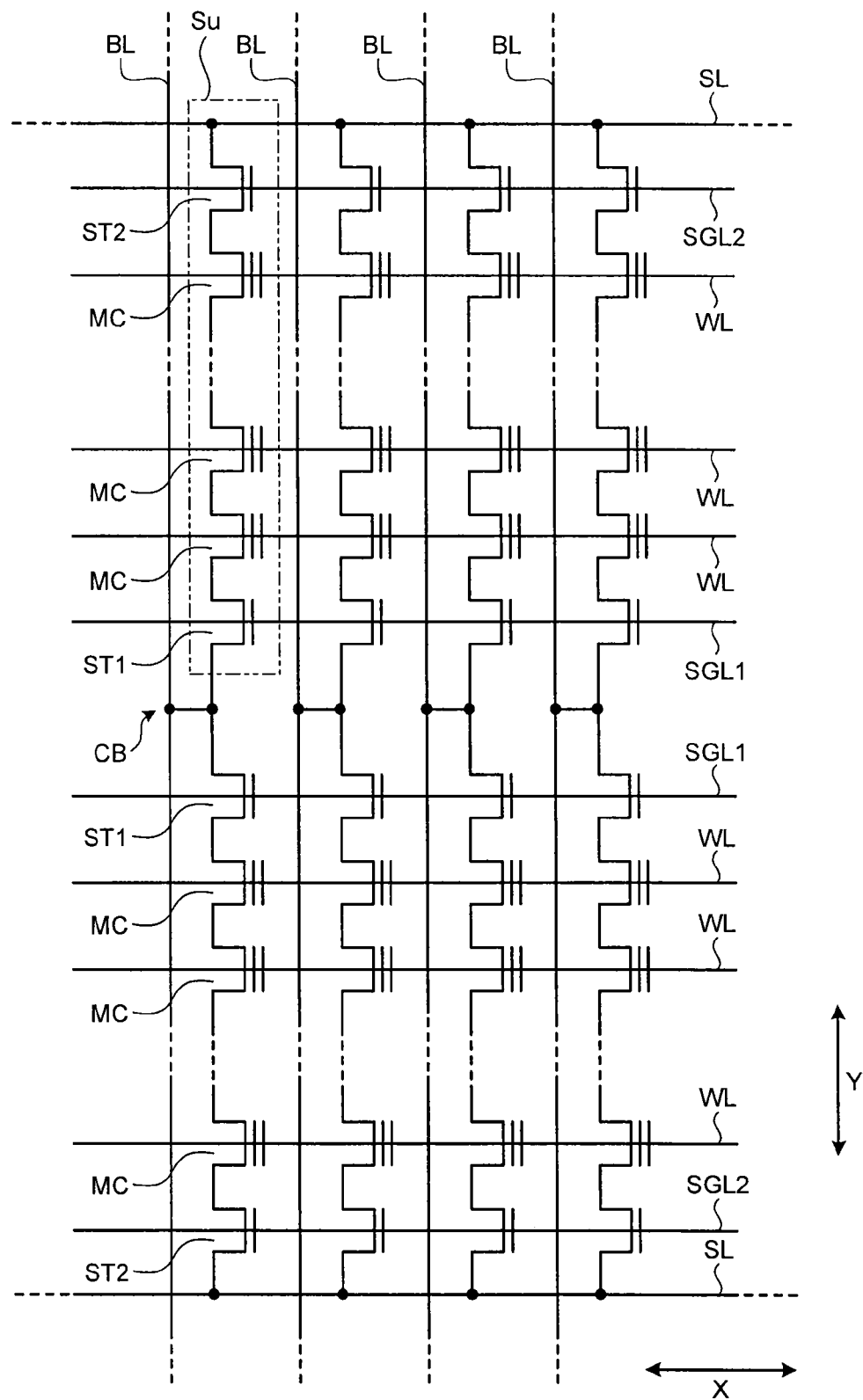
FIG. 1 is an equivalent circuit diagram illustrating a portion of a memory cell array formed in a memory cell area of a NAND type flash memory device.

FIG. 1 is an equivalent circuit diagram illustrating a portion of a memory cell array formed in a memory cell area of the NAND type flash memory device. The memory cell array of the NAND type flash memory device is configured where NAND cell units (memory units) Su including two selection gate transistors ST1 and ST2 and a memory cell row where a plurality (for example, $2^n$ (n is a positive integer)) of the memory cells MC are connected serially between the selection gate transistors ST1 and ST2 are disposed in a matrix shape. In the NAND cell unit Su, a plurality of the memory cells MC are formed such that the adjacent memory cells share source/drain regions.

The memory cells MC which are arranged in the X direction (corresponding to a word line direction and a gate width direction) of FIG. 1 are commonly connected by a word line (control gate line) WL. In addition, the selection gate transistors ST1 which are arranged in the X direction of FIG. 1 are commonly connected by a selection gate line SGL1, and the selection gate transistors ST2 are commonly connected by a selection gate line SGL2. A bit line contact CB is connected to the drain region of the selection gate transistor ST1. One end of the bit line contact CB is connected to a bit line BL which extends in the Y direction (corresponding to a bit line direction and a gate longitudinal direction) perpendicular to the X direction of FIG. 1. In addition, the selection gate transistor ST2 is connected to a source line SL which extends in the X direction of FIG. 1 through the source region.

Figure 2:
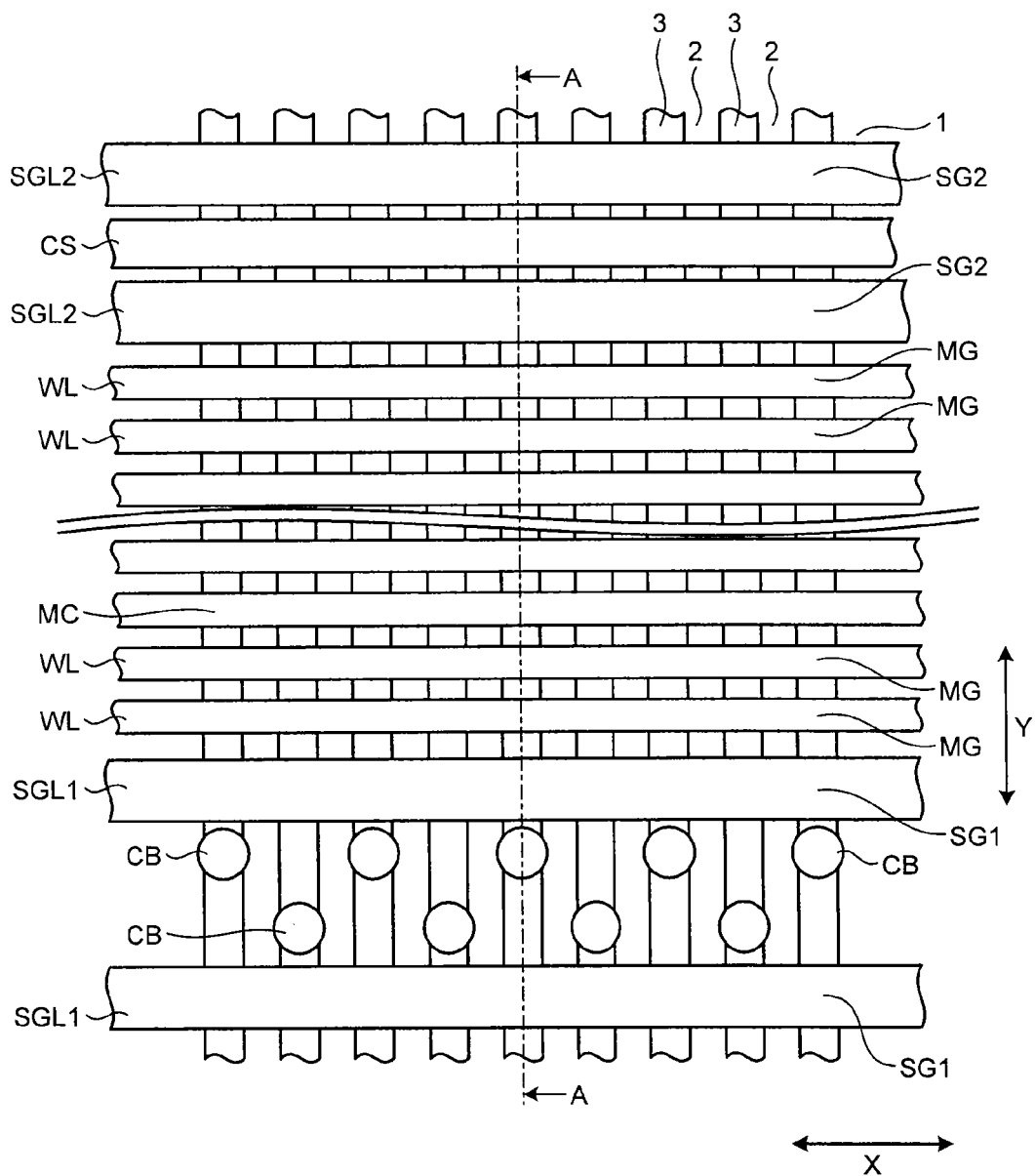
FIG. 2 is a plan view illustrating a layout pattern of a portion of the memory cell area.

FIG. 2 is a plan view illustrating a layout pattern of a portion of the memory cell area. In the semiconductor substrate 1, a plurality of shallow trench isolation (STI) 2 are formed as element isolation areas to extend in the Y direction of FIG. 2 at a predetermined interval in the X direction, so that, the adjacent activated areas 3 are separated from each other in the X direction of FIG. 2. Word lines WL of the memory cells MC are formed to extend in the X direction of FIG. 2 perpendicular to the activated area 3 at a predetermined interval in the Y direction.

In addition, the two selection gate lines SGL1 which extend in the X direction of FIG. 2 are formed to be adjacent to each other in parallel. The bit line contacts CB are formed in the activated areas 3 between the adjacent two selection gate lines SGL1. In this example, the bit line contacts CB are disposed such that the positions thereof in the Y direction are alternately changed in the adjacent activated areas 3. In other words, between the two selection gate lines SGL1, the bit line contacts CB disposed at one selection gate line SGL1 side and the bit line contacts CB disposed at the other selection gate line SGL1 side are disposed alternately, so-called, in a zigzag shape.

Similarly to the case of the selection gate lines SGL1, the two selection gate lines SGL2 which extend in the X direction of FIG. 2 are formed at the positions where the selection gate lines SGL1 and a predetermined number of the word lines WL exist so as to be parallel to each other. The source line contacts CS are disposed in the activated areas 3 between the two selection gate lines SGL2.

The stacked gate structures MG of the memory cells MC are formed in the activated areas 3 intersecting the word lines WL, and the gate structures SG1 and SG2 of the selection gate transistors ST1 and ST2 are formed in the activated areas 3 intersecting the selection gate lines SGL1 and SGL2.

Figure 3:
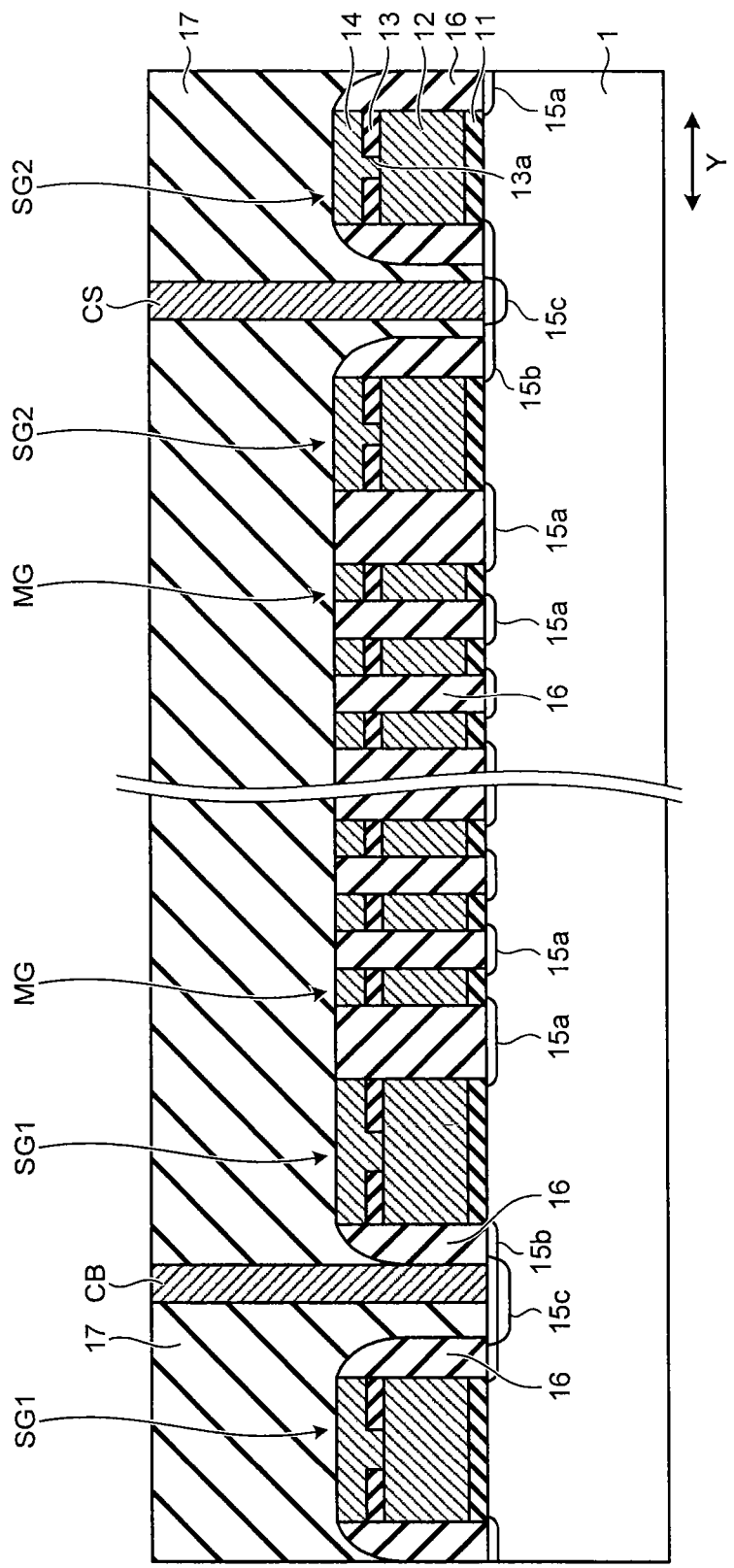
FIG. 3 is a cross-sectional view taken along line A-A of FIG. 2.

FIG. 3 is a cross-sectional view taken along line A-A of FIG. 2. In other words, this figure illustrates the gate structures SG1 and SG2 of the selection gate transistors ST1 and ST2 and the stacked gate structures MG of the memory cells MC disposed between the two selection gate transistors ST1 and ST2 in the activated area 3. In FIG. 3, the stacked gate structures MG of the memory cells MC and the gate structures SG1 and SG2 of the selection gate transistors ST1 and ST2 which are formed on the semiconductor substrate 1 such as a silicon substrate has a structure where a floating gate electrode film 12, an inter-electrode insulating film 13, and a control gate electrode film 14 are sequentially stacked through a tunnel insulating film 11. In addition, an opening 13a for conduction between the floating gate electrode film 12 and the control gate electrode film 14 is formed in each of the inter-electrode insulating films 13 of the gate structures SG1 and SG2 of the selection gate transistors ST1 and ST2, and a control gate electrode film 14 is embedded in the opening 13a. Therefore, a gate electrode is configured to include the floating gate electrode film 12 and the control gate electrode film 14 in each of the selection gate transistors ST1 and ST2.

A thermal oxide film, a thermal oxide nitride film, a chemical vapor deposition (CVD) oxide film, a CVD oxide nitride film, an insulating film with Si being interposed, an insulating film with Si being embedded in a dot shape, or the like may be used as the tunnel insulating film 11. A polycrystalline silicon doped with N type impurities or P type impurities, a metal film or a polymetal film using Mo, Ti, W, Al, Ta, or the like, a nitride film, or the like may be used as the floating gate electrode film 12. A silicon oxide film, a silicon nitride film, an ONO (Oxide-Nitride-Oxide) film having a stacked structure of a silicon oxide film and a silicon nitride film, a high dielectric film such as an aluminum oxide film or a hafnium oxide film, a stacked structure of a low dielectric film such as a silicon oxide film or a silicon nitride film, or the like and a high dielectric film may be used as the inter-electrode insulating film 13. A polycrystalline silicon doped with N type impurities or P type impurities, a metal film or a polymetal film using Mo, Ti, W, Al, Ta, or the like, a stacked structure of a polycrystalline silicon film and a metal silicide film, or the like may be used as the control gate electrode film 14.

Impurity diffusion regions 15a which becomes source/drain regions are formed in the vicinity of the surface of the semiconductor substrate 1 between the stacked gate structures MG-MG and between the stacked gate structure MG and the gate structures SG1 and SG2. In addition, similarly to the impurity diffusion regions 15a, impurity diffusion regions 15b which become source/drain regions are formed in the vicinity of the surface of the semiconductor substrate 1 between the adjacent gate structures SG1-SG1 and between the adjacent gate structures SG2-SG2.

Sidewall insulating films 16 which is made of, for example, a silicon oxide film are formed between a pair of the adjacent stacked gate structures MG-MG, between the stacked gate structure MG and the gate structures SG1 and SG2, on the sidewall surfaces between the gate structures SG1-SG1, and on the sidewall surfaces between the gate structures SG2-

SG2. Herein, the sidewall insulating films 16 are formed so as to be embedded between the stacked gate structures MG-MG and between the stacked gate structure MG and the gate structures SG1 and SG2. However, between the gate structures SG1-SG1 and between gate structures SG2-SG2, the sidewall insulating films 16 are not fully embedded, but the sidewall insulating films 16 are formed to be disposed on the facing sidewall surfaces.

Impurity diffusion regions 15c for decreasing contact resistance of the bit line contact CB and the source line contact CS are formed in the vicinity of the surface of the semiconductor substrate 1 between the sidewall insulating films 16 facing each other between the gate structures SG1-SG1 and between the gate structures SG2-SG2. The impurity diffusion region 15c is formed such that the width size is narrower and the diffusion depth (pn junction depth) is deeper than those of the impurity diffusion region 15b, so that an LDD (Lightly Doped Drain) structure is formed.

In addition, an interlayer insulating film 17 is formed on the stacked gate structure MG and the gate structures SG1 and SG2 where the sidewall insulating films 16 are formed. The bit line contact CB from the upper surface of the interlayer insulating film 17 to the surface of the semiconductor substrate 1 is formed between the adjacent gate structures SG1-SG1 at one end portion of a row of the memory cells MC. As described above, as seen in the top view, the bit line contacts CB are disposed alternately in a zigzag shape, and in the case of FIG. 3, the bit line contact is formed at a position which is shifted rightwards. In addition, a source line contact CS from the upper surface of the interlayer insulating film 17 to the surface of the semiconductor substrate 1 is formed across the bit lines BL between the adjacent gate structures SG2-SG2 at the other end portion of the row of the memory cells MC.

Next, the pattern forming method is described by exemplifying manufacturing of a non-volatile semiconductor memory device. FIGS. 4A to 4M are partial cross-sectional views schematically illustrating an example of a pattern forming method according to a first embodiment, and FIGS. 5A to 5M are partial plan views schematically illustrating the example of the pattern forming method according to the first embodiment. In addition, FIGS. 4A to 4M correspond to cross-sectional views taken line B-B of FIGS. 5A to 5M. In addition, these figures illustrate a portion where the two memory units Su are disposed to be adjacent to each other in the bit line direction.

First, the tunnel insulating film 11 and the floating gate electrode film 12 are formed on the semiconductor substrate 1 such as a predetermined conductivity type silicon substrate, and trenches reaching the semiconductor substrate 1 are formed by using a photolithography technique and an etching technique such as the RIE method. The trenches are formed to extend in the Y direction (bit line direction) at a predetermined interval in the X direction (word line direction). Next, insulating films such as silicon oxide films are embedded in the trenches, so that the STIs2 are formed. After that, the inter-electrode insulating film 13 is formed above the entire surface of the semiconductor substrate 1, and an opening penetrating the inter-electrode insulating film 13 is formed in the area for forming the selection gate lines SGL1 and SGL2 by using the photolithography technique and the etching technique. Next, the control gate electrode film 14 is formed above the entire surface of the semiconductor substrate 1. In addition, although the processing objects are the tunnel insulating film 11, the floating gate electrode film 12, the inter-electrode insulating film 13, and the control gate electrode film 14 formed on the semiconductor substrate 1, in the cross-sectional views described hereinafter, only the control gate electrode film 14 in the top layer is illustrated and described as the processing object. In addition, the control gate electrode film 14 is assumed to be made of Si.

Figure 4A:
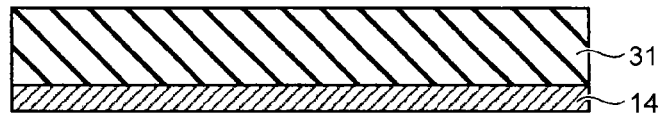
FIGS. 4A to 4M are partial cross-sectional views schematically illustrating an example of a pattern forming method according to a first embodiment.
Figure 5A:
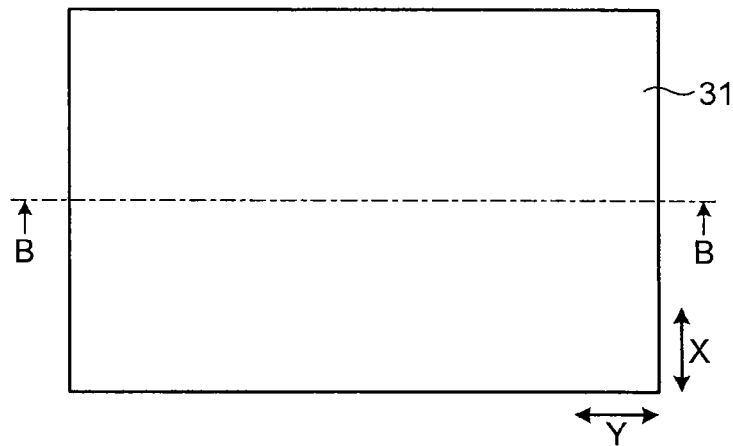
FIGS. 5A to 5M are partial plan views schematically illustrating the example of the pattern forming method according to the first embodiment.

Next, as illustrated in FIGS. 4A and 5A, a core film 31 is formed on the entire surface of the processing object (control gate electrode film 14). For example, a tetraethoxysilane (TEOS) film having a thickness of 200 nm may be used as the core film 31.

Figure 4B:
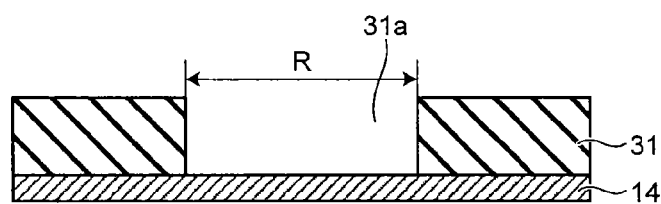
Figure 5B:
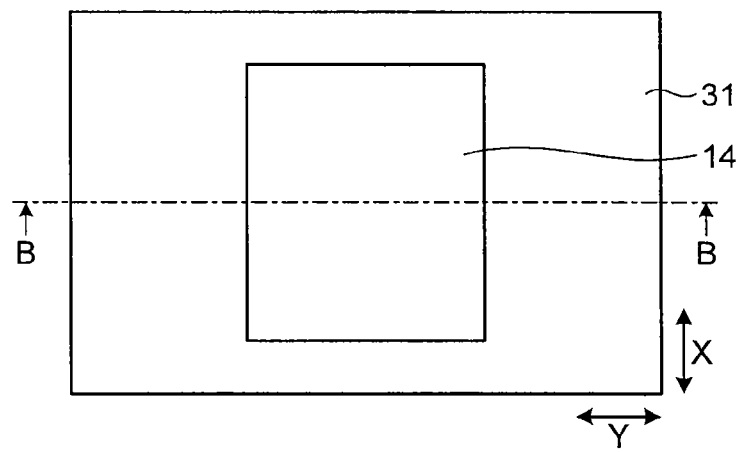

After that, as illustrated in FIGS. 4B and 5B, a resist (not shown) is applied on the core film 31, and a resist pattern is formed to open an area R including the areas for forming the selection gate transistors ST1 and ST2 between the adjacent memory units Su by using the photolithography technique. The opening is formed such that the width thereof in the Y direction becomes a width including a pair of the gate structures SG1 and SG2 of the selection gate transistors ST1 and ST2 and the length thereof in the X direction becomes a length substantially equal to the length of the word line WL. Herein, the size in the Y direction is set to 200 nm, and the size in the X direction is set to 4000 nm. Next, the core film 31 is etched according to the RIE method by using the resist pattern as a mask. At this time, for example, $C_4F_8$ or the like of which the selection ratio to Si of the control gate electrode film 14 can be easily taken may be used as an etching gas. Therefore, an opening 31a is formed to extend in the X direction.

Figure 4C:
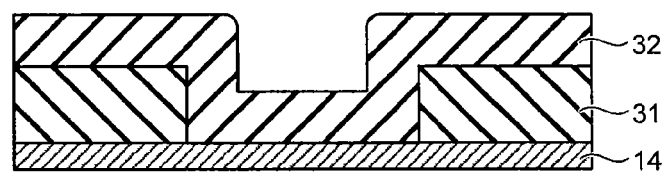
Figure 5C:
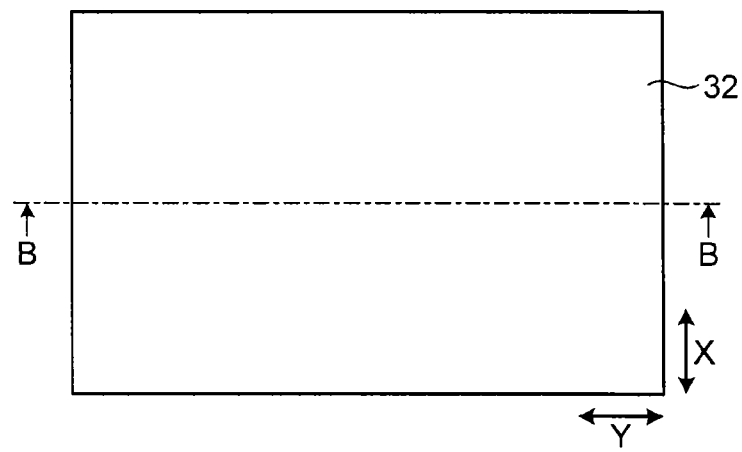

Next, as illustrated in FIGS. 4C and 5C, a mask film 32 which becomes a mask for etching the selection gate lines SGL1 and SGL2 is formed on the processing object and the core film 31. Herein, the mask film 32 is formed such that a step difference in the opening 31a is conformally covered. For example, an SiN film may be used as the mask film 32. The width of the mask film 32 (thickness thereof on the side surface of the core film 31) is preferably set to the value obtained by subtracting a desired width of the word line WL (in this example, the width of two lines) from the width of the selection gate lines SGL1 and SGL2 in FIG. 2, and in this example, the film is formed to have a width of 50 nm. Since a sidewall film is formed to have a width equal to that of the word line WL in the following process, the width is formed to be reduced by the amount in advance.

Figure 4D:
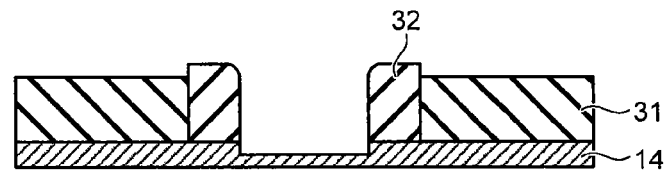
Figure 5D:
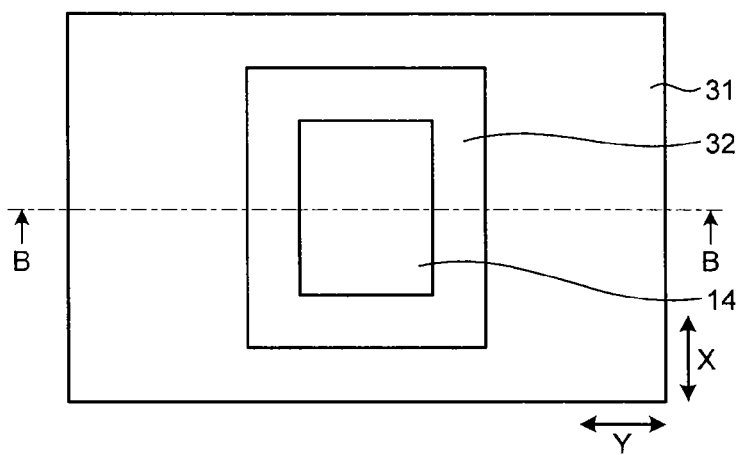

Subsequently, as illustrated in FIGS. 4D and 5D, etch-back of the mask film 32 is performed by anisotropic etching such as the RIE method until at least the core film 31 is exposed. For example, $CH_2F_2$ gas or the like may be used as a processing gas. Therefore, the mask film 32 selectively remains on the side surface of the core film 31, and the mask for forming the selection gate lines SGL1 and SGL2 in FIG. 2 is formed.

Figure 4E:
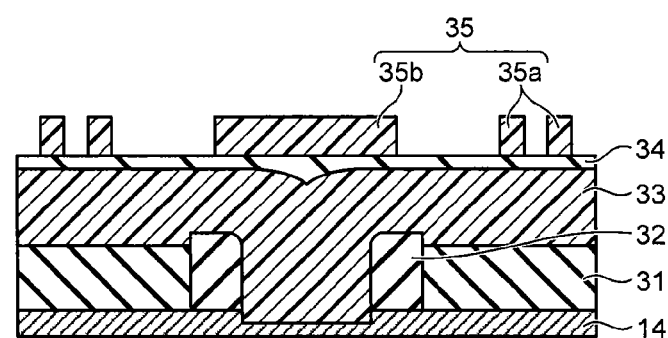
Figure 5E:
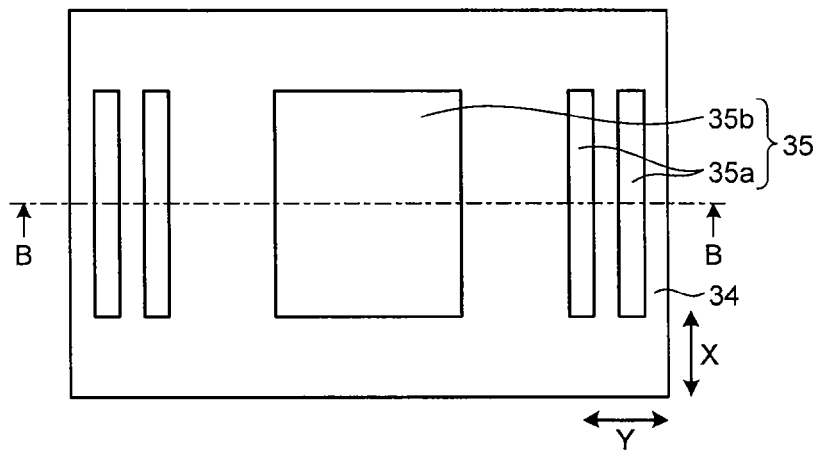

After that, as illustrated in FIGS. 4E and 5E, a resist 33 is applied on the processing object, and a mask film 34 is formed thereon. Photo resist coating is further performed thereon, and resist patterns 35 is formed by a lithography technique. A core forming resist patterns 35a for the sidewall transferring process on an area where the core film 31 is formed and a resist pattern 35b which covers the area R are formed as the resist patterns 35. In addition, in the case where etching is performed under the condition where the control gate electrode film 14 is difficult to be etched in comparison with the core film 31 in the next etching process, the resist pattern 35b is unnecessary. Herein, the widths of the core forming resist patterns 35a are set to 50 nm, and the distances (spaces) between the core forming resist patterns 35a are also set to 50 nm. In addition, herein, a multi-layer resist process structure is formed. In this structure, thicker patterned resist is formed by transferring the resist patterns 35 to the mask film 34 once and processing the resist 33 using the mask film 34 as a mask. However, the structure is not necessarily required.

Figure 4F:
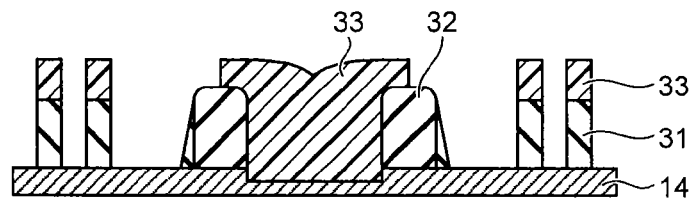
Figure 4G:
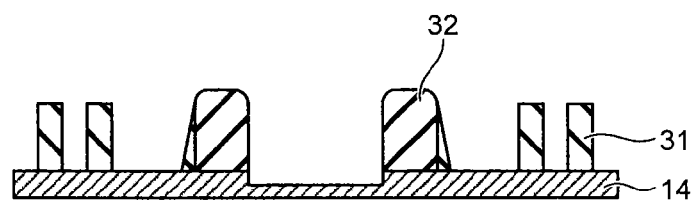
Figure 5F:
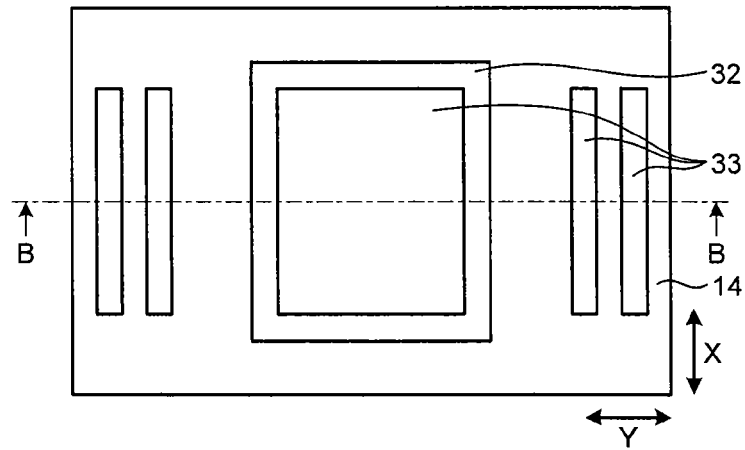
Figure 5G:
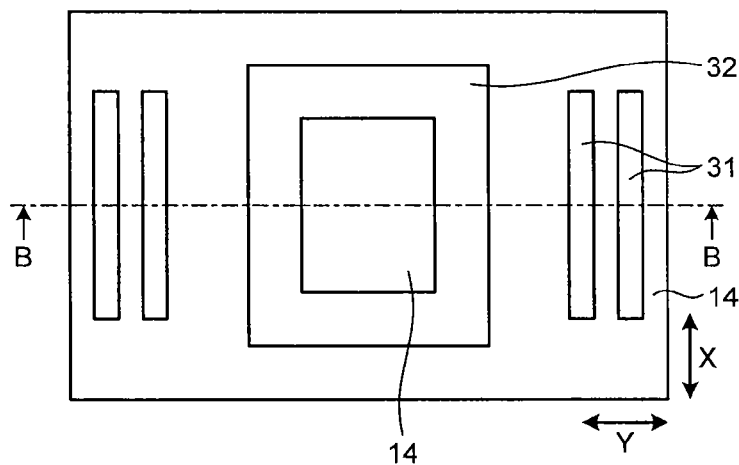

Next, as illustrated in FIGS. 4F and 5F, the core forming resist patterns 35a are transferred to the core film 31 by the RIE method using the resist patterns 35 as a mask. At this time, a $C_4F_8$ based gas may be used of which the selection ratio to the control gate electrode film 14 or the mask film 32 of the processing object can be easily taken. After that, as illustrated in FIGS. 4G and 5G, the resist 33 is removed by a resist stripping technique. The selection ratio to the core film 31/the mask film 32/the processing object (control gate electrode film 14) is taken, and the resist 33 is removed by using a gas containing, for example, $O_2$ as a main component.

Figure 4H:
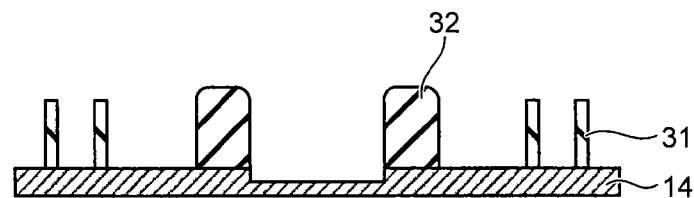
Figure 5H:
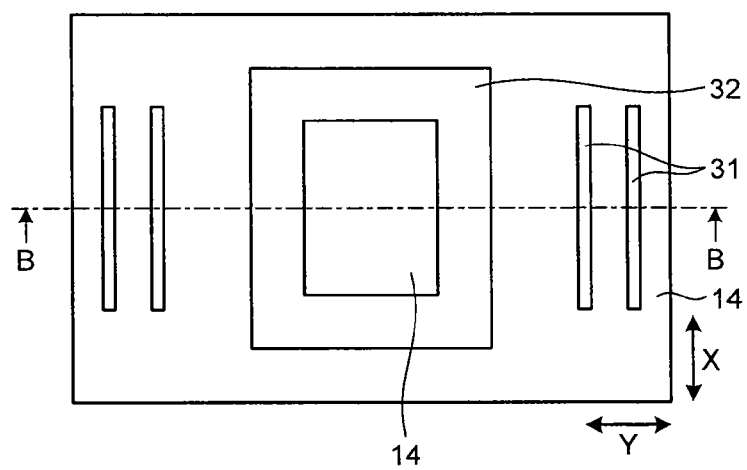

Next, as illustrated in FIGS. 4H and 5H, the sliming of the core films 31 is performed by using the isotropic etching until the core films 31 have substantially half width (herein, 25 nm). For example, wet etching using hydrofluoric acid may be employed as the isotropic etching. In addition, instead of sliming the core films 31 in FIGS. 4H and 5H, after sliming the resist patterns 35 formed in FIGS. 4E and 5E, the slimed resist patterns 35 may be transferred to the core film 31. Sliming may be performed on any one of films formed between the resist patterns 35 and the core film 31 when the resist patterns 35 is transferred to the core film 31, or RIE may be performed under the condition that sliming of the core films 31 themselves is performed. Alternatively, the core film 31 of which the width is substantially half the widths of the core forming resist patterns 35a may be obtained by combining the sliming of the core film 31 and the sliming of the resist patterns 35 or the like.

Figure 4I:
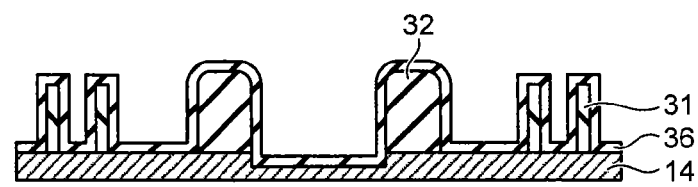
Figure 5I:
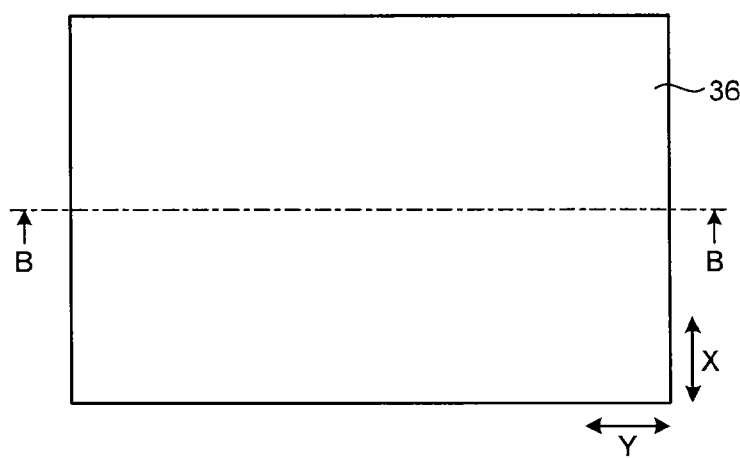

Subsequently, as illustrated in FIGS. 4I and 5I, a sidewall film 36 is formed above the entire surface of the processing object. The sidewall film 36 is formed to conformally cover the core films 31 formed on the processing object and the mask film 32. For example, an SiN film may be used as the sidewall film 36, and a thickness thereof may be substantially equal to the width 25 nm of the core films 31.

Figure 4J:
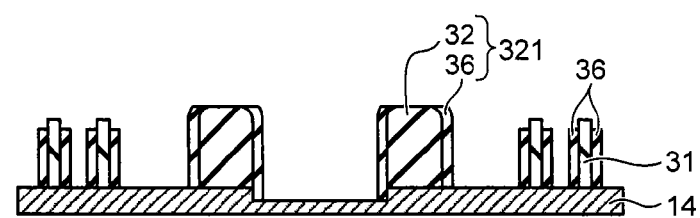
Figure 5J:
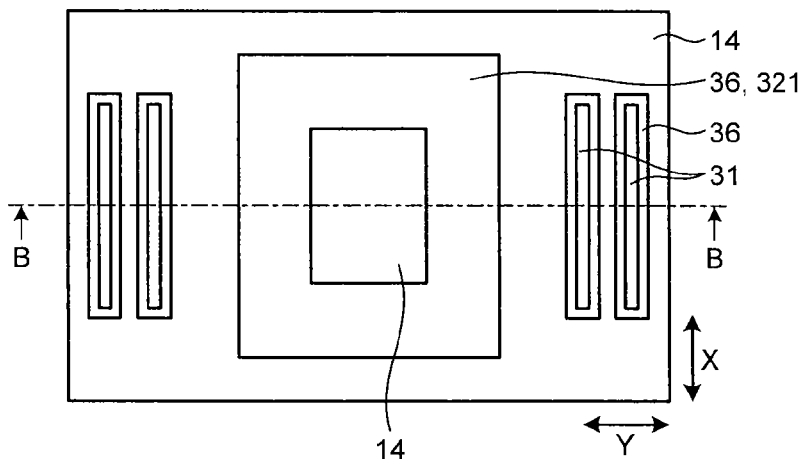

Next, as illustrated in FIGS. 4J and 5J, etch-back of the formed sidewall film 36 is performed by anisotropic etching such as the RIE method until the upper surface of the core films 31 are exposed. For example, a $CH_2F_2$ gas or the like may be used as a processing gas. Therefore, loop-shaped sidewall films 36 are formed around the core films 31. In addition, loop-shaped sidewall films 36 are also formed around the mask film 32, so that the size of the mask film 32 is increased by the thickness (50 nm) of the sidewall films 36 formed in both sides. Hereinafter, the mask film 32 on which the sidewall films 36 are formed is referred to as a mask film 321.

Figure 4K:
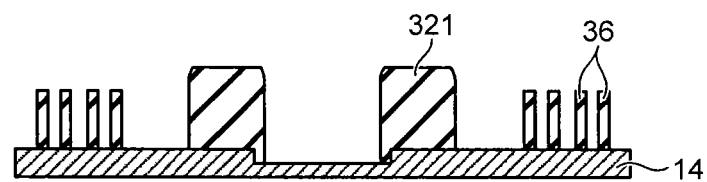
Figure 5K:
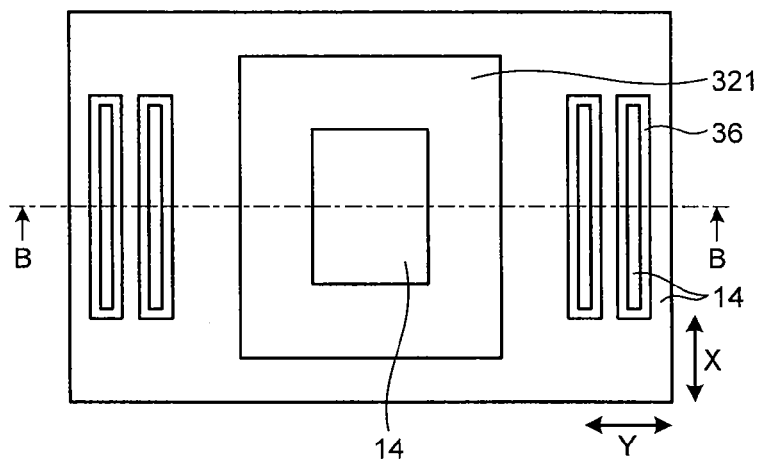

After that, as illustrated in FIGS. 4K and 5K, the core films 31 are removed by using an etching process by taking a selection ratio to the control gate electrode film 14 and the mask film 321. Wet etching using hydrofluoric acid may be employed as the etching process. Therefore, the sidewall films 36 formed on the side surfaces of the core films 31 are formed as new line patterns, and masks for forming the word lines WL in FIG. 2 are produced. Herein, the sizes of the word lines formation masks and the distances (spaces) between the adjacent word lines formation masks become 25 nm, and the size of the selection gate line formation mask becomes 100 nm.

Figure 4L:
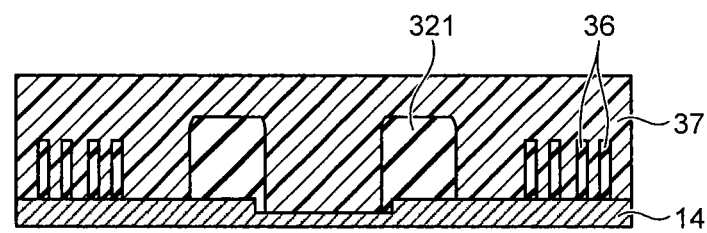
Figure 4M:
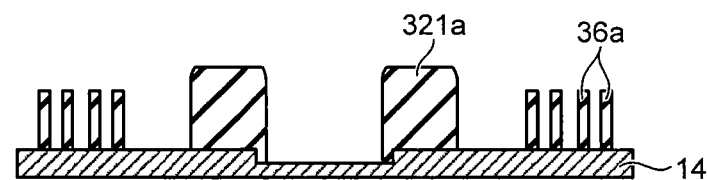
Figure 5L:
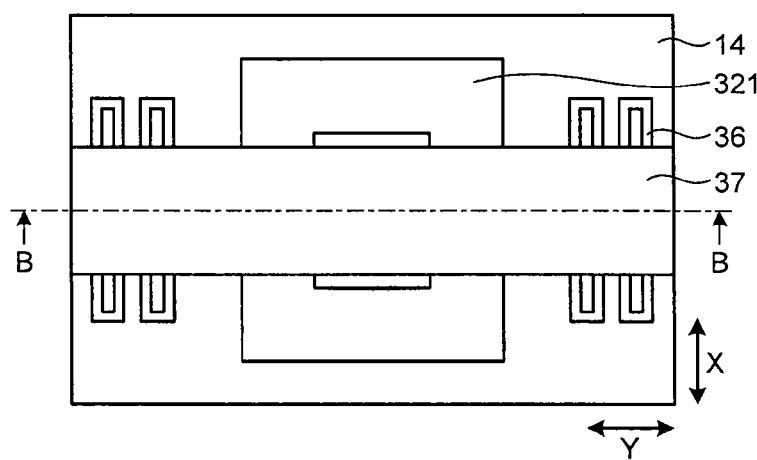
Figure 5M:
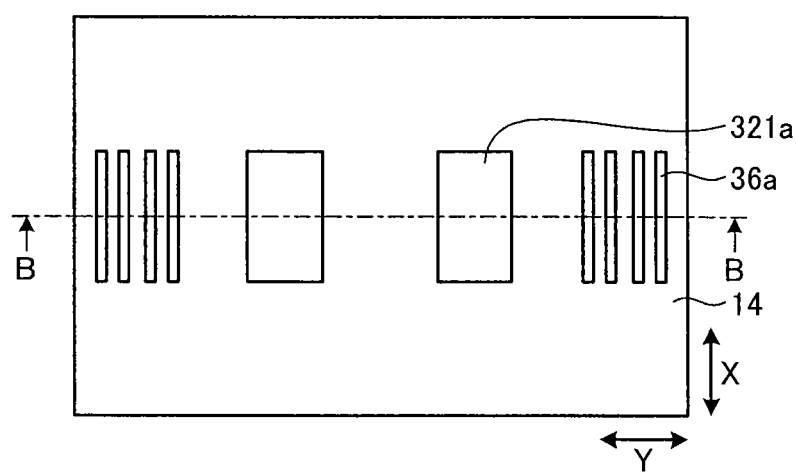

In addition, in this manner, the sidewall films 36 and the mask film 321 have closed loop structures, and the end portions of a pair of the adjacent word lines WL in the X direction and the end portions of a pair of the adjacent selection gate lines SGL1 and SGL2 in the X direction are connected to each other. Next, as illustrated in FIGS. 4L and 5L, a resist is applied above the entire surface of the semiconductor substrate 1, and a resist pattern 37 is formed by the lithography technique, so that an area excluding the end portions of the word lines formation masks (sidewall films 36) in the X direction and the selection gate line formation mask (mask film 321) is covered. Next, as illustrated in FIGS. 4M and 5M, the end portions of the word lines formation masks in the X direction and the selection gate line formation mask are removed by using an anisotropic etching process such as the RIE method. Therefore, word lines formation patterns 36a which arranged correctly according to the rule of the line-and-space shape and selection gate lines formation patterns 321a of which the size is larger than that of the word lines formation patterns 36a are formed.

After that, the processing object is etched, for example, by the anisotropic etching such as the RIE using the word lines formation patterns 36a and the selection gate lines formation patterns 321a as masks, and the word lines WL which extend in the X direction and arranged at a predetermined interval in the Y direction are formed between a pair of the selection gate lines SGL1 and SGL2 which extend in the X direction.

In the first embodiment, a mask film 32 which is to be a selection gate line formation mask is formed on the core film 31 where the opening 31a is formed such that an area where the selection gate lines SGL1 and SGL2 are formed becomes a step difference. Next, a resist is applied on the processing object, core forming resist patterns 35a of a sidewall transferring process is formed, and the core film 31 is processed by the anisotropic etching process. After that, word lines formation masks are formed by using the sidewall transferring process. Herein, the size of the selection gate line formation mask in the Y direction is determined by a thickness at the time of forming the mask film 32 and a thickness at the time of forming the sidewall film 36, and the thickness of the mask film 32 and the sidewall film 36 can be controlled accurately by using a film formation technique so as to be a desired thickness. Therefore, the control of the size of the selection gate line formation mask can be accurately performed without occurrence of conversion difference in the case where the pattern is formed by the lithography technique and the etching technique.

In addition, since the control of the size of the selection gate line formation mask can be accurately performed, it is possible to obtain an effect of reducing the area of a non-volatile semiconductor memory device by a conversion difference which is shown as a margin in a conventional method of processing a film by using the photolithography technique and the etching technique. Furthermore, it is possible to process the processing object without an increase in the number of work processes in comparison with a conventional method.

(Second Embodiment)

Although the case of forming the line-and-space shaped patterns of which the sizes (widths) are ½ of the sizes (widths) of the core patterns which are first formed is described in the first embodiment, the case of forming line-and-space shaped patterns of which the sizes are ¼ of the sizes of core patterns which are first formed will be described in a second embodiment.

Figure 6A:
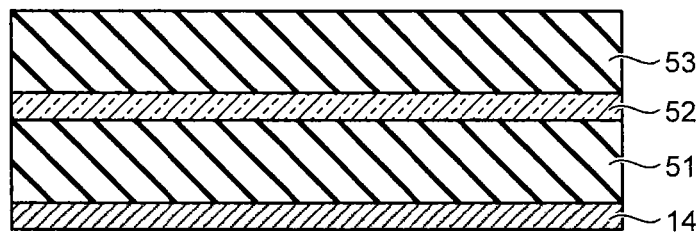
FIGS. 6A to 6T are partial cross-sectional views schematically illustrating an example of a pattern forming method according to a second embodiment.
Figure 6B:
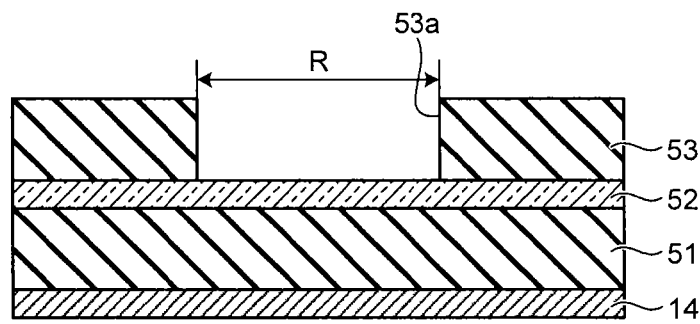
Figure 6C:
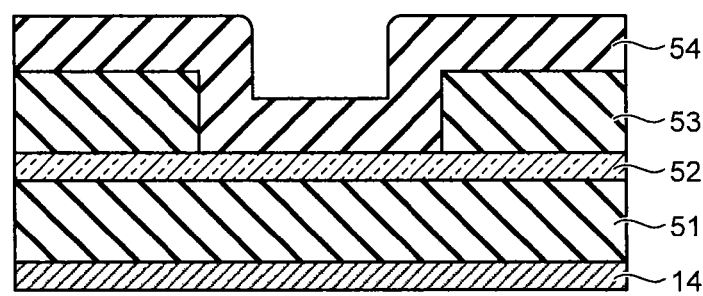
Figure 6D:
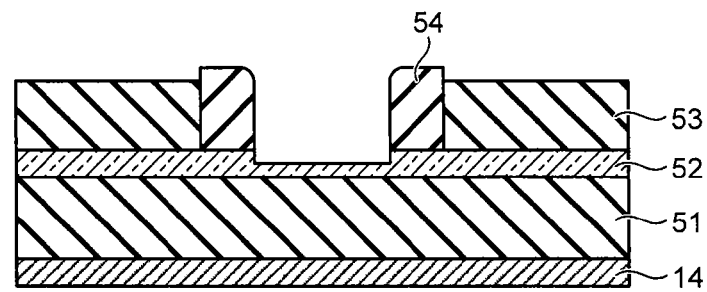
Figure 6E:
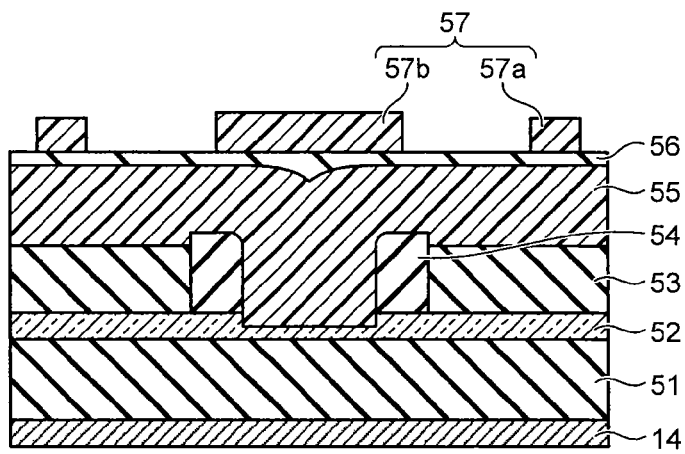
Figure 6F:
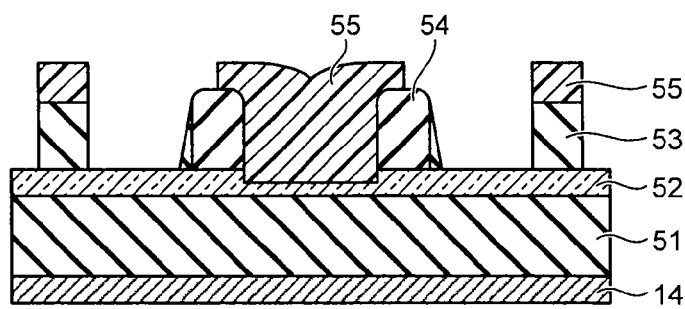
Figure 6G:
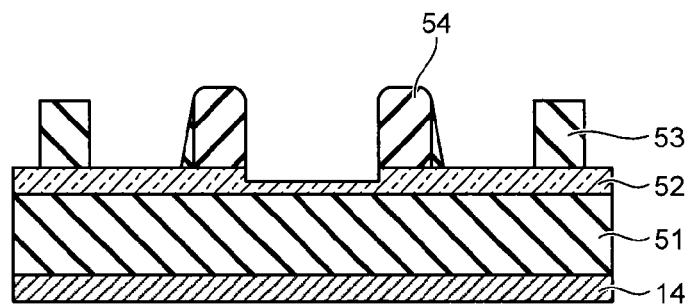
Figure 6H:
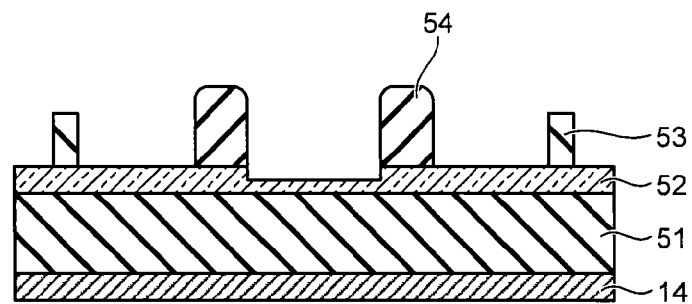
Figure 6I:
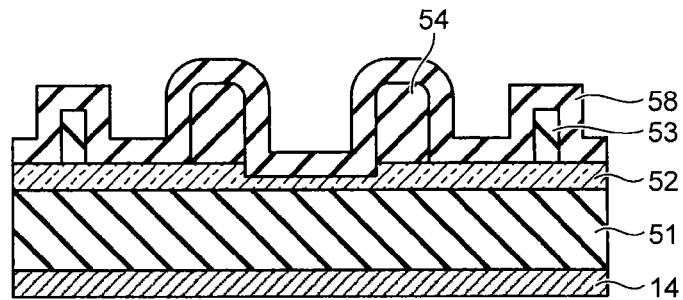
Figure 6J:
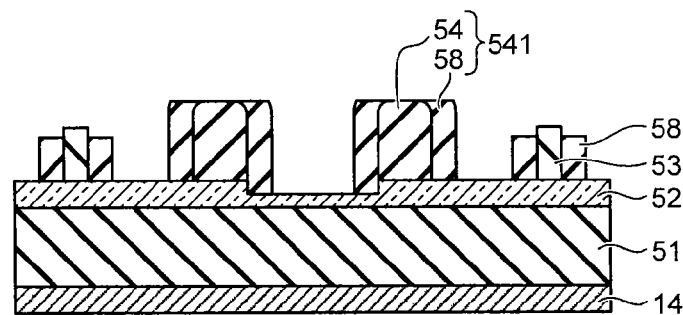
Figure 6K:
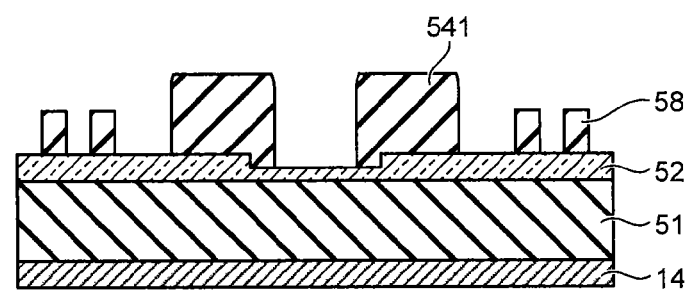
Figure 6L:
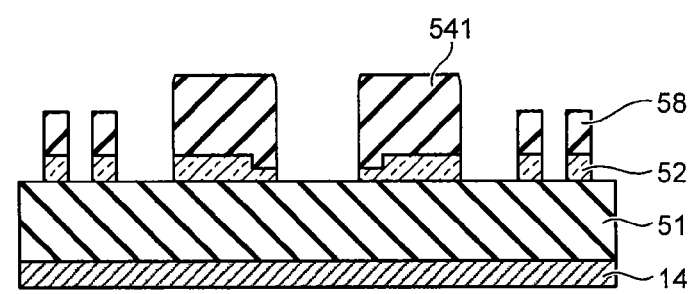
Figure 6M:
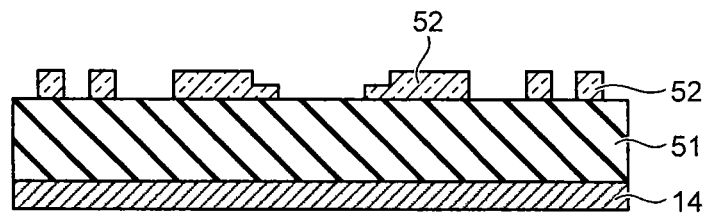
Figure 6N:
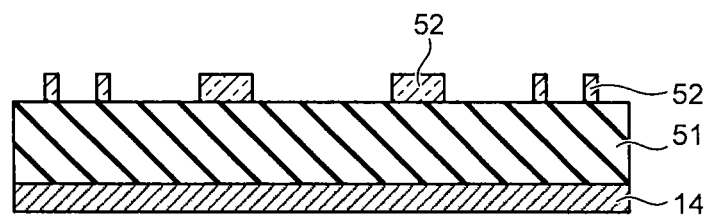
Figure 6O:
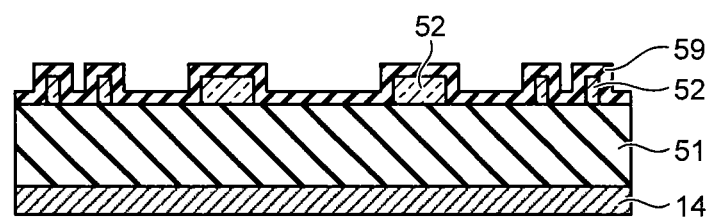
Figure 6P:
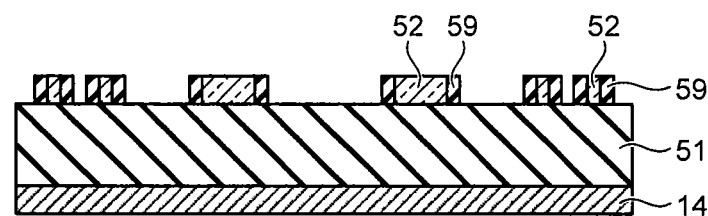
Figure 6Q:
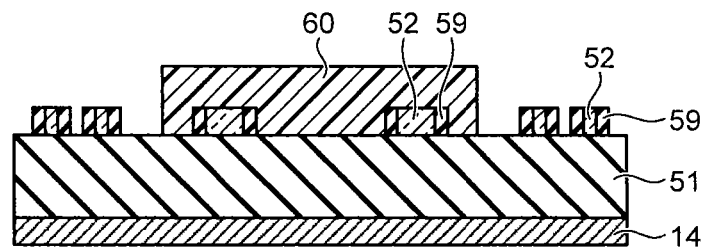
Figure 6R:
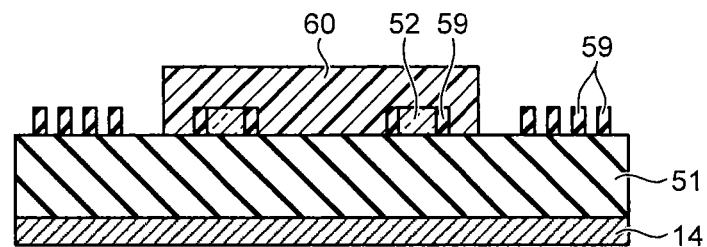
Figure 6S:
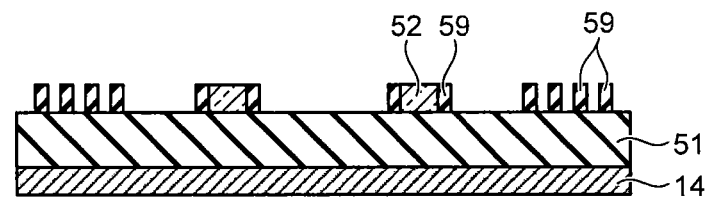
Figure 6T:
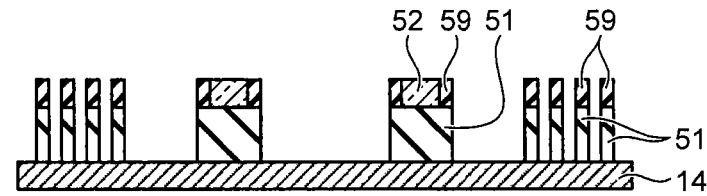
Figure 7A:
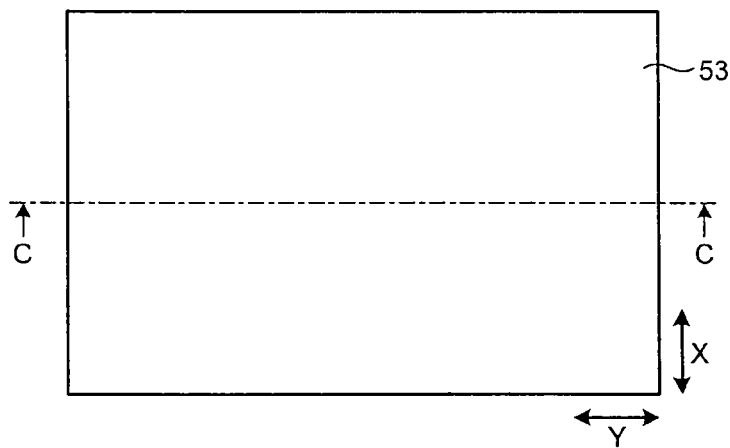
FIGS. 7A to 7T are partial plan views schematically illustrating the example of the pattern forming method according to the second embodiment.
Figure 7B:
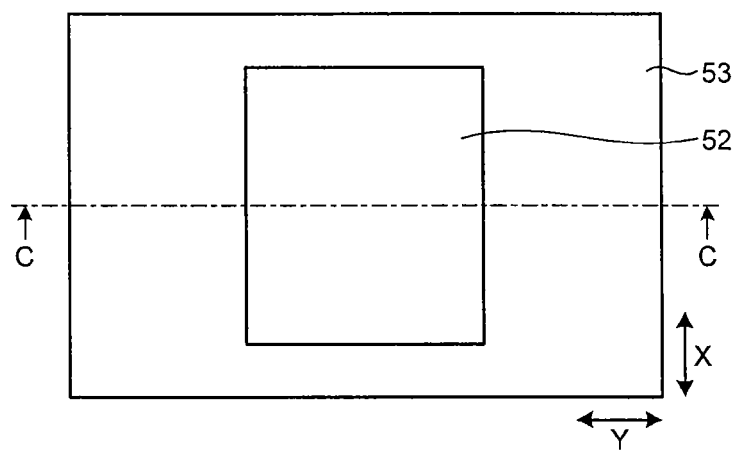
Figure 7C:
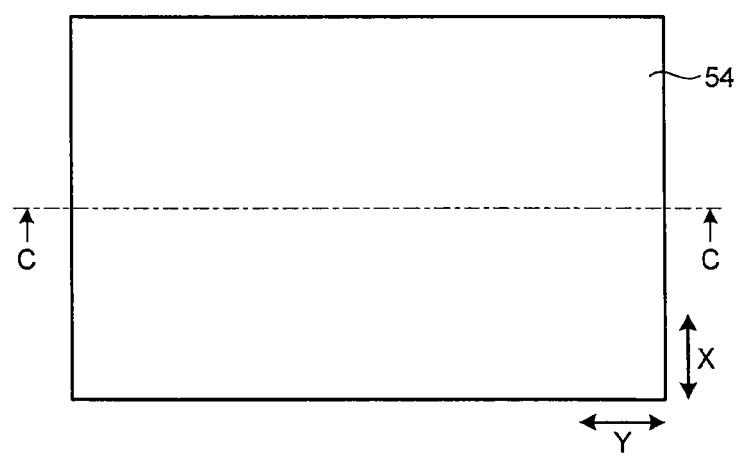
Figure 7D:
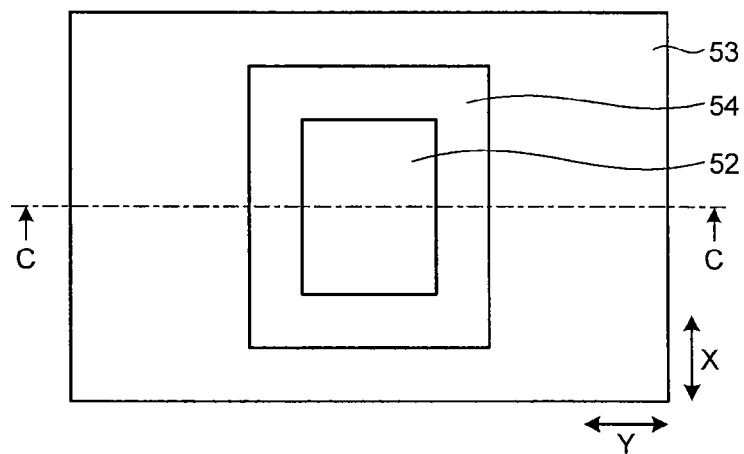
Figure 7E:
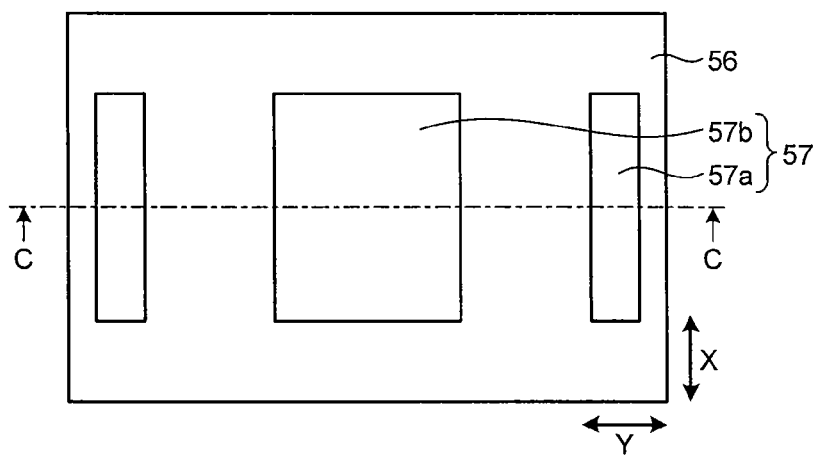
Figure 7F:
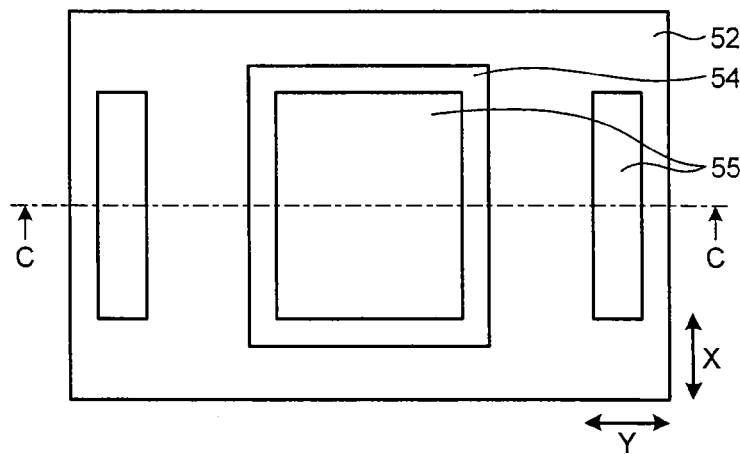
Figure 7G:
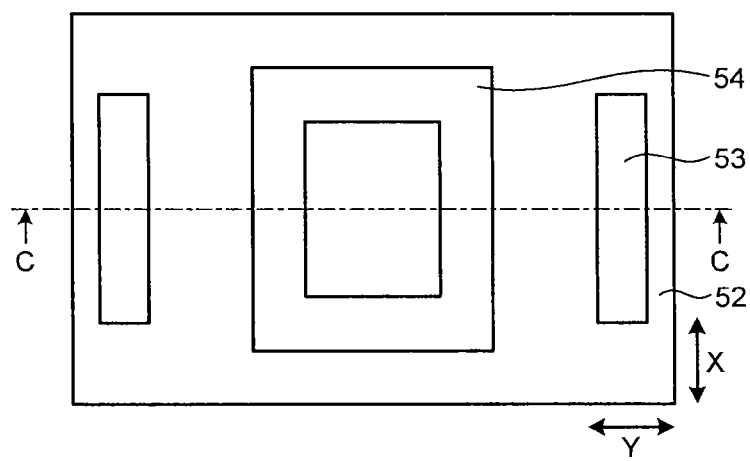
Figure 7H:
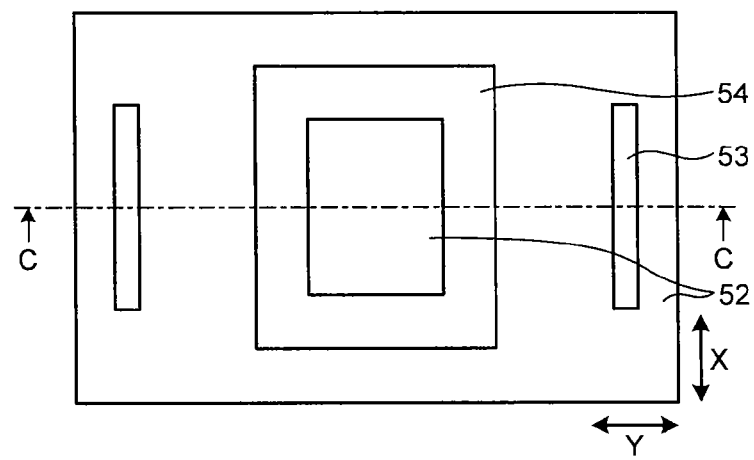
Figure 7I:
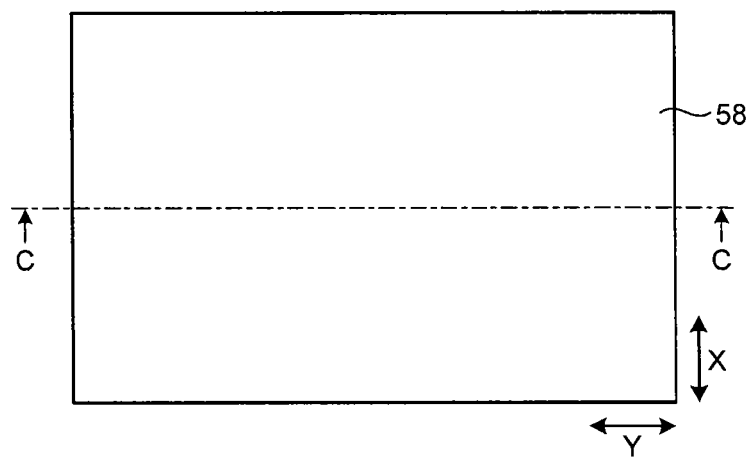
Figure 7J:
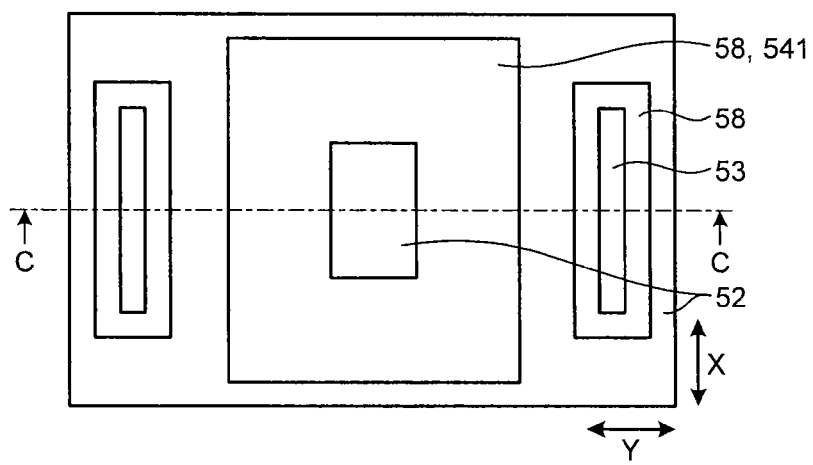
Figure 7K:
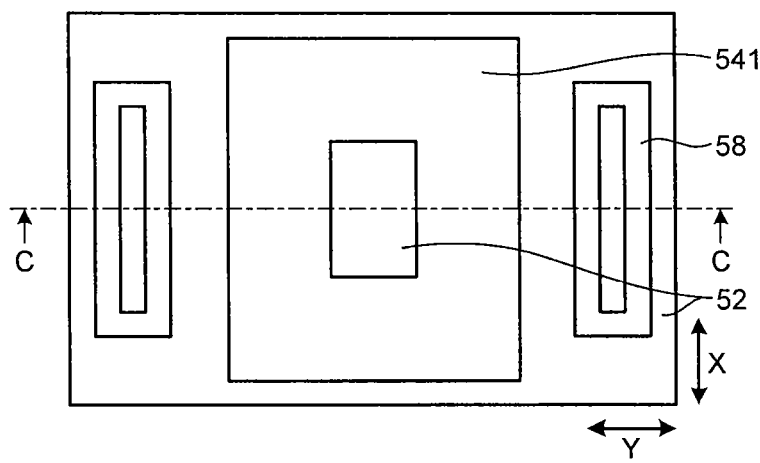
Figure 7L:
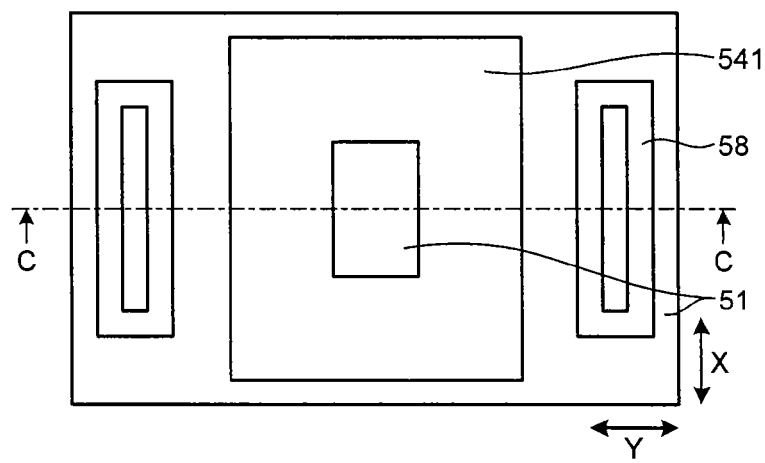
Figure 7M:
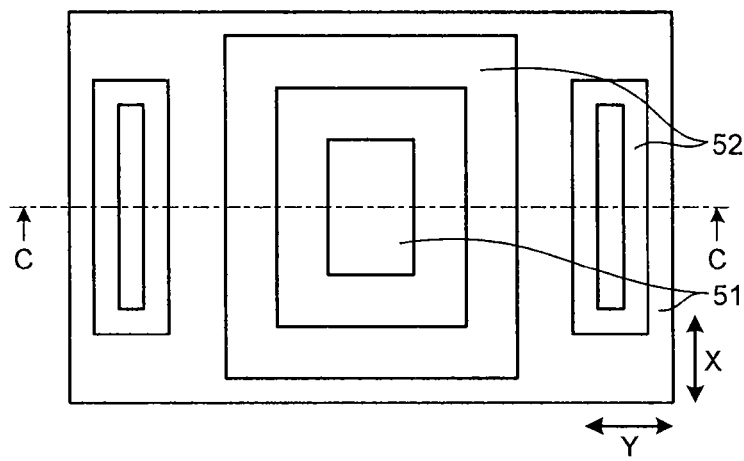
Figure 7N:
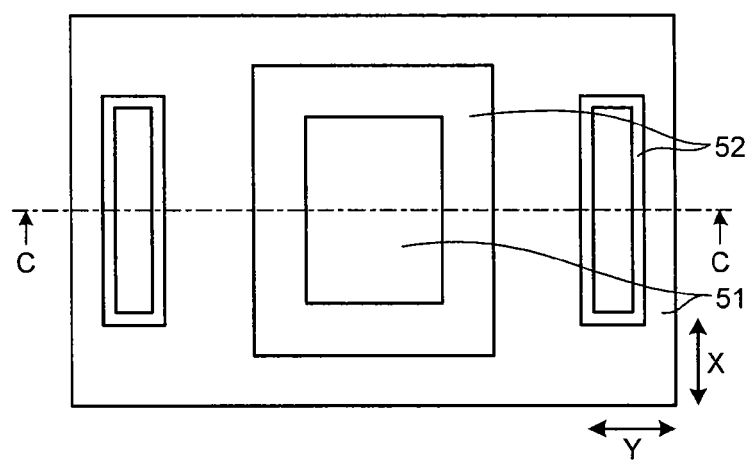
Figure 7O:
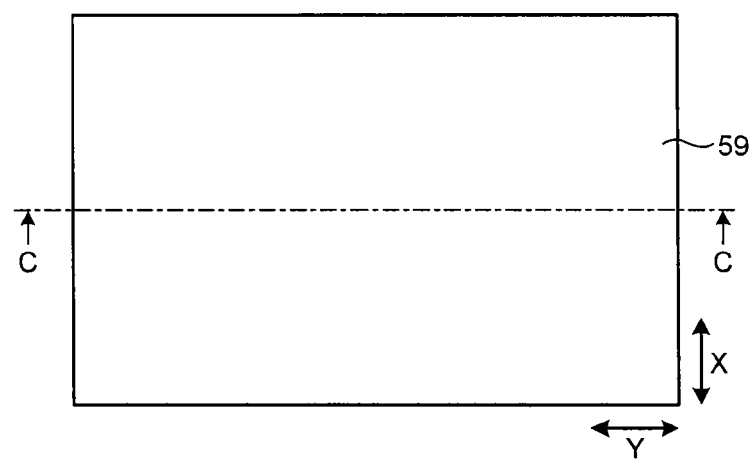
Figure 7P:
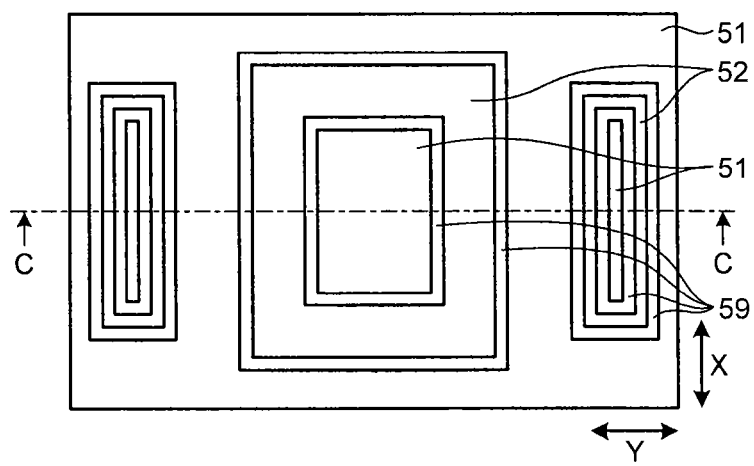
Figure 7Q:
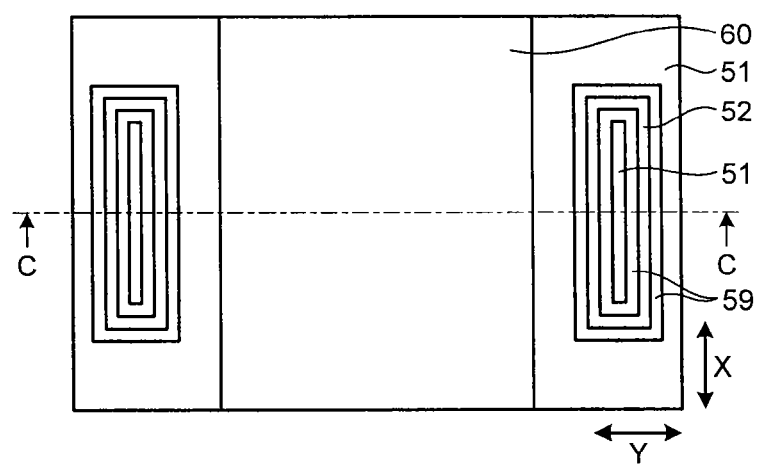
Figure 7R:
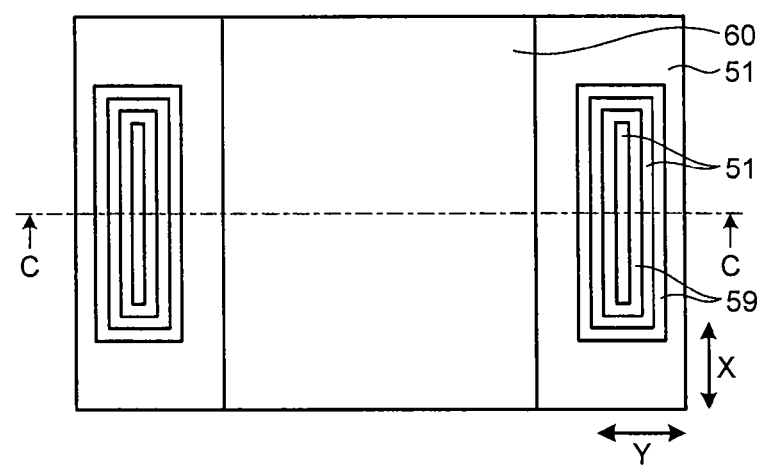
Figure 7S:
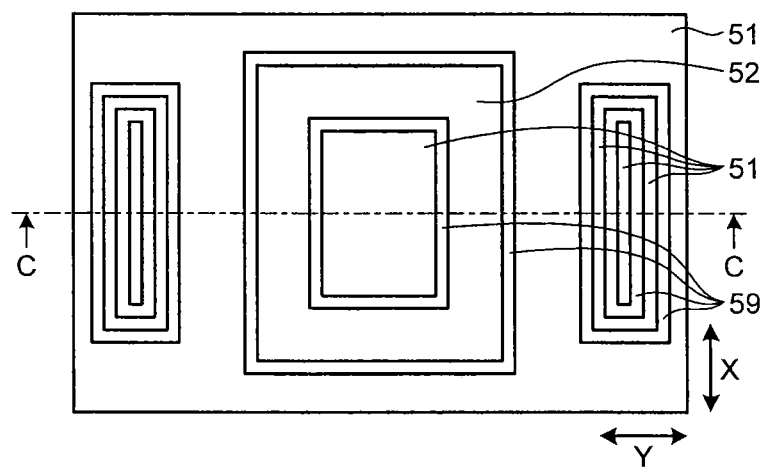
Figure 7T:
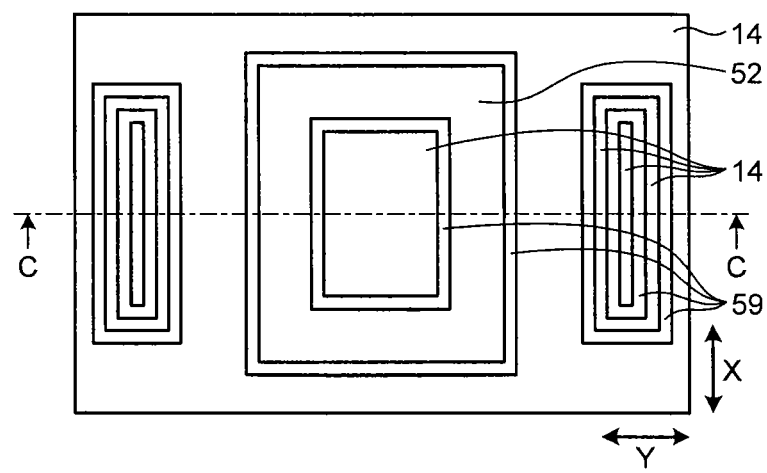

FIGS. 6A to 6T are schematic partial cross-sectional views illustrating an example of a pattern forming method according to the second embodiment, and FIGS. 7A to 7T are schematic partial plan views illustrating the example of the pattern forming method according to the second embodiment. In addition, FIGS. 6A to 6T correspond to cross-sectional views taken line C-C of FIGS. 7A to 7T. In addition, these figures illustrate a portion where the two memory units Su are disposed to be adjacent to each other in the bit line direction. In addition, in this example, the case where the word lines WL and the selection gate lines SGL1 and SGL2 are formed by processing stacked films of the tunnel insulating film 11, the floating gate electrode film 12, the inter-electrode insulating film 13, and the control gate electrode film 14 formed on the semiconductor substrate 1 will be described. In addition, the control gate electrode film 14 is assumed to be made of Si.

First, as illustrated in FIGS. 6A and 7A, a mask film 51, a core film 52, and a core film 53 are sequentially formed on the entire surface of the processing object (control gate electrode film 14). For example, a TEOS film having a thickness of 200 nm may be used as the mask film 51 and the core film 53. In addition, for example, a silicon film having a thickness of 50 nm may be used as the core film 52.

After that, as illustrated in FIGS. 6B and 7B, similarly to FIGS. 4B and 5B of the first embodiment, an opening 53a is formed in the core film 53 of the area R including the area for forming the selection gate transistors ST1 and ST2 between the adjacent memory units Su by the photolithography technique and the RIE technique. The opening 53a is formed so that the width of Y direction thereof becomes a width including a pair of the gate structures SG1 and SG2 of the selection gate transistors ST1 and ST2 and the length in the X direction thereof becomes a length substantially equal to the length of the word line WL. Herein, the size in the Y direction is set to 200 nm, and the size in the X direction is set to 4000 nm. In addition, for example, $C_4F_8$ or the like of which the selection ratio to Si of the core film 52 can be easily taken may be used as an etching gas.

Next, as illustrated in FIGS. 6C and 7C, a mask film 54 which becomes a mask for etching the selection gate lines SGL1 and SGL2 is conformally formed on the core films 52 and 53. For example, an SiN film may be used as the mask film 54. The width of the mask film 54 is preferably set to the value obtained by subtracting a desired width of the word line WL from the width of the selection gate lines SGL1 and SGL2 in FIG. 2, and in this example, the film is formed to have a width of 50 nm.

Subsequently, as illustrated in FIGS. 6D and 7D, etch-back of the formed mask film 54 is performed by the anisotropic etching such as the RIE method until at least the core film 53 is exposed. For example, $CH_2F_2$ gas or the like may be used as a processing gas. Therefore, the mask for forming the selection gate lines SGL1 and SGL2 in FIG. 2 is formed.

After that, as illustrated in FIGS. 6E and 7E, a resist 55 is applied on the processing object, and a mask film 56 is formed thereon. Photo resist coating is further performed thereon, and resist patterns 57 is formed by the lithography technique. The core forming resist patterns 57a for the sidewall transferring process on an area where the core film 53 is formed and a resist pattern 57b which covers the area R are formed as the resist patterns 57. In addition, in the case where etching is performed under the condition where the core film 52 is difficult to etch in comparison with the core film 53 as the next etching process, the resist pattern 57b is unnecessary. Herein, the widths of the core forming resist patterns 57a are set to 50 nm, and the distances (spaces) between the core forming resist patterns 57a are also set to 50 nm.

Next, as illustrated in FIGS. 6F and 7F, the core forming resist patterns 57a are transferred to the core film 53 by the RIE method using the resist patterns 57 as masks. At this time, a $C_4F_8$ based gas of which the selection ratio to the core film 52 and the mask film 54 can be easily taken may be used. After that, as illustrated in FIGS. 6G and 7G, the resist 55 is removed by the resist stripping technique using a gas containing, for example, $O_2$ as a main component.

Next, as illustrated in FIGS. 6H and 7H, the sliming is performed by the isotropic etching until the core films 53 have substantially half widths. For example, wet etching using hydrofluoric acid may be used as the isotropic etching.

Subsequently, as illustrated in FIGS. 6I and 7I, a sidewall film 58 is formed above the entire surface of the processing object. The sidewall film 58 is formed to conformally cover the core films 53 and the mask film 54 formed on the core film 52. For example, an SiN film having a thickness of 25 nm which is substantially equal to the width of the core film 53 may be used as the sidewall film 58.

Next, as illustrated in FIGS. 6J and 7J, etch-back of the formed sidewall film 58 is performed by the anisotropic etching such as the RIE method until the upper surfaces of the core films 53 are exposed, and loop-shaped sidewall films 58 are formed around the core films 53. For example, $CH_2F_2$ gas or the like may be used as a processing gas. Hereinafter, the mask film 54 where the sidewall films 58 are formed is denoted by a mask film 541.

After that, as illustrated in FIGS. 6K and 7K, the core films 53 are removed by the etching process. Wet etching using hydrofluoric acid may be used as the etching process. Therefore, core film processing patterns which are to be transferred to the core film 52 are formed. Herein, the widths in the Y direction of the sidewall films 58 of the core film processing patterns and the distances (spaces) between the adjacent sidewall films 58 become 25 nm, respectively.

Next, as illustrated in FIGS. 6L and 7L, the core film 52 is etched by the etching technique such as the RIE method using the core film processing patterns as masks, and the core film processing patterns are transferred to the core film 52. For example, a gas including Cl or the like may be used as a processing gas.

Subsequently, as illustrated in FIGS. 6M and 7M, the mask film 541 and the sidewall films 58 are removed by etching. In the case where the core film 52 is made of Si, the mask film 541 and the sidewall films 58 are made of SiN, and the mask film 51 is made of TEOS, wet etching using phosphoric acid or the like may be used so that the mask film 541 and the sidewall films 58 on the core film 52 take a selection ratio to the core film 52.

After that, as illustrated in FIGS. 6N and 7N, the sliming is performed by the isotropic etching until the core films 52 in the area for forming the word lines WL have substantially half widths. Wet etching or Chemical Dry Etching (CDE) may be used as the isotropic etching. Herein, the etching is performed until the widths of the patterns formed in the area for forming the word lines WL become 12.5 nm.

Subsequently, as illustrated in FIGS. 6O and 7O, a sidewall film 59 is conformally formed above the entire surface of the processing object. For example, an SiN film having a thickness of 12.5 nm which is substantially equal to the widths of the core films 52 in the area for forming the word lines WL may be used as the sidewall film 59. After that, as illustrated in FIGS. 6P and 7P, etch-back of the formed sidewall film 59 is performed by the anisotropic etching such as the RIE method until the upper surfaces of the core films 52 are exposed. For example, $CH_2F_2$ gas or the like may be used as a processing gas. Therefore, loop-shaped sidewall films 59 are formed around the core films 52.

Next, as illustrated in FIGS. 6Q and 7Q, a photo resist (not illustrated) is applied above the entire surface of the processing object, and a resist pattern 60 is formed by the lithography technique so as to cover an area including the facing selection gate lines SGL1 and SGL2 of the adjacent memory units Su.

After that, as illustrated in FIGS. 6R and 7R, the core films 52 of the area for forming the word lines WL are removed by the etching process. Wet etching using choline may be used as the etching process. Therefore, the sidewall films 59 formed on the side surface of the core films 52 are formed as new line patterns, and masks for forming the word lines WL in FIG. 2 is produced. Herein, the sizes of the word lines formation masks and the distances (spaces) between the adjacent word lines formation masks become 12.5 nm, respectively.

Next, as illustrated in FIGS. 6S and 7S, the resist pattern 60 is removed by the resist stripping technique using a gas containing, for example, $O_2$ as a main component. Subsequently, as illustrated in FIGS. 6T and 7T, the mask film 51 is etched by the anisotropic etching such as the RIE method using the sidewall films 59 as masks in the area for forming the word lines WL and using the core film 52 and the sidewall films 59 as masks in the area for forming the selection gate lines SGL1 and SGL2. Therefore, the word lines formation masks and the selection gate line formation mask are obtained. A gas such as $C_4F_8$ may be used as a processing gas.

After that, as illustrated in FIGS. 4L, 4M, 5L, and 5M of the first embodiment, the end portions of the word lines formation masks in the X direction and the selection gate line formation mask which constitute closed loop structures are cut by the photolithography technique and the etching technique. Therefore, line-and-space shaped word lines formation patterns are formed between a pair of the line-shaped selection gate lines formation patterns. Next, the stacked films from the control gate electrode film 14 to the tunnel insulating film 11 which constitute the processing object are processed by the anisotropic etching such as the RIE method using the selection gate lines formation patterns and the word lines formation patterns, so that the word lines WL which are arranged at a predetermined interval in the Y direction are formed to extend in the X direction between a pair of the selection gate lines SGL1 and SGL2 which extend in the X direction.

In the second embodiment, first, the core film 52 and the core film 53 are formed to overlap each other on the processing object, the opening 53a is formed by removing the core film 53 in the area where the selection gate lines SGL1 and SGL2 are formed, and the mask film 54 is conformally formed thereon. After that, etch-back is performed to form a mask for forming the selection gate lines SGL1 and SGL2. Next, after the core film 53 on the area for forming the word lines WL is processed by the photolithography technique and the etching technique so that the widths thereof become substantially four times of the final widths of the word lines, sliming is performed by the isotropic etching so that the widths thereof become substantially half. After that, a sidewall film 58 is formed, etch-back of the sidewall film 58 is performed, and the core films 53 are removed. After core film processing patterns are formed, the core film processing patterns are transferred to the core film 52, and sliming is performed so that the widths of the core film processing patterns become substantially half. After that, a sidewall film 59 is formed, and etch-back of the sidewall film 59 and removing the core films 52 in the area for forming the word lines are performed, so that word lines formation masks and selection gate lines formation masks are formed. In this manner, since the sizes of the selection gate lines formation masks are controlled according to the thicknesses of the mask film 54 and the sidewall films 58, an amount of sliming of the core films 52, and the thickness of the sidewall film 59, controlling of the sizes of the selection gate lines formation masks can be accurately performed in comparison with the case of forming the pattern by using the lithography technique and the anisotropic etching technique. In addition, the processing object can be processed without an increase in the number of work processes in comparison with a conventional method.

(Third Embodiment)

In a third embodiment, as a method different from the second embodiment, a method of forming line-and-space shaped patterns of which the sizes are ¼ of the sizes of the core films which are first formed, will be described.

Figure 8A:
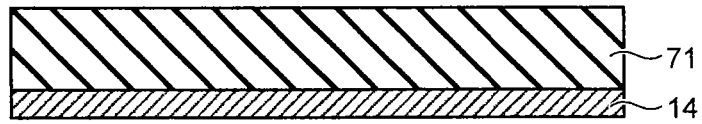
FIGS. 8A to 8U are partial cross-sectional views schematically illustrating an example of a pattern forming method according to a third embodiment.
Figure 8B:
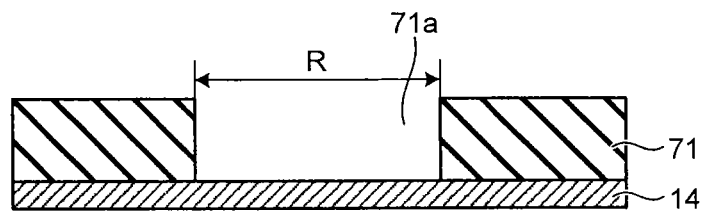
Figure 8C:
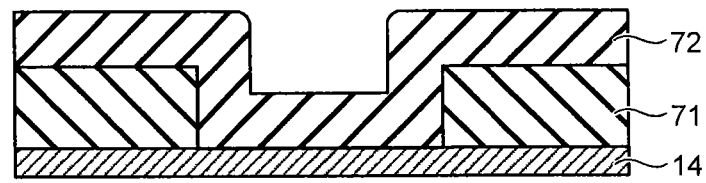
Figure 8D:
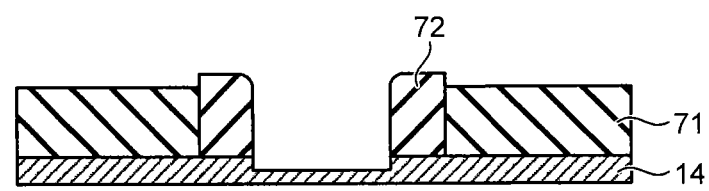
Figure 8E:
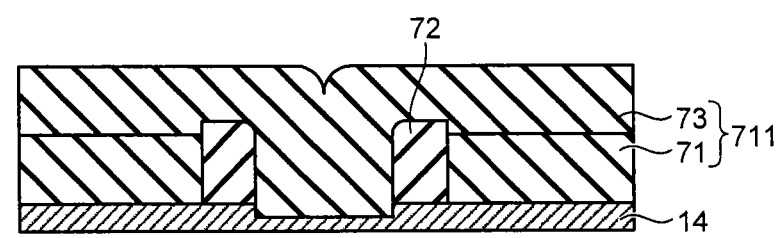
Figure 8F:
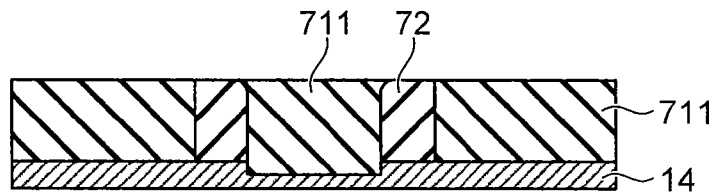
Figure 8G:
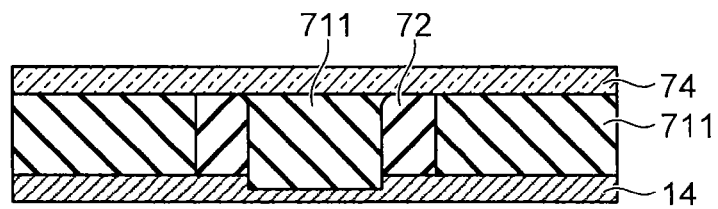
Figure 8H:
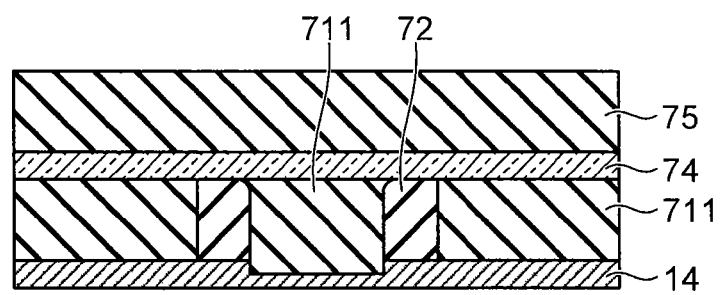
Figure 8I:
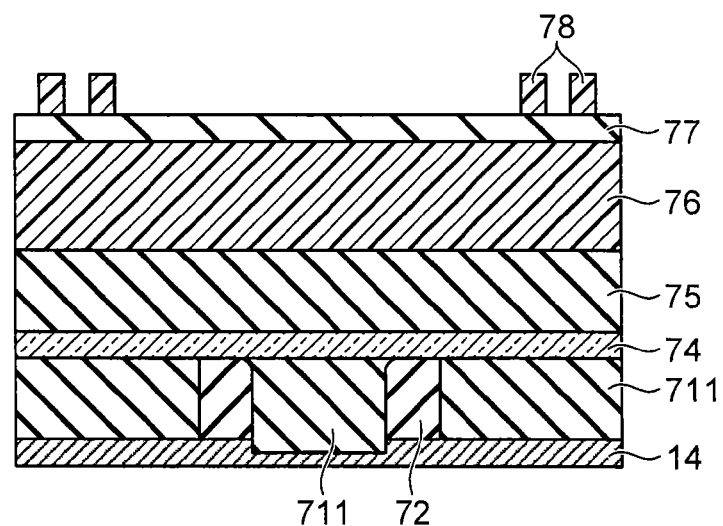
Figure 8J:
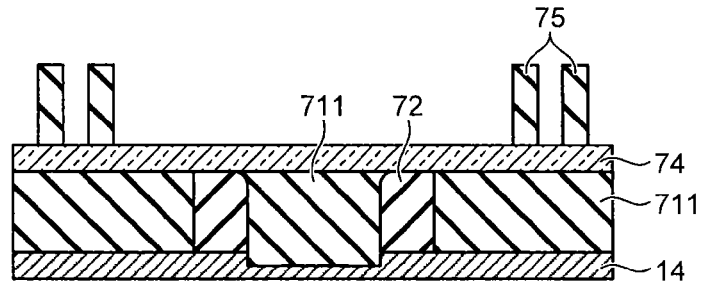
Figure 8K:
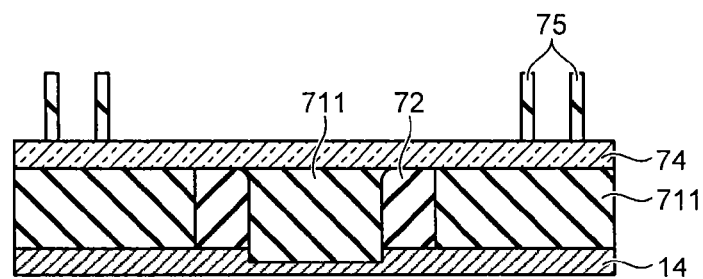
Figure 8L:
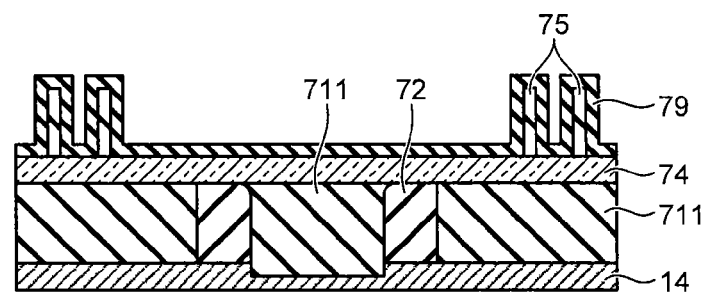
Figure 8M:
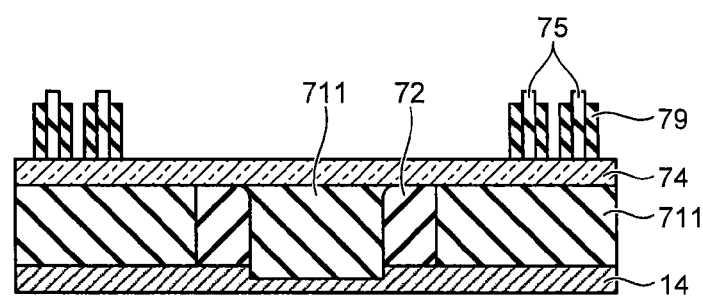
Figure 8N:
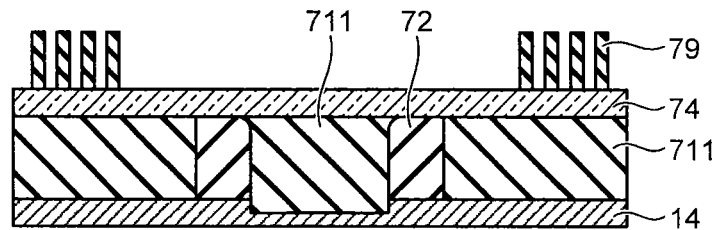
Figure 8O:
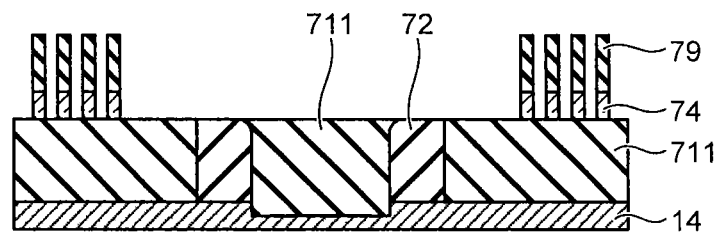
Figure 8P:
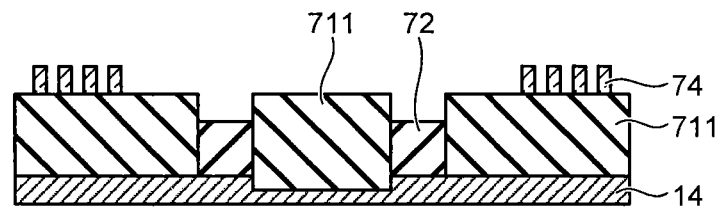
Figure 8Q:
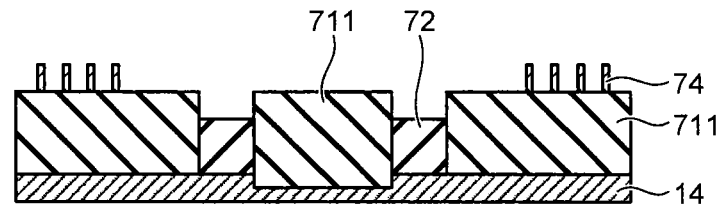
Figure 8R:
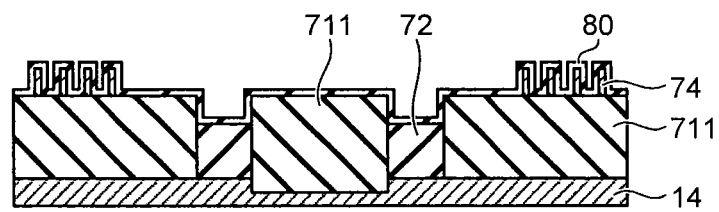
Figure 8S:
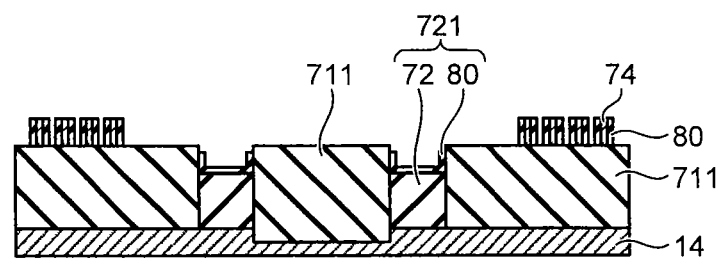
Figure 8T:
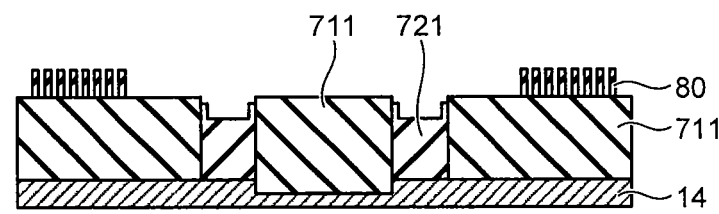
Figure 8U:
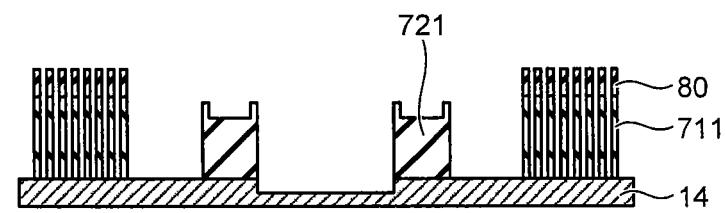
Figure 9A:
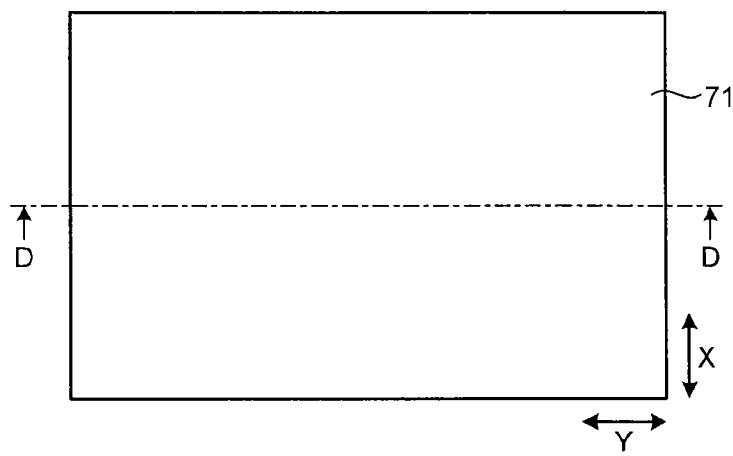
FIGS. 9A to 9U are partial plan views schematically illustrating the example of the pattern forming method according to the third embodiment.
Figure 9B:
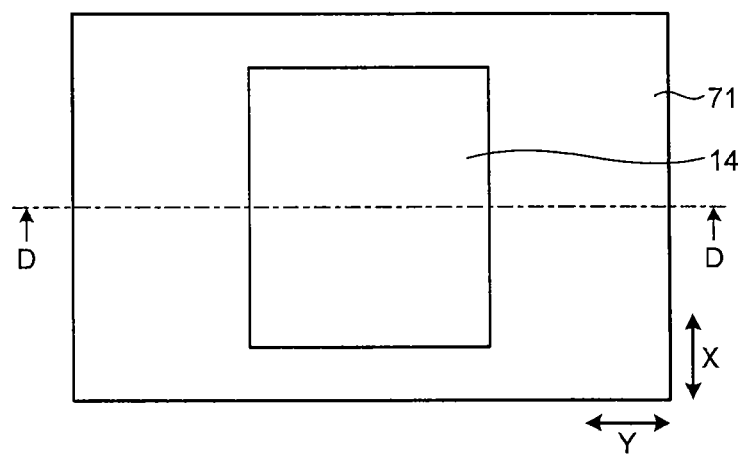
Figure 9C:
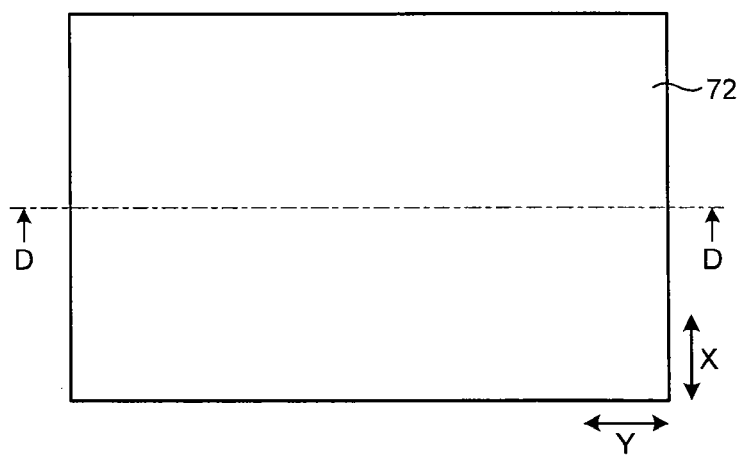
Figure 9D:
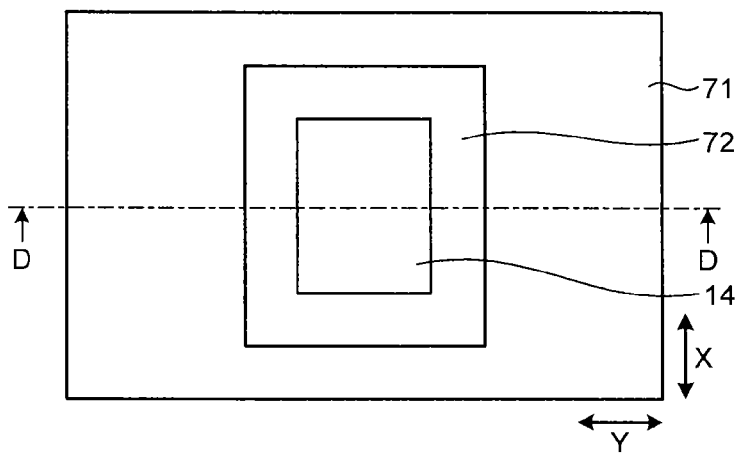
Figure 9E:
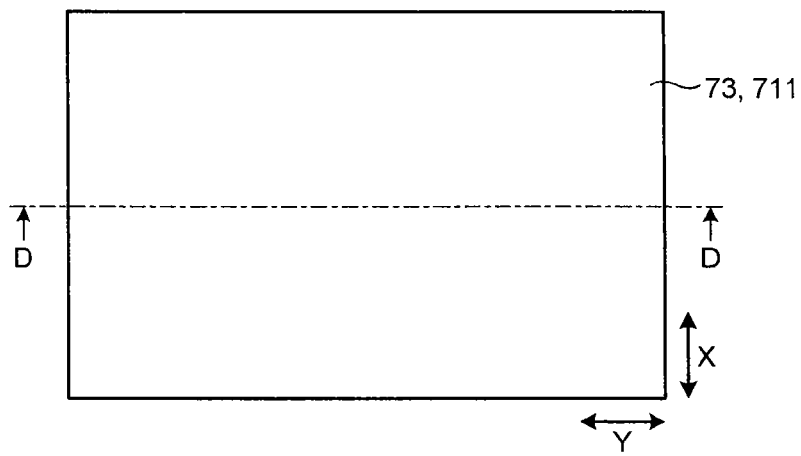
Figure 9F:
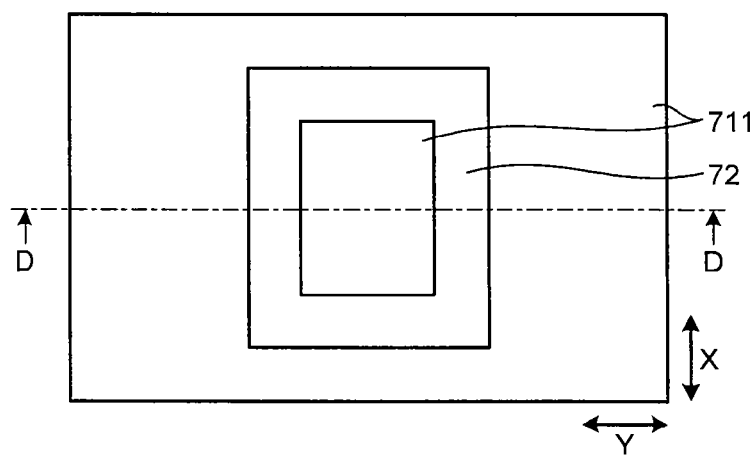
Figure 9G:
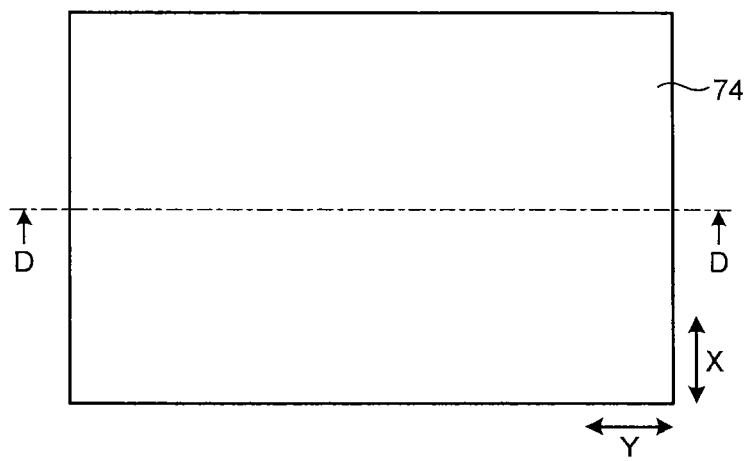
Figure 9H:
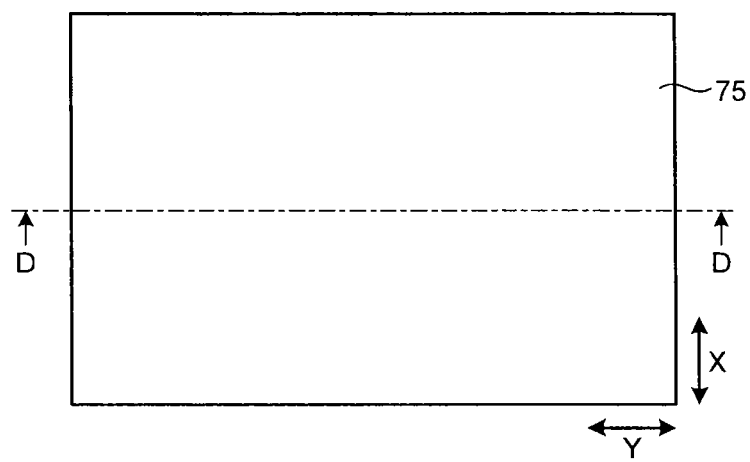
Figure 9I:
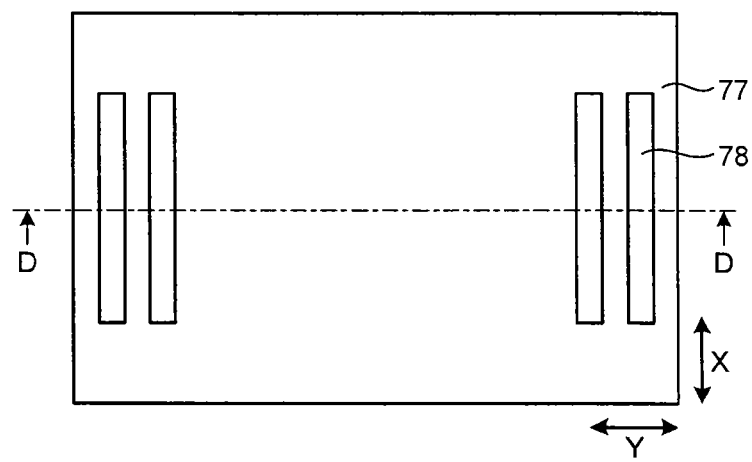
Figure 9J:
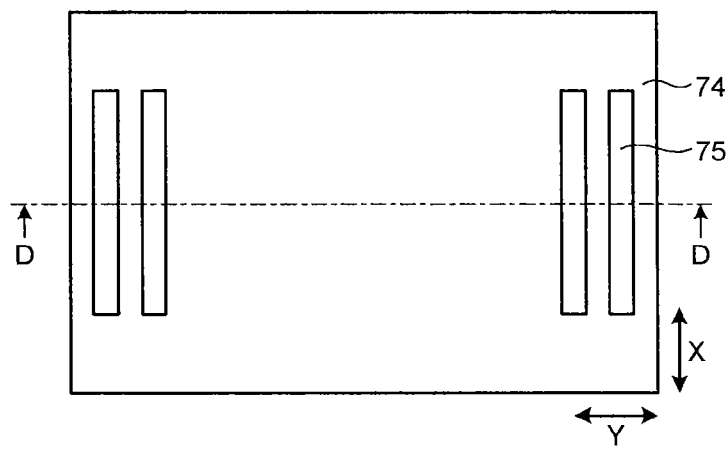
Figure 9K:
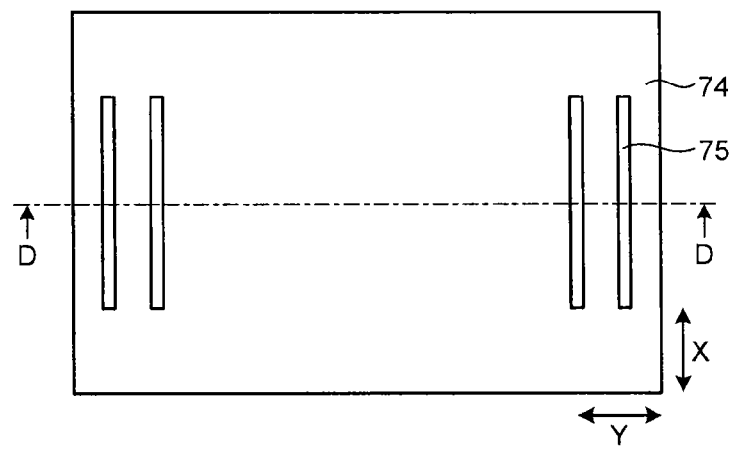
Figure 9L:
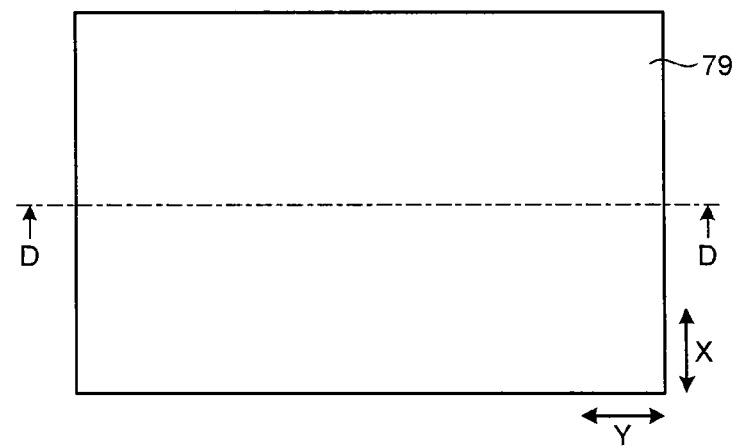
Figure 9M:
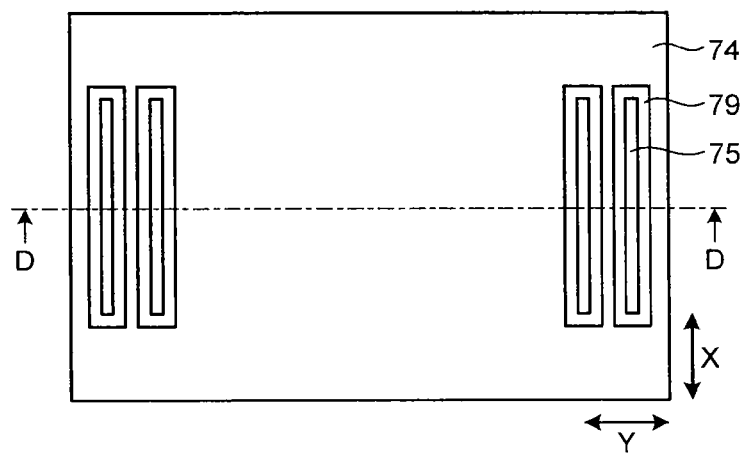
Figure 9N:
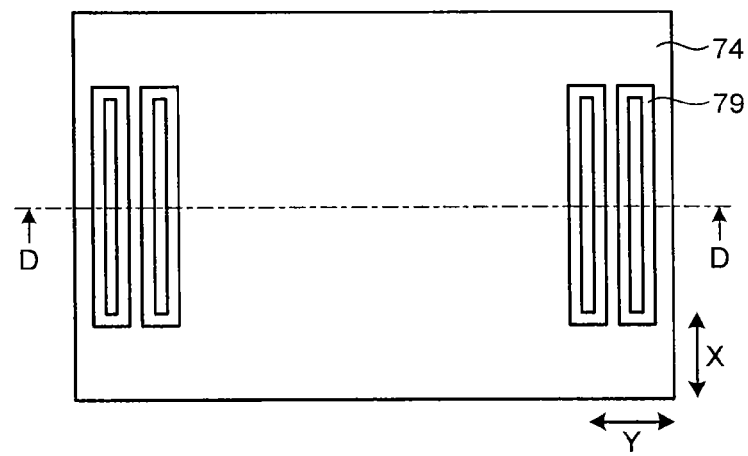
Figure 9O:
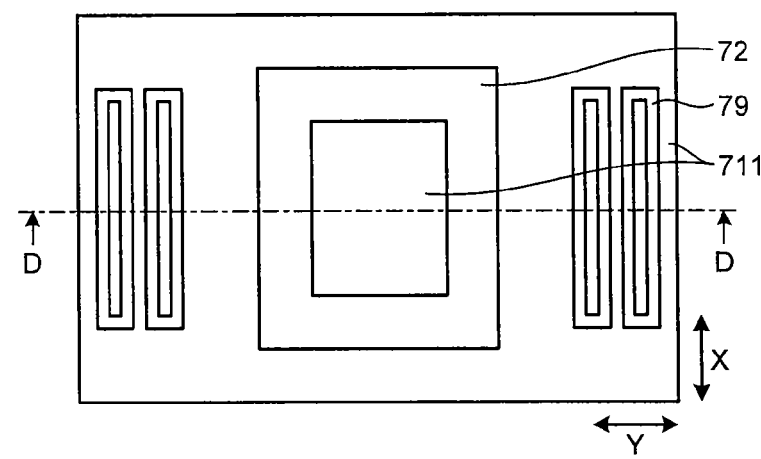
Figure 9P:
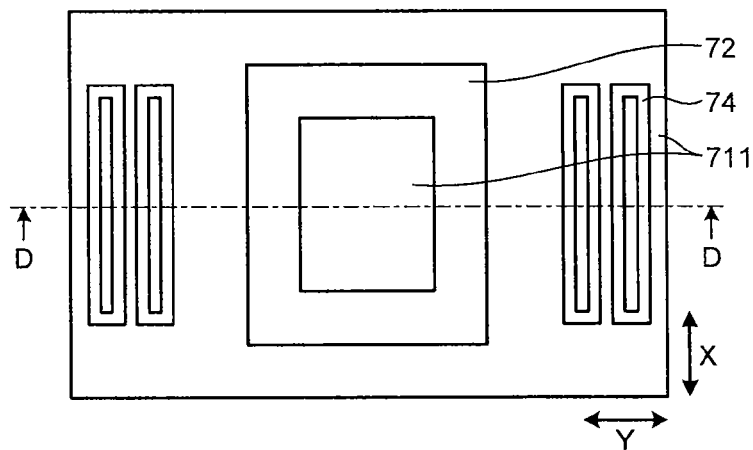
Figure 9Q:
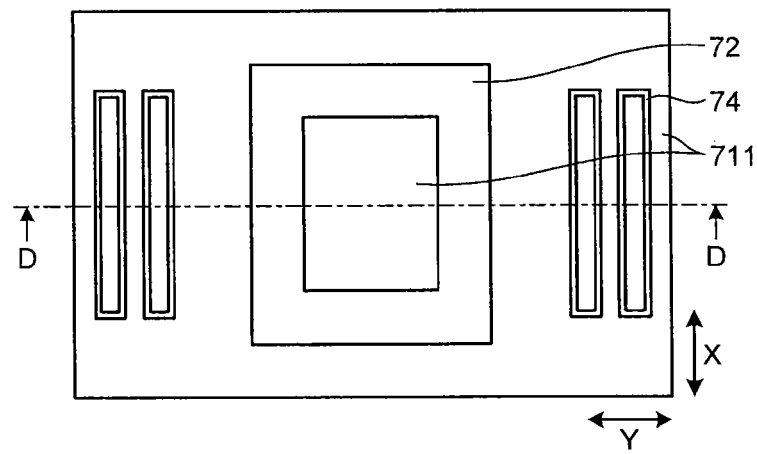
Figure 9R:
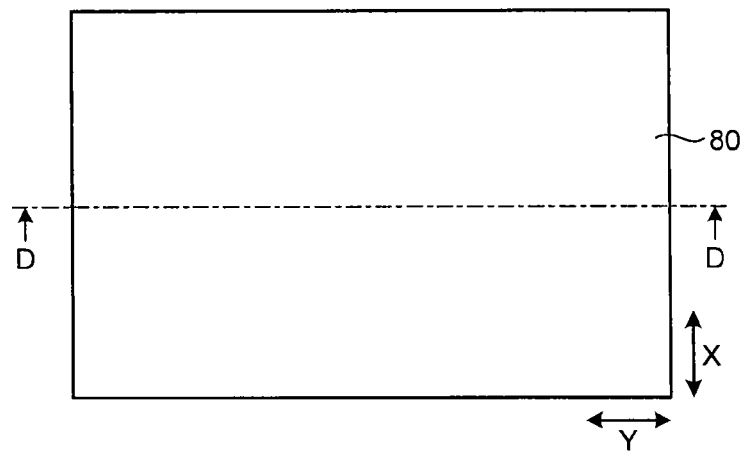
Figure 9S:
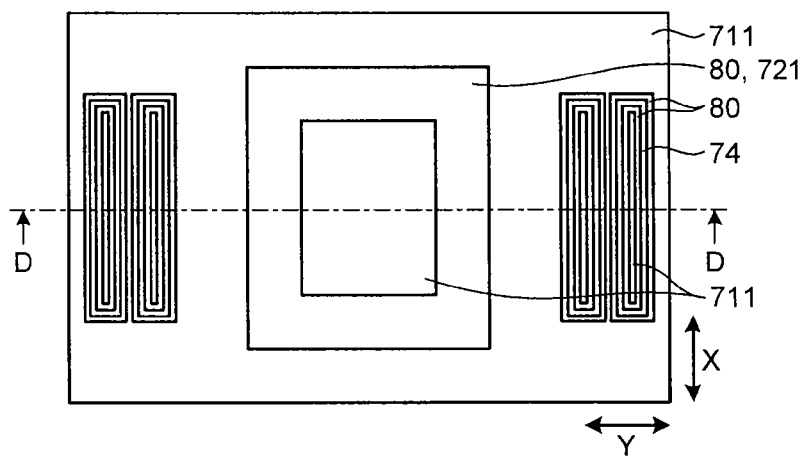
Figure 9T:
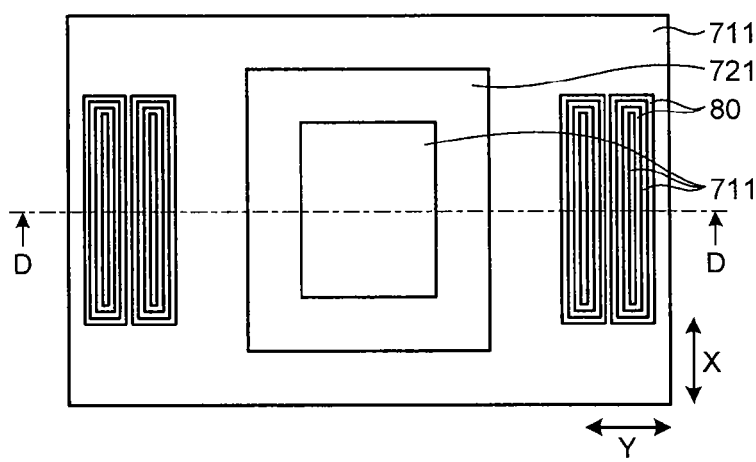
Figure 9U:
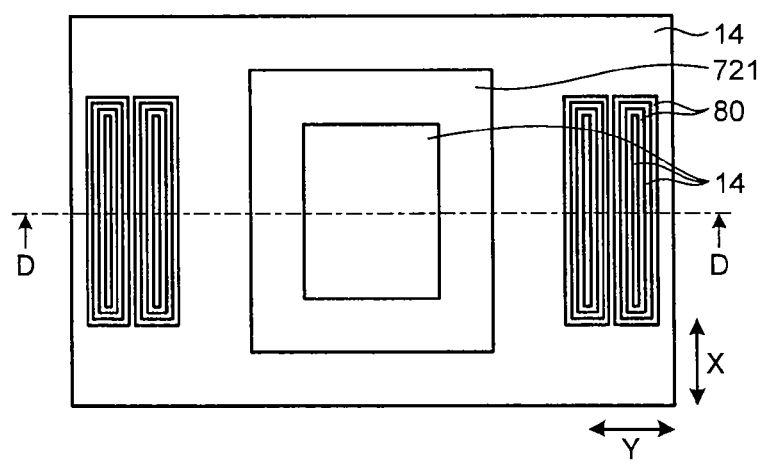

FIGS. 8A to 8U are schematic partial cross-sectional views illustrating an example of a pattern forming method according to the third embodiment, and FIGS. 9A to 9U are schematic partial plan views illustrating the example of the pattern forming method according to the third embodiment. In addition, FIGS. 8A to 8U correspond to cross-sectional views taken line D-D of FIGS. 9A to 9U. In addition, these figures illustrate a portion where the two memory units Su are disposed to be adjacent to each other in the bit line direction. In addition, in this example, the case where the word lines WL and the selection gate lines SGL1 and SGL2 are formed by processing a stacked films of the tunnel insulating film 11, the floating gate electrode film 12, the inter-electrode insulating film 13, and the control gate electrode film 14 formed on the semiconductor substrate 1 will be described. In addition, the control gate electrode film 14 is assumed to be made of Si.

First, as illustrated in FIGS. 8A and 9A, a mask film 71 is formed on the entire surface of the processing object (control gate electrode film 14). For example, a TEOS film having a thickness of 200 nm may be used as the mask film 71.

Next, as illustrated in FIGS. 8B and 9B, similarly to FIGS. 4B and 5B of the first embodiment, an opening 71a is formed in the mask film 71 of the area R including the area for forming the selection gate transistors ST1 and ST2 between the adjacent memory units Su by the photolithography technique and the RIE technique. The opening 71a is formed so that the width in the Y direction thereof becomes a width including a pair of the gate structures SG1 and SG2 of the selection gate transistors ST1 and ST2 and the length in the X direction thereof becomes a length substantially equal to the length of the word line WL. Herein, the size in the Y direction is set to 200 nm, and the size in the X direction is set to 4000 nm. In addition, for example, $C_4F_8$ or the like of which the selection ratio to silicon of the control gate electrode film 14 can be easily taken may be used as an etching gas.

After that, as illustrated in FIGS. 8C and 9C, a mask film 72 which becomes a mask for etching the selection gate lines SGL1 and SGL2 is conformally formed on the control gate electrode film 14 and the mask film 71. For example, an SiN film may be used as the mask film 72. The width of the mask film 72 is preferably set to the same value as the width of the selection gate lines SGL1 and SGL2 in FIG. 2, and in this example, the film is formed to have a width of 50 nm.

Subsequently, as illustrated in FIGS. 8D and 9D, etch-back of the formed mask film 72 is performed by the anisotropic etching such as the RIE method until at least the mask film 71 is exposed. For example, $CH_2F_2$ gas or the like may be used as a processing gas. Therefore, the mask for forming the selection gate lines SGL1 and SGL2 in FIG. 2 is formed.

After that, as illustrated in FIGS. 8E and 9E, a mask film 73 is formed above the entire surface of the processing object so that the internal portion of the closed-loop-shaped mask film 72 is embedded. For example, a TEOS film having a thickness of 200 nm may be used as the mask film 73. Hereinafter, the mask films 71 and 73 made of the same material are collectively referred to as a mask film 711.

As illustrated in FIGS. 8F and 9F, the upper surface of the mask film 711 is planarized according to a Chemical Mechanical Polishing (CMP) method. At this time, the planarization is performed by using the mask film 72 as a stopper.

After that, as illustrated in FIGS. 8G and 9G, a core film 74 is formed above the entire surface of the processing object.

For example, a silicon film having a thickness of 50 nm may be used as the core film 74. In addition, as illustrated in FIGS. 8H and 9H, a core film 75 is formed on the core film 74. For example, a TEOS film having a thickness of 200 nm may be used as the core film 75.

Next, as illustrated in FIGS. 8I and 9I, a resist 76 is applied above the processing object, and a mask film 77 is formed thereon. A photo resist is further applied thereon, and a core forming resist patterns 78 for the sidewall transferring process are formed on the area for forming the word lines WL by the lithography technique. Herein, the widths of the core forming resist patterns 78 are set to 50 nm, and the distances (spaces) between the core forming resist patterns 78 are also set to 50 nm.

After that, as illustrated in FIGS. 8J and 9J, the resist patterns 78 are transferred to the core film 75 by the RIE method. At this time, the etching is performed under the condition where the selection ratio to the core film 74 can be easily taken. Herein, since the core film 74 is made of Si and the core film 75 is made of TEOS, a $C_4F_8$ based gas of which the selection ratio to Si can be taken may be used. After that, the resist 76 is removed by the resist stripping technique using a gas containing, for example, $O_2$ as a main component.

Next, as illustrated in FIGS. 8K and 9K, the sliming is performed by the isotropic etching until the core films 75 have substantially half widths. For example, wet etching using hydrofluoric acid may be used as the isotropic etching. Therefore, the core films 75 have widths of 25 nm.

Subsequently, as illustrated in FIGS. 8L and 9L, a sidewall film 79 is formed above the entire surface of the processing object. The sidewall film 79 is formed so that the core films 75 formed on the core film 74 is conformally covered. For example, an SiN film having a thickness of 25 nm which is substantially equal to the widths of the core films 75 may be used as the sidewall film 79.

Next, as illustrated in FIGS. 8M and 9M, etch-back of the formed sidewall film 79 is performed by the anisotropic etching such as the RIE method until the upper surfaces of the core films 75 are exposed, and loop-shaped sidewall films 79 are formed around the core films 75. For example, $CH_2F_2$ gas or the like may be used as a processing gas.

After that, as illustrated in FIGS. 8N and 9N, the core films 75 are removed by the etching process. Wet etching using hydrofluoric acid may be used as the etching process. Therefore, core film processing patterns which are to be transferred to the core film 74 are formed. Herein, the core film processing patterns have sizes which are ½ of the sizes of the core forming resist patterns 78 formed by using the photolithography process, and the widths of the sidewall films 79 which are the core processing patterns and the distances (spaces) between the adjacent sidewall films 79 become 25 nm.

In addition, as illustrated in FIGS. 8O and 9O, the core film processing patterns which are made of the sidewall films 79 are transferred to the core film 74 according to the RIE method. Subsequently, as illustrated in FIGS. 8P and 9P, the sidewall films 79 constituting the core film processing patterns are removed by wet etching. At this time, since the sidewall films 79 and the mask film 72 which becomes the selection gate line formation mask pattern are made of the same material (SiN), the etching time is adjusted to a degree that the mask film 72 is not completely removed. For example, wet etching using a solution containing phosphoric acid may be exemplified as the above wet etching.

After that, as illustrated in FIGS. 8Q and 9Q, the sliming is performed by the isotropic etching until the core films 74 in the area for forming the word lines WL have substantially half widths. Wet etching or CDE may be used as the isotropic etching. Herein, the etching is performed until the widths of the core film processing patterns formed in the area for forming the word lines WL becomes 12.5 nm.

Subsequently, as illustrated in FIGS. 8R and 9R, a sidewall film 80 is conformally formed above the entire surface of the processing object. For example, an SiN film having a width of 12.5 nm which is substantially equal to the width of the core film 74 may be used as the sidewall film 80. After that, as illustrated in FIGS. 8S and 9S, etch-back of the formed sidewall film 80 is performed by the anisotropic etching such as the RIE method until the upper surfaces of the core films 74 are exposed. For example, $CH_2F_2$ gas or the like may be used as a processing gas. Therefore, loop-shaped sidewall films 80 are formed around the core films 74. Hereinafter, a combination of the mask film 72 and the sidewall film 80 is denoted by a mask film 721.

After that, as illustrated in FIGS. 8T and 9T, the core films 74 are removed by the etching process. Wet etching using choline may be used as the etching process. Therefore, the sidewall films 80 formed on the side surface of the core films 74 are formed as new line patterns, and masks for forming the word lines WL in FIG. 2 are produced. Herein, the sizes of the word lines formation masks and the distances (spaces) between the adjacent word lines formation masks become 12.5 nm. In addition, the sizes of the selection gate lines formation mask film 721 becomes 50 nm, respectively.

Next, as illustrated in FIGS. 8U and 9U, the mask film 711 is etched by the anisotropic etching such as the RIE method using the sidewall films 80 as masks in the area for forming the word lines WL. A gas such as $C_4F_8$ may be used as a processing gas. Therefore, the selection gate lines formation mask is formed by the mask film 721, and the word lines formation masks is formed by using the mask film 711 and the sidewall films 80.

After that, as illustrated in FIGS. 4L, 4M, 5L, and 5M of the first embodiment, the end portions of the word lines formation masks in the X direction and the selection gate line formation mask which constitute closed loop structures are cut by the photolithography technique and the etching technique. Therefore, line-and-space shaped word lines formation patterns are formed between a pair of the line-shaped selection gate lines formation patterns. Next, the stacked films from the control gate electrode film 14 to the tunnel insulating film 11 which constitute the processing object are processed by the anisotropic etching such as the RIE method using the selection gate lines formation patterns and the word lines formation patterns, so that the word lines WL which are arranged at a predetermined interval in the Y direction are formed to extend in the X direction between a pair of the selection gate lines SGL1 and SGL2 which extend in the X direction.

In the third embodiment, after the selection gate line formation pattern is first formed, the core films 74 and 75 are formed thereon to embed the selection gate lines formation pattern, and the word lines formation pattern is formed. Therefore, the sidewall films 79 and 80 which are formed at the time of forming the word lines formation pattern are not formed around the selection gate lines formation pattern. As a result, the sizes of the selection gate lines formation pattern does not depend on the thicknesses of the sidewall films 79 and 80. Therefore, as an additional effect of the second embodiment, the sizes of the selection gate lines formation pattern can be easily controlled compare with the second embodiment.

(Fourth Embodiment)

In a fourth embodiment, as a method different from those of the first to third embodiments, a pattern forming method capable of accurately forming a size of a selection gate line of which the size is larger than the word line will be described.

FIGS. 10A to 10L are schematic partial cross-sectional views illustrating an example of a pattern forming method according to the fourth embodiment, and FIGS. 11A to 11L are schematic partial plan views illustrating the example of the pattern forming method according to the fourth embodiment. In addition, FIGS. 10A to 10L correspond to cross-sectional views taken line E-E of FIGS. 11A to 11L. In addition, these figures illustrate a portion where the two memory units Su are disposed to be adjacent to each other in the bit line direction. In addition, in this example, the case where the word lines WL and the selection gate lines SGL1 and SGL2 (hereinafter, in this embodiment, simply indicated by SGL) are formed by processing stacked films of the tunnel insulating film 11, the floating gate electrode film 12, the inter-electrode insulating film 13, and the control gate electrode film 14 formed on the semiconductor substrate 1 will be described. In addition, the control gate electrode film 14 is assumed to be made of Si.

Figure 10A:
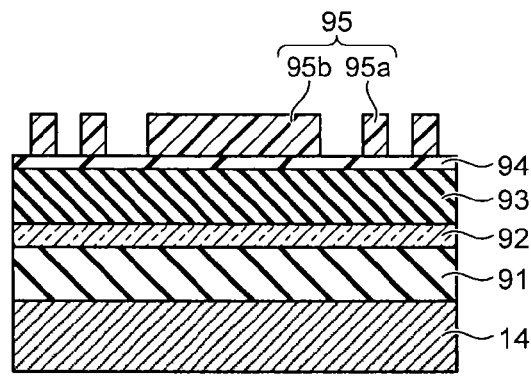
FIGS. 10A to 10L are partial cross-sectional views schematically illustrating an example of a pattern forming method according to a fourth embodiment.
Figure 11A:
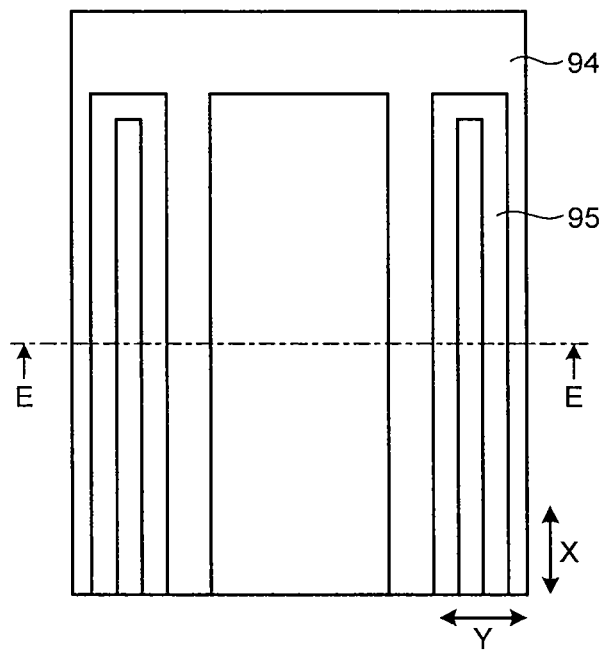
FIGS. 11A to 11L are partial plan views schematically illustrating the example of the pattern forming method according to the fourth embodiment.

First, as illustrated in FIGS. 10A and 11A, a mask film 91, a stopper film 92, and a core film 93 are sequentially formed on the entire surface of the processing object (control gate electrode film 14). For example, a TEOS film having a thickness of 150 nm may be used as the mask film 91. For example, a silicon film having a thickness of 30 nm may be used as the stopper film 92. For example, a TEOS film having a thickness of 100 nm may be used as the core film 93. In addition, a resist is applied on the core film 93 through an anti-reflection film 94, and resist patterns 95 are formed by the lithography technique. As the resist patterns 95, the line-and-space shaped core forming patterns 95a which extends in the X direction is formed in the area for forming the word line WL, and the pattern 95b is formed in the area for forming the two facing selection gate lines SGL of the memory units Su which are adjacent to each other in the Y direction so as to cover the area. Herein, the widths of the line in the Y direction and the spaces of the line-and-space shaped patterns 95a are set to 50 nm, and the width of the pattern 95b in the Y direction is set to 300 nm. In addition, the line-and-space shaped patterns 95a are connected to the end portion in the X direction between a pair of the adjacent patterns 95a, so that loop shapes are formed.

Figure 10B:
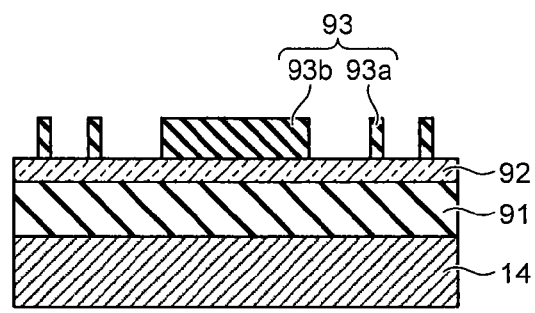
Figure 11B:
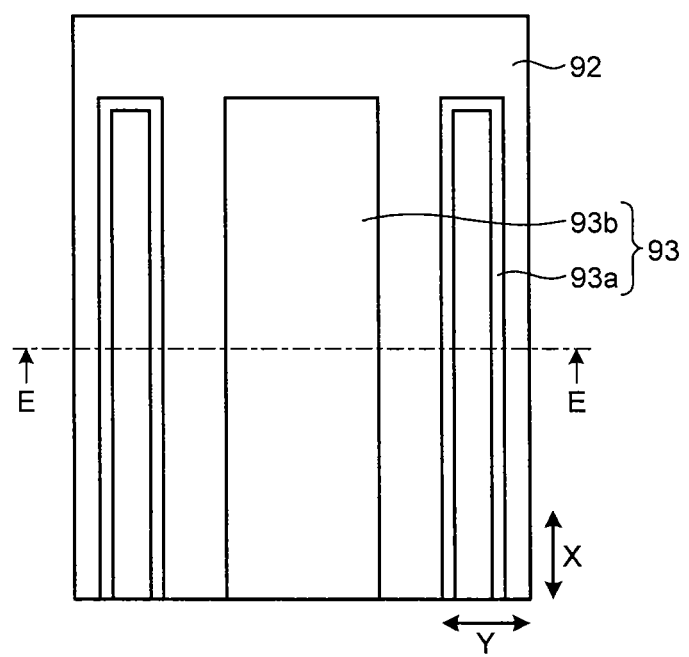

Next, as illustrated in FIGS. 10B and 11B, the core film 93 is etched by the RIE method using the resist patterns 95 as masks, and the patterns 95a and 95b are transferred to the core film 93. At this time, the process is performed under the condition that the selection ratio to the stopper film 92 is high so that the stopper film 92 is used as a stopper. For example, a gas such as $C_4F_8/Ar/O_2$ of which the selection ratio to the stopper film 92 can be easily taken may be used as a processing gas.

After the resist patterns 95 are transferred to the core film 93, sliming is performed until the widths of the core films 93 in the Y direction becomes a substantially half widths, that is, 25 nm. The sliming process may be performed according to the RIE method subsequent to the transferring of the resist patterns 95 to the core film 93. However, in the case where it is difficult to perform the sliming by only the RIE method, the widths of the line-and-space shaped patterns 95a may be reduced in advance by the lithography technique, or the sliming may be performed on the core films 93 where the patterns are formed by the wet etching or the isotropic etching such as CDE. Therefore, the line-and-space shaped core patterns 93a are formed in the area for forming the word lines WL, and the core pattern 93b is formed in the area for forming the selection gate lines SGL so as to cover the area. In addition, the width of the line of the core pattern 93a in the Y direction becomes 25 nm, and the width of the space thereof in the Y direction becomes 75 nm.

Figure 10C:
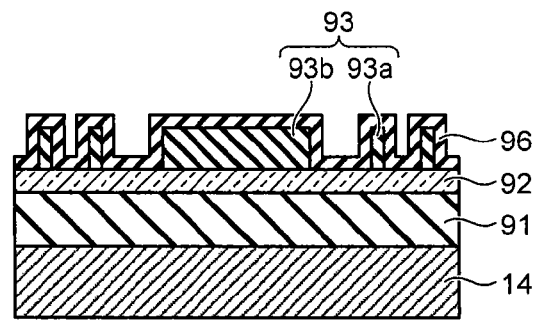
Figure 11C:
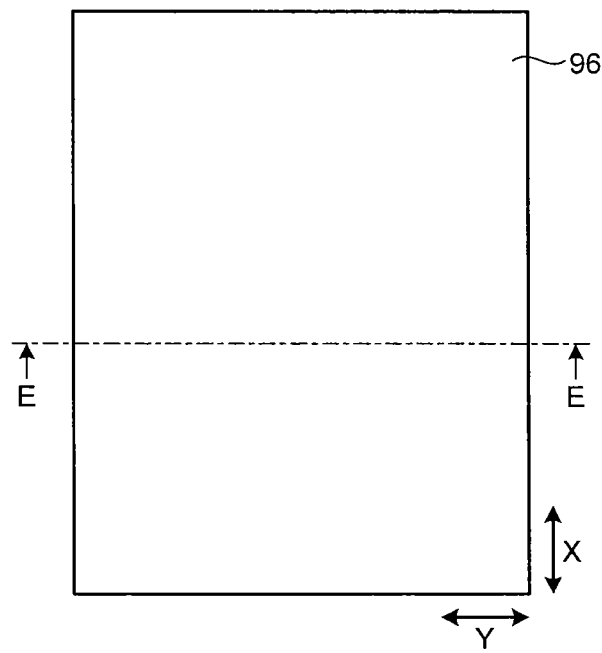

After that, as illustrated in FIGS. 10C and 11C, a sidewall film 96 is formed above the entire surface of the processing object. The sidewall film 96 is formed so as to conformally cover the core patterns 93a and 93b formed on the stopper film 92. For example, an SiN film having a width of 25 nm which is substantially equal to the widths of the core patterns 93a may be used as the sidewall film 96.

Figure 10D:
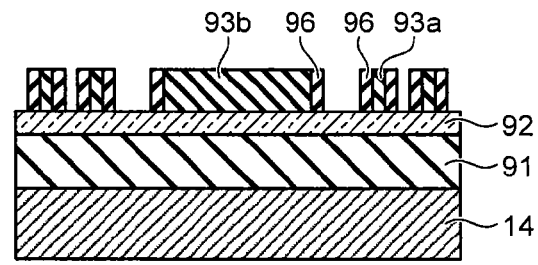
Figure 11D:
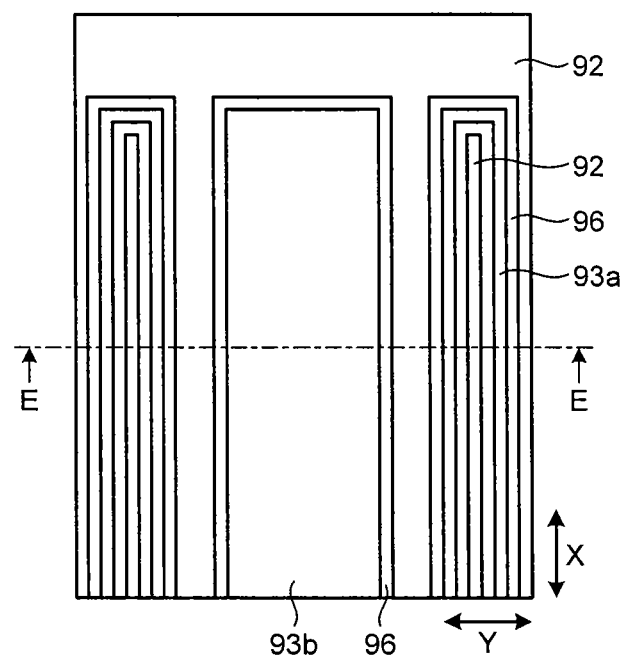

Next, as illustrated in FIGS. 10D and 11D, etch-back of the formed sidewall film 96 is performed by the anisotropic etching such as the RIE method until the upper surfaces of the core patterns 93a and 93b are exposed. Herein, the process is performed under the condition where the selection ratio to the core patterns 93a and 93b and the stopper film 92 is high. For example, $CH_2F_2/Ar$ or the like may be used as a processing gas.

Figure 10E:
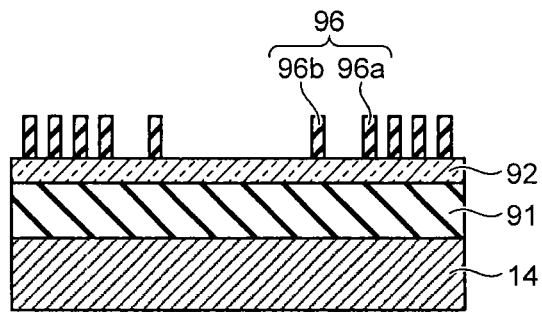
Figure 11E:
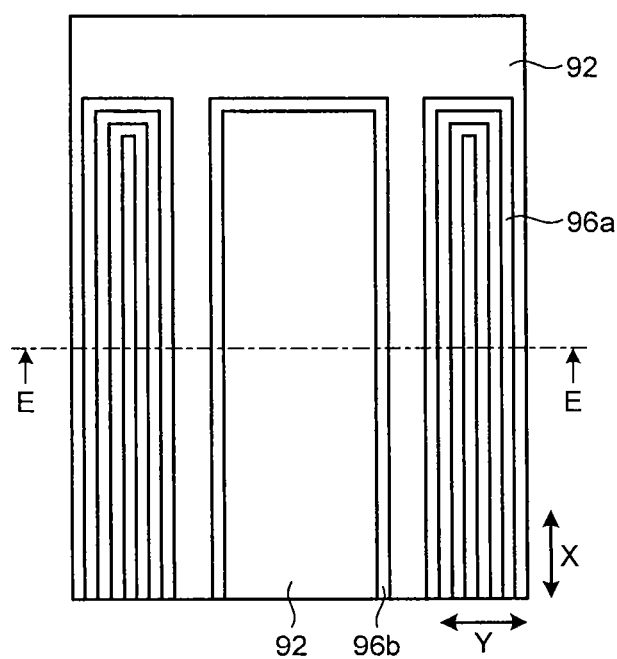

After that, as illustrated in FIGS. 10E and 11E, the core patterns 93a and 93b are removed by the etching process. Wet etching using hydrofluoric acid may be used as the etching process. Therefore, line-and-space shaped sidewall patterns 96a of which the line width and the space width are 25 nm is formed in the area for forming the word lines WL, and a sidewall pattern 96b is formed so as to surround the area for forming the adjacent two selection gate lines SGL. In addition, the sidewall patterns 96a and 96b are connected to other sidewall patterns 96a and 96b through the end portions in the X direction, so that closed loop structures are formed.

Figure 10F:
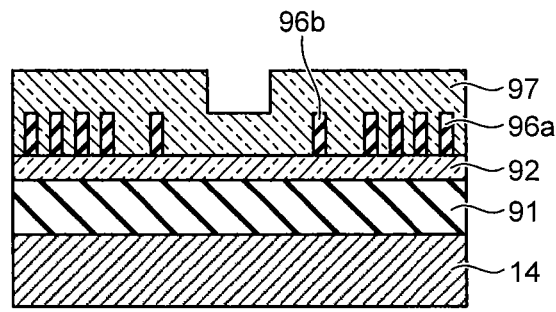
Figure 11F:
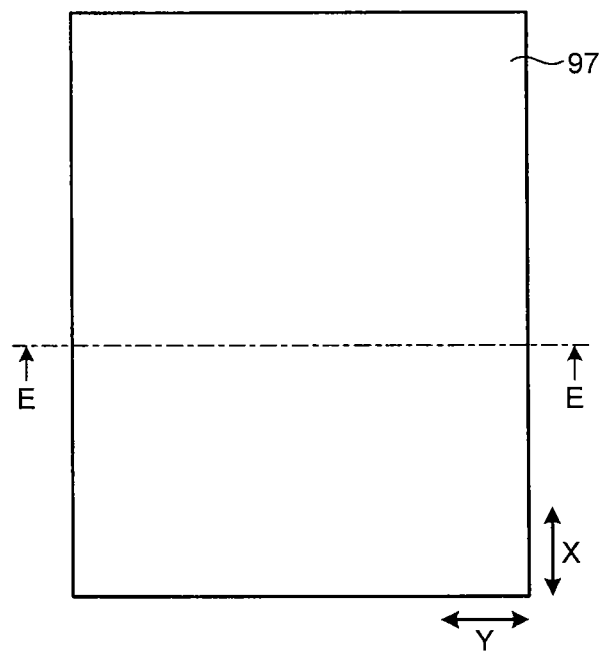

Next, as illustrated in FIGS. 10F and 11F, a mask film 97 which becomes a mask for etching the selection gate lines SGL is formed on the stopper film 92 where the sidewall patterns 96a and 96b are formed. At this time, the mask film 97 is formed so that a portion between the adjacent sidewall patterns 96a and a portion between the sidewall pattern 96a and the sidewall pattern 96b are embedded and so that a film having a thickness required for processing the selection gate line SGL is formed in an inner side surface of the closed-loop-shaped sidewall pattern 96b. For example, Si with a thickness of 75 nm is formed as the mask film 97. In addition, herein, although not shown, in the case where a pattern of a peripheral circuit or the like is formed in an area excluding the area for forming the word lines WL, after that, a resist pattern for covering the mask film 97 is formed by the lithography technique.

Figure 10G:
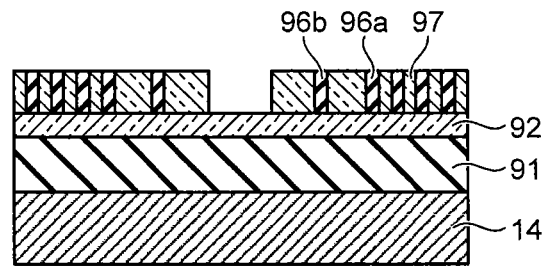
Figure 11G:
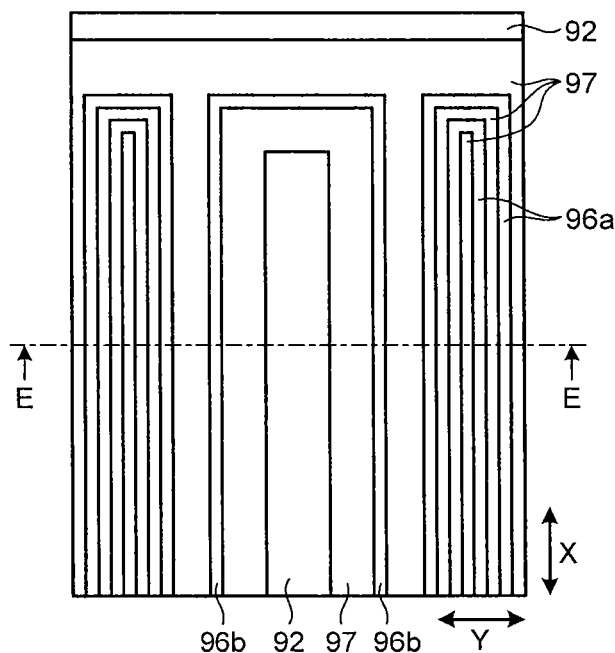

After that, as illustrated in FIGS. 10G and 11G, etch-back of the formed mask film 97 is performed by the anisotropic etching such as the RIE method until the upper surfaces of the sidewall patterns 96a and 96b are exposed. Herein, the process is performed under the condition where the selection ratio to the mask film 91 is high. For example, $Cl_2$ or the like may be used as the processing gas. In addition, since the stopper film 92 is also made of Si, it is preferable that the end point, where the full-surface etch-back is ended so that too much etching is not performed, be defined in advance by using a light emitting monitor or the like.

Figure 10H:
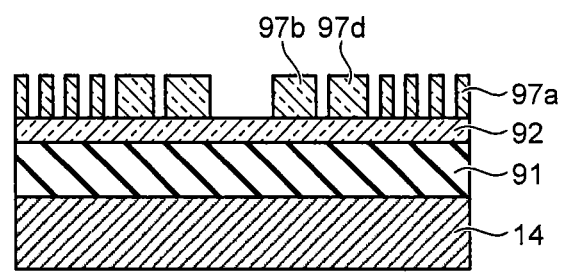
Figure 11H:
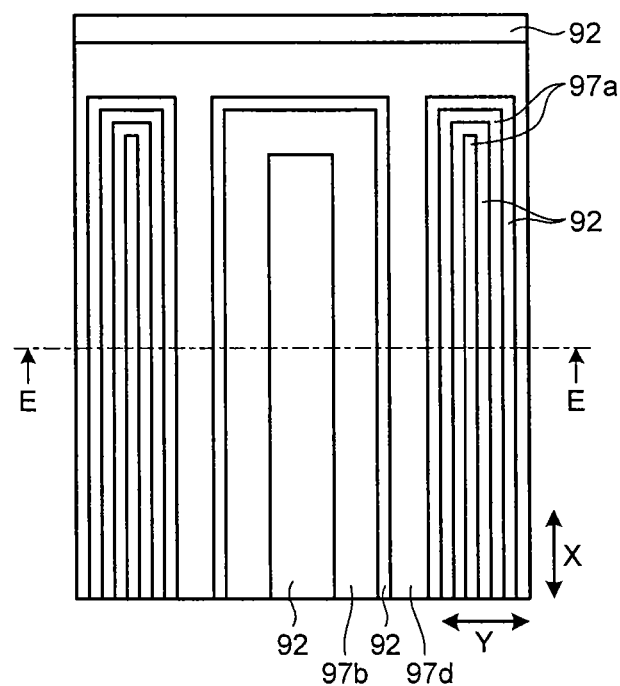

Next, as illustrated in FIGS. 10H and 11H, the sidewall patterns 96a and 96b are removed by the etching process. Wet etching using phosphoric acid or the like may be used for removing the sidewall patterns 96a and 96b. Therefore, line-and-space shaped mask patterns 97a and a dummy pattern 97d are formed in the area for forming the word lines WL, and a mask pattern 97b of which the width is larger than that of the mask pattern 97a is formed in the area for forming the selection gate lines SGL (the end portion of the area in the Y direction for forming the word lines WL).

Figure 10I:
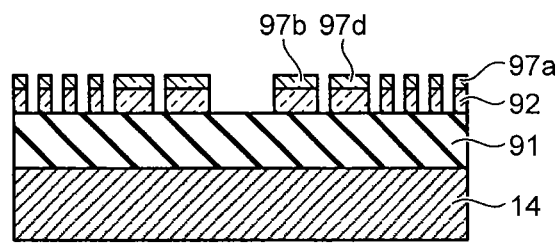
Figure 11I:
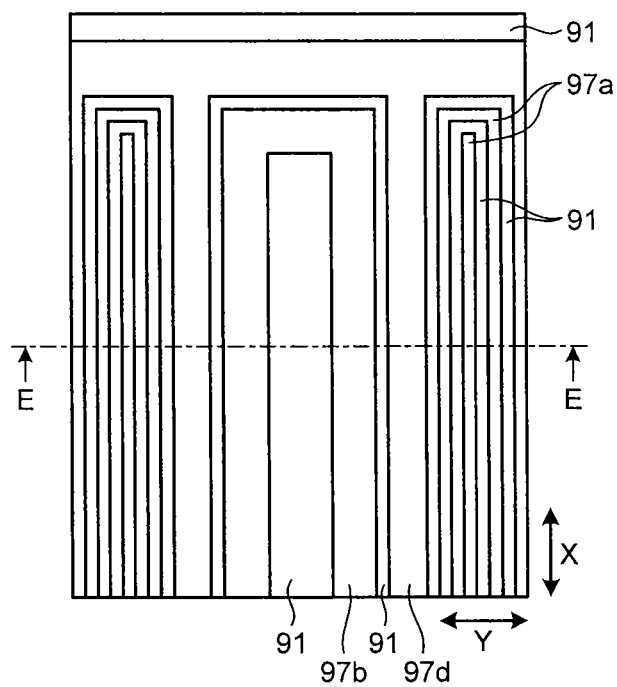

After that, as illustrated in FIGS. 10I and 11I, etch-back of the entire surface of the stopper film 92 is performed by the anisotropic etching such as the RIE method. Herein, the process is performed under the condition where the selection ratio to the mask film 91 is high. For example, $Cl_2/O_2$ or the like may be used as the processing gas. Therefore, patterns are formed which process the mask film 91 where the stopper film 92 and the mask film 97 are stacked. In addition, although each pattern is made of a stacked structure of the stopper film 92 and the mask film 97, herein, the patterns made of the stacked structure are assumed to be mask patterns 97a, 97b, and 97d.

Figure 10J:
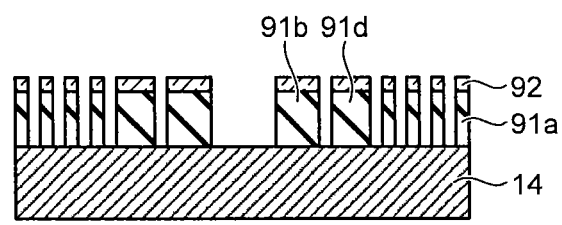
Figure 11J:
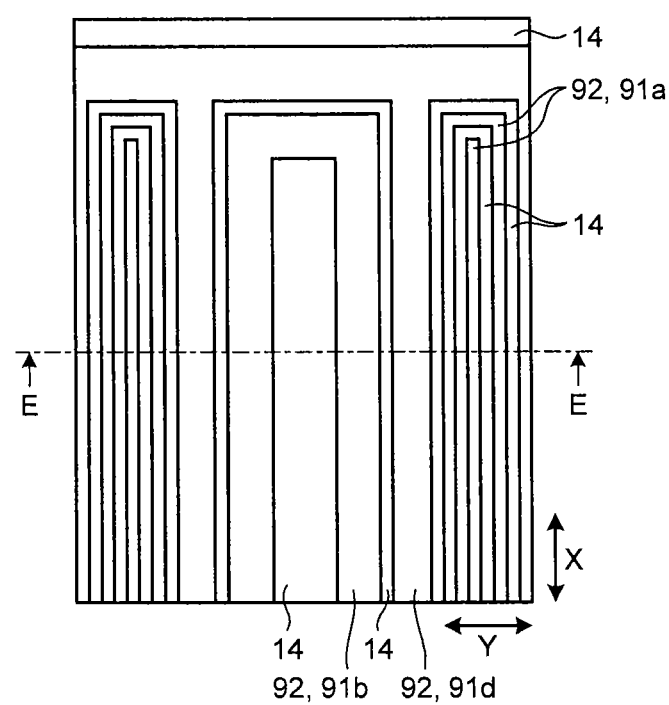

Next, as illustrated in FIGS. 10J and 11J, the mask film 91 is processed by the anisotropic etching such as the RIE method using the mask patterns 97a, 97b, and 97d, which are obtained in FIGS. 10I and 11I, as masks. Herein, the process is performed under the condition where the selection ratio to the mask patterns 97a, 97b, and 97d is high. For example, $C_4F_8/Ar/O_2$ or the like may be used as the processing gas. Therefore, mask patterns 91a for forming the word lines WL, a mask pattern 91b for forming the selection gate lines SGL, and a mask pattern 91d for forming the dummy patterns are formed in the mask film 91.

Figure 10K:
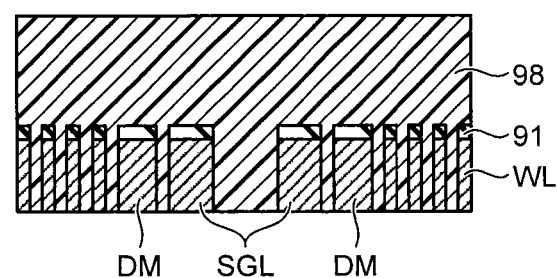
Figure 11K:
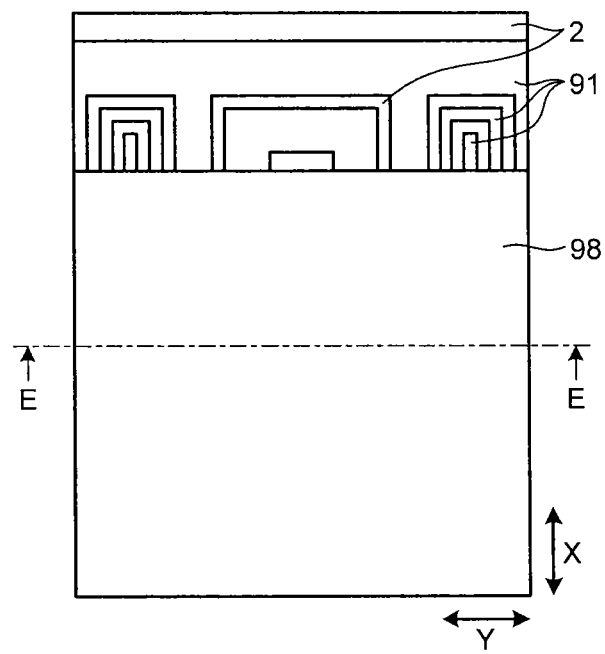

After that, as illustrated in FIGS. 10K and 11K, the processing object is etched by the anisotropic etching such as the RIE method using the mask patterns 91a, 91b, and 91d as masks. Therefore, a group including a predetermined number of the word lines WL which extend in the X direction and arranged at a predetermined interval in the Y direction and a pair of the dummy patterns DM and a pair of the selection gate lines SGL, which are disposed at both ends of the group of the word lines WL in the Y direction and extend in the X direction, are formed. In addition, FIG. 11K illustrates the state where the STI2 as the base is exposed by etching the processing object at the end portions of the selection gate lines SGL in the X direction and the word lines WL.

In this manner, the selection gate lines SGL, the word lines WL, and the dummy patterns DM constitute closed loop structures. In other words, the end portions of the selection gate lines SGL, the word lines WL, and the dummy patterns DM in the X direction are connected to the other selection gate lines SGL, the other word lines WL, and the other the dummy patterns DM. A resist is applied above the processing object. So that the connection portions of the end portions of the selection gate lines SGL, the word line WL, and the dummy pattern DM in the X direction are exposed, and other portions are covered by the lithography technique, patterning is performed. Therefore, a resist pattern 98 is formed.

Figure 10L:
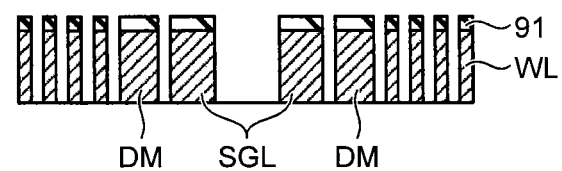
Figure 11L:
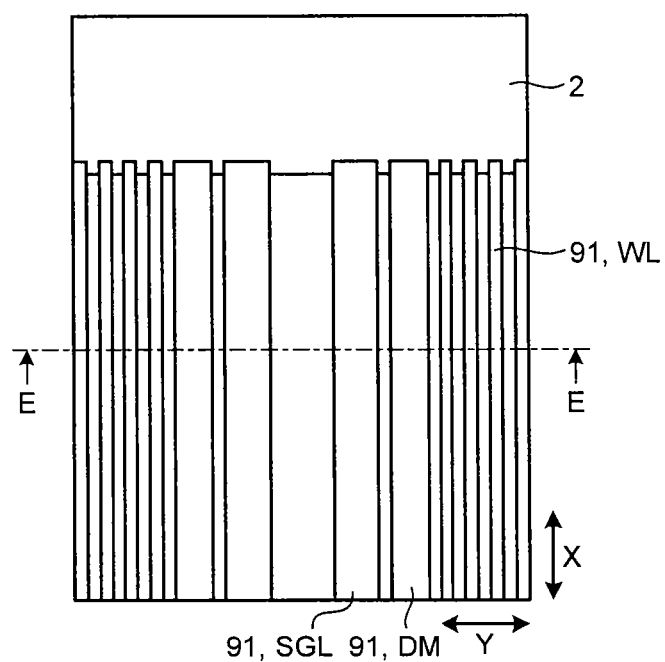

Next, as illustrated in FIGS. 10L and 11L, the processing object is etched by the anisotropic etching such as the RIE method using the resist pattern 98 as a mask, so that closed loops cutting process is performed. Therefore, the connection portions of the end portions of the selection gate lines SGL, the word lines WL, and the dummy patterns DM in the X direction in the area which is not covered by the resist pattern 98 are removed. After that, the resist pattern 98 is removed by using the resist stripping technique. Accordingly, line-and-space shaped word lines WL, which extend in the X direction through the dummy patterns DM and are disposed at a predetermined interval in the Y direction, are formed between a pair of the selection gate lines SGL which extend in the X direction.

In the fourth embodiment, a core pattern 93b which covers the area for forming the two selection gate lines SGL disposed to be adjacent to each other in the Y direction and line-and-space shaped core patterns 93a which are disposed at the both sides of the core pattern 93b in the Y direction are formed, and after sidewall patterns 96a and 96b are formed on the side surfaces of the core patterns 93a and 93b, the core patterns 93a and 93b are removed. Next, a mask film 97 is formed, and etch-back of the mask film 97 is performed, and after that, the sidewall patterns 96a and 96b are removed. Accordingly, the mask pattern 97b corresponding to the selection gate lines SGL and the mask patterns 97a corresponding to the word lines WL are formed. Herein, although the size of the mask pattern 97b in the Y direction corresponding to the selection gate line SGL is determined according to the thickness at the time of forming the mask film 97, the thickness of the mask film 97 can be accurately controlled by using a film forming technique so as to be a desired thickness. Therefore, unlike the case of forming a pattern by using the lithography technique and the etching technique, conversion difference does not occur, so it is possible to accurately control the size of the mask pattern 91b for forming the selection gate lines SGL. In addition, in the fourth embodiment, the area for forming the two selection gate lines SGL may not covered with the pattern 95b, and the core pattern 93b may not be required. Although the core pattern 93b is not provided, since the mask film 97 can be formed on the side surface of the sidewall pattern 96b without embedding between the adjacent sidewall patterns 96a at the end portions of the line-and-space shaped sidewall patterns 96a in the Y direction formed in the area for forming the word lines WL, the mask pattern 97b having a large width can be obtained in the area for forming the selection gate lines SGL by performing etch-back of the mask film 97 similarly to the case of forming the core pattern 93b. In addition, in this case, if the patterns 95a having larger widths than others are formed at the end portions in the Y direction as the resist patterns 95, as a result, the mask film 97 which is formed to have a larger width than others is embedded between the adjacent sidewall patterns 96 can be formed at the end portions in the Y direction as the mask pattern 97d having a large width corresponding to the dummy pattern.

In addition, unlike the first to third embodiments, since the mask pattern 97b corresponding to the selection gate lines SGL and the mask patterns 97a corresponding to the word lines WL are simultaneously formed, it is possible to obtain an effect of keeping the distances (spaces) between the selection gate line SGL and the word line WL which is closest to the selection gate line SGL to be a predetermined value.

(Fifth Embodiment)

Although the case of forming the line-and-space shaped patterns of which the sizes (widths) are ½ of the sizes (widths) of the core patterns which are first formed is described in the fourth embodiment, the case of forming line-and-space shaped patterns of which the sizes are ¼ of the sizes of core patterns which are first formed will be described in a fifth embodiment.

Figure 12A:
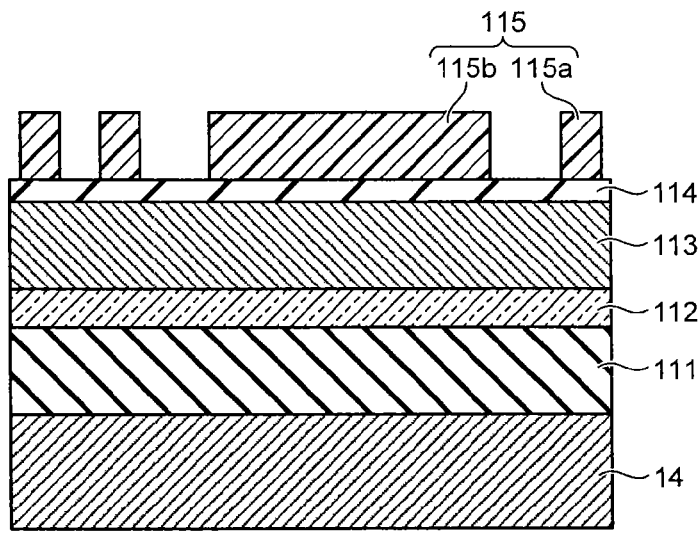
FIGS. 12A to 12S are partial cross-sectional views schematically illustrating an example of a pattern forming method according to a fifth embodiment.
Figure 12B:
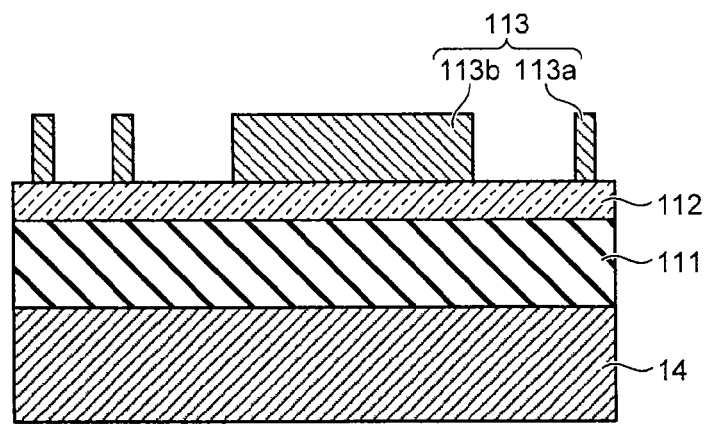
Figure 12C:
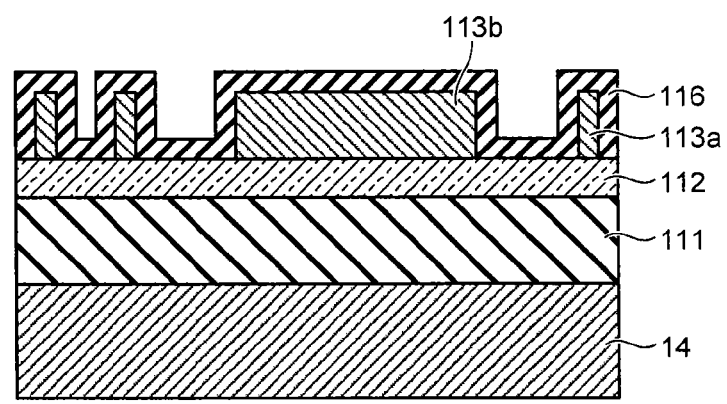
Figure 12D:
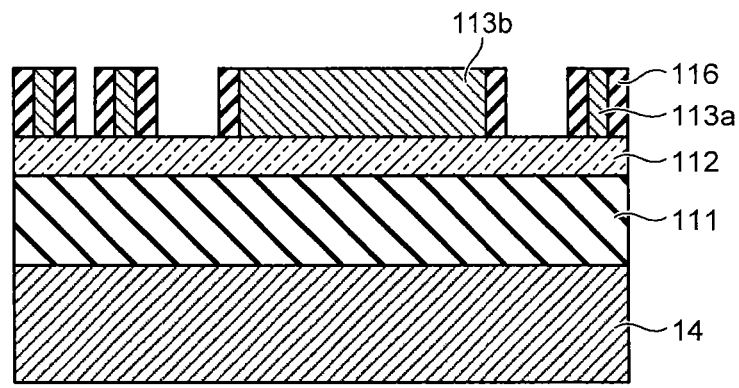
Figure 12E:
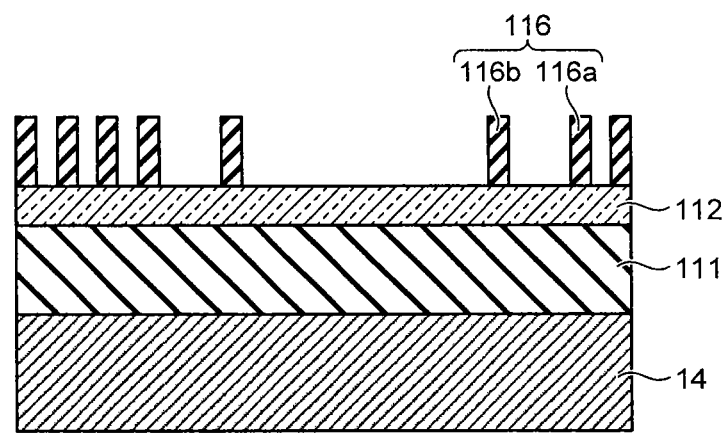
Figure 12F:
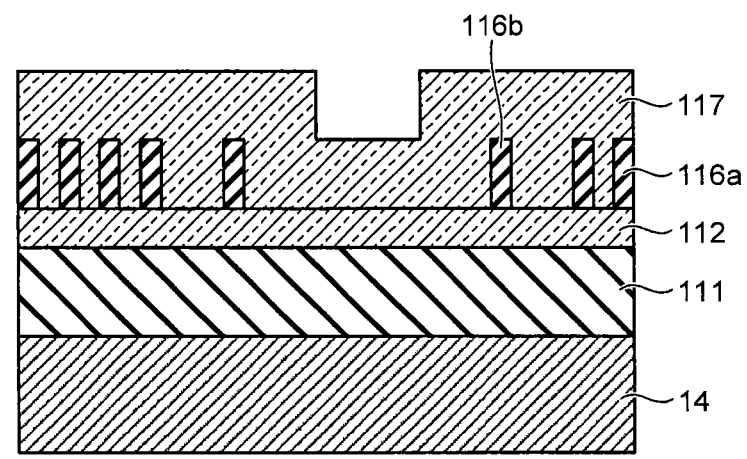
Figure 12G:
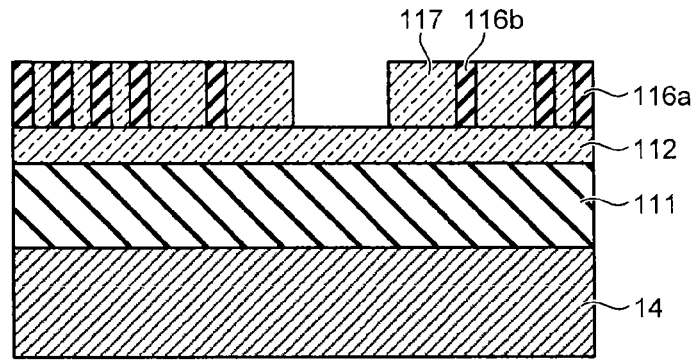
Figure 12H:
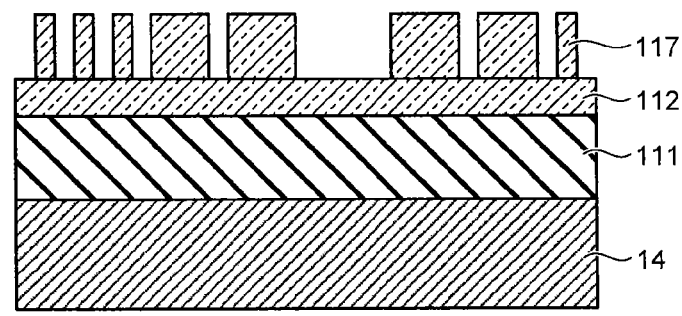
Figure 12I:
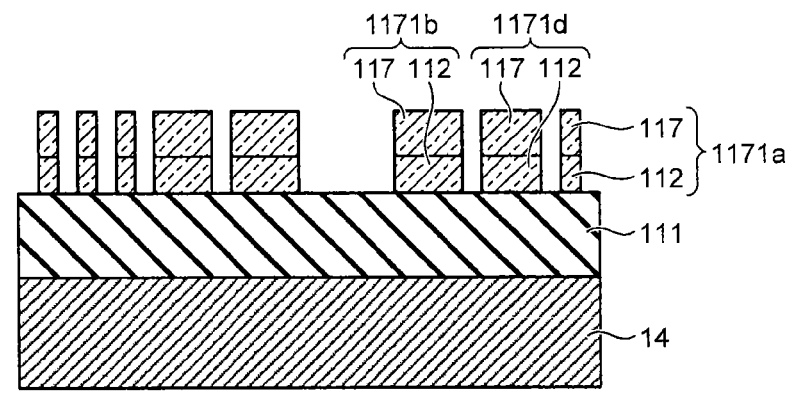
Figure 12J:
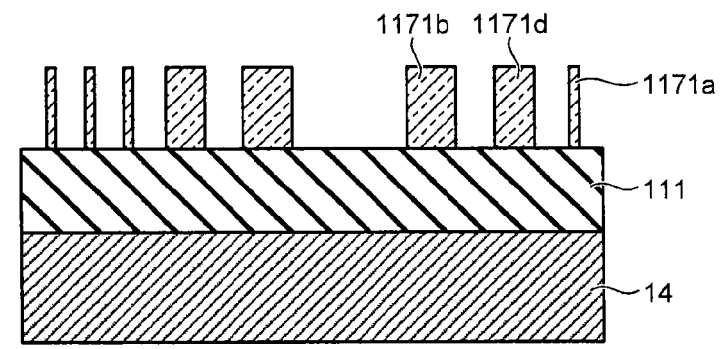
Figure 12K:
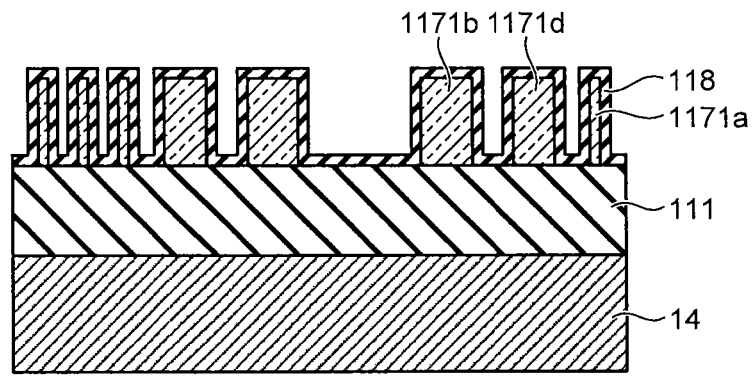
Figure 12L:
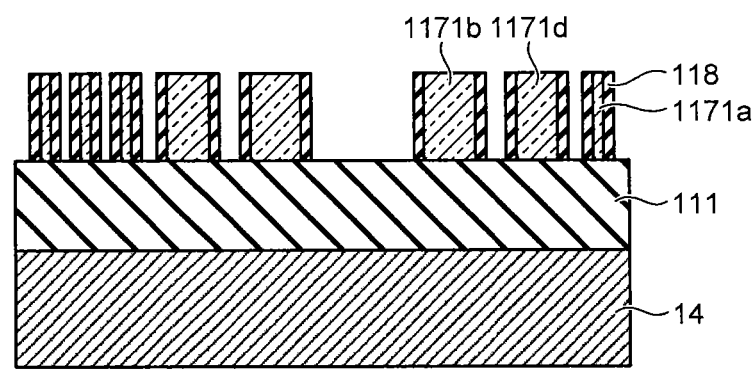
Figure 12M:
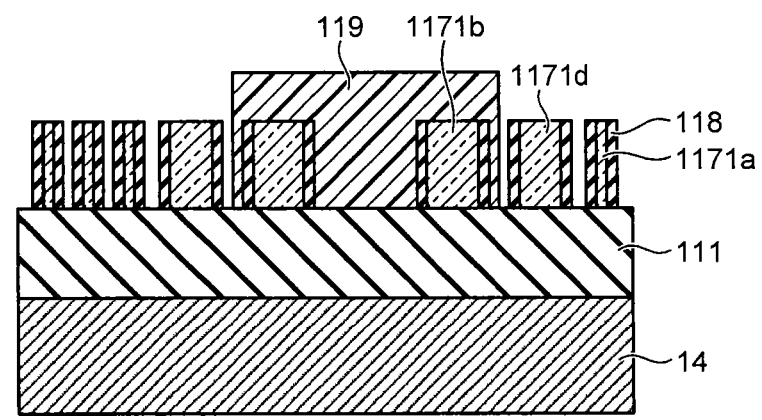
Figure 12N:
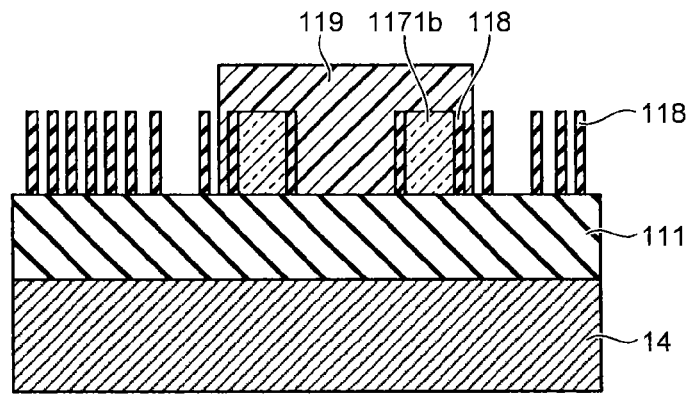
Figure 12O:
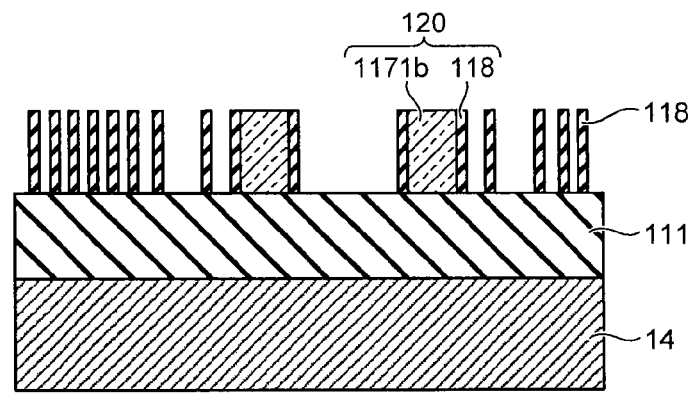
Figure 12P:
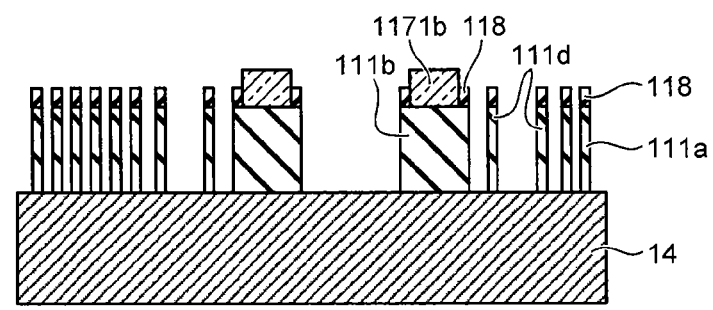
Figure 12Q:
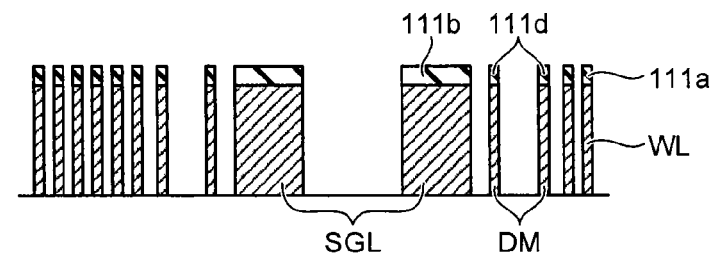
Figure 12R:
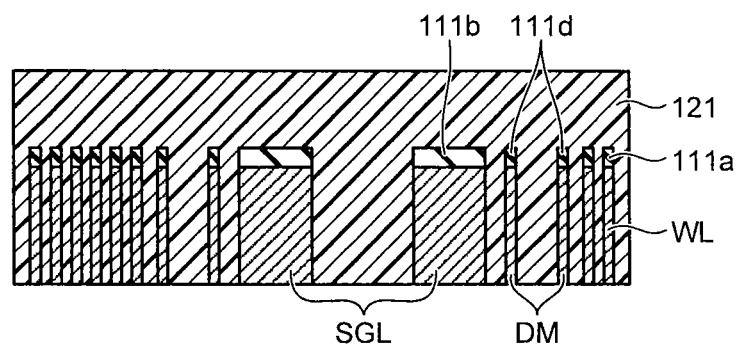
Figure 12S:
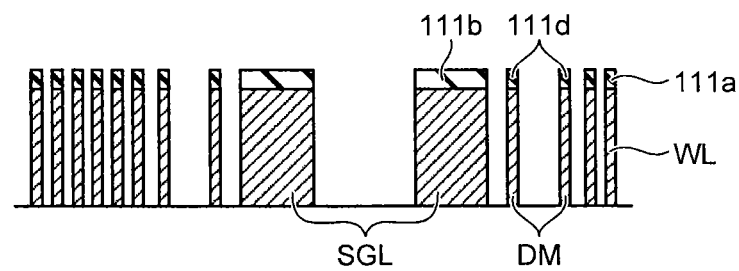
Figure 13A:
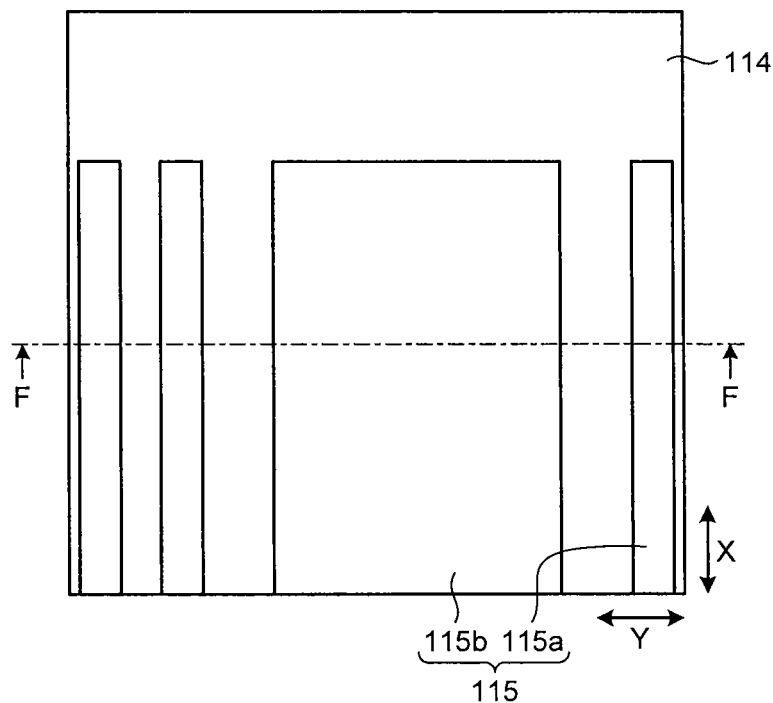
FIGS. 13A to 13S are partial plan views schematically illustrating the example of the pattern forming method according to the fifth embodiment.
Figure 13B:
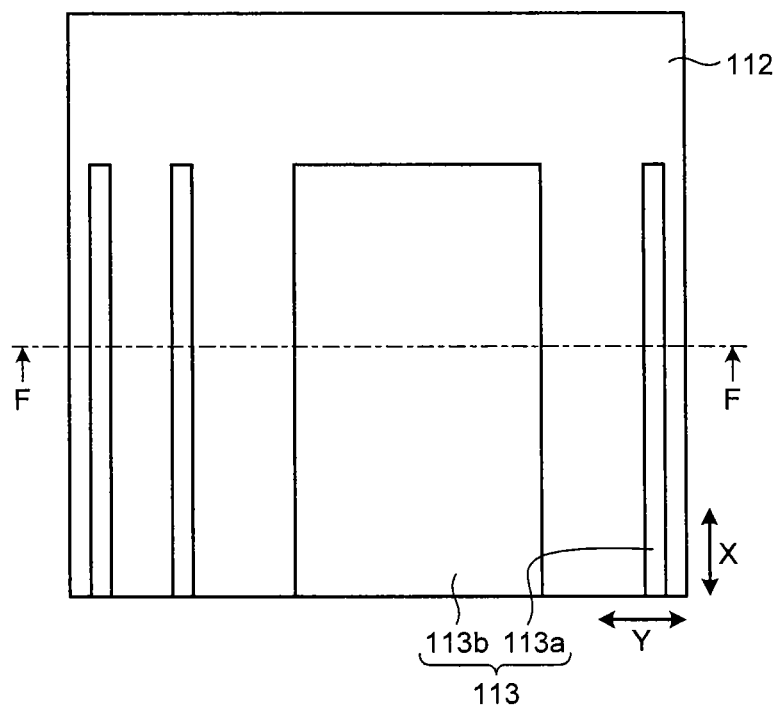
Figure 13C:
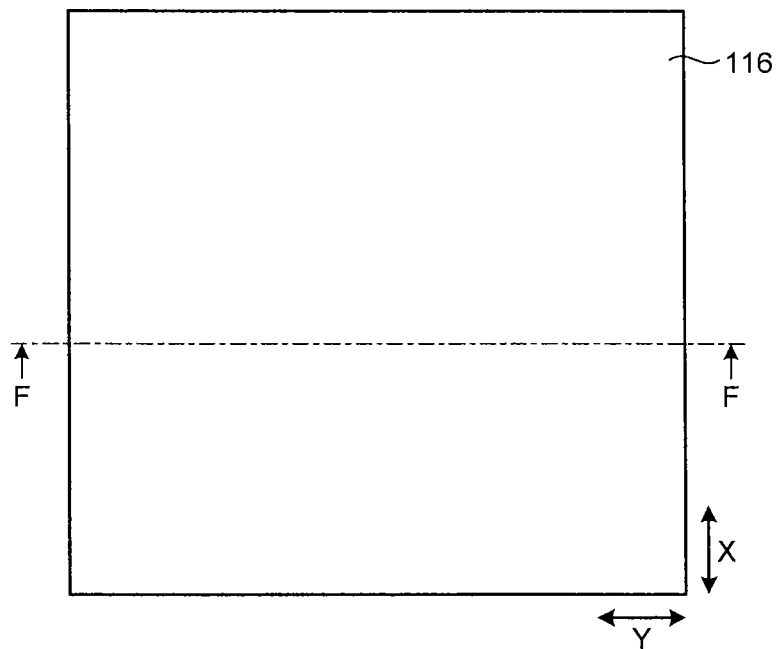
Figure 13D:
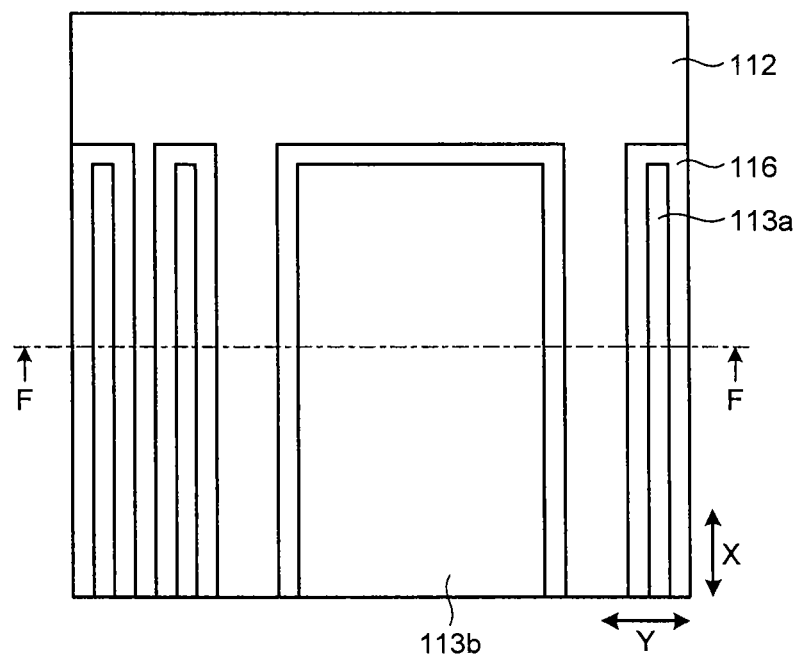
Figure 13E:
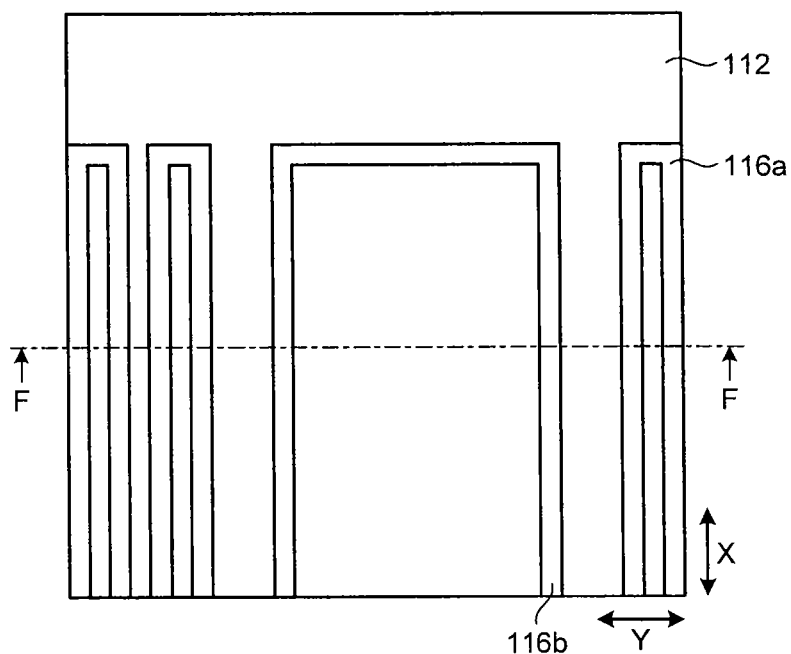
Figure 13F:
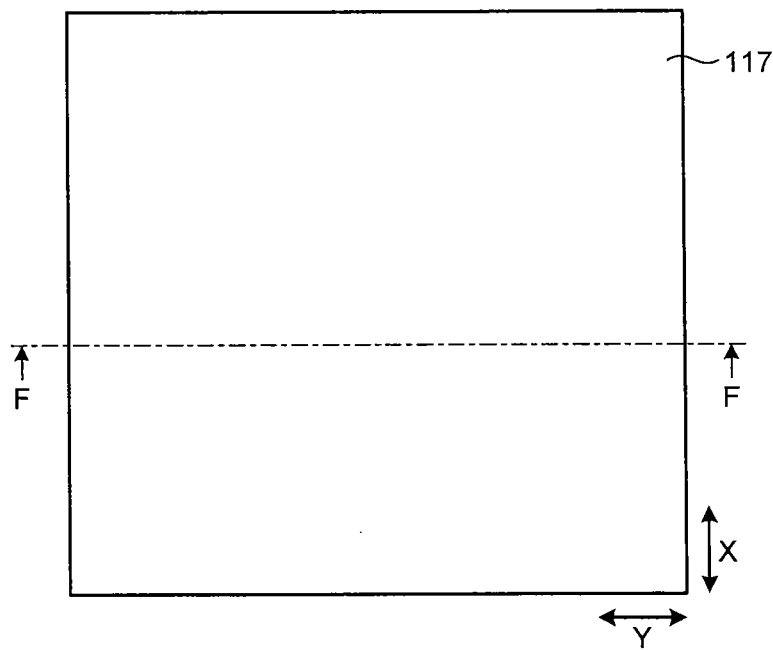
Figure 13G:
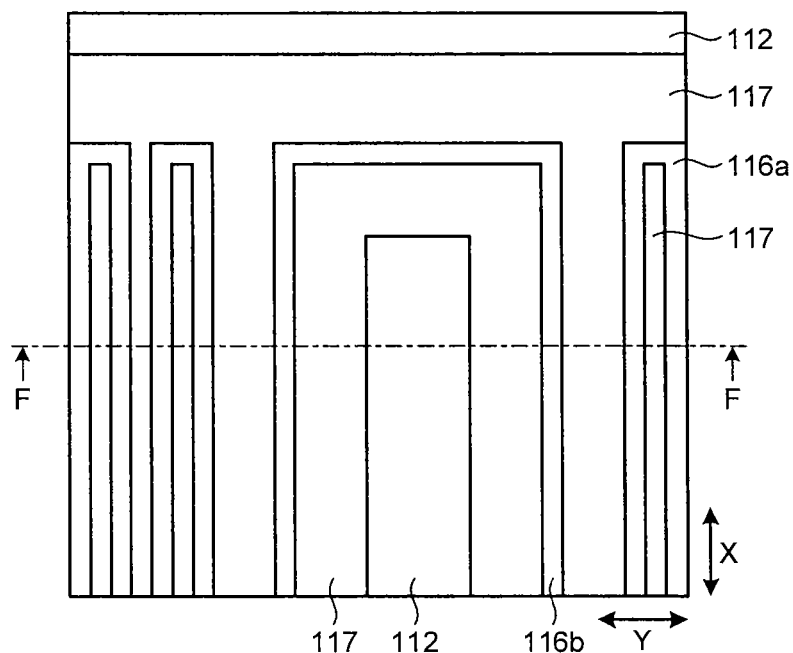
Figure 13H:
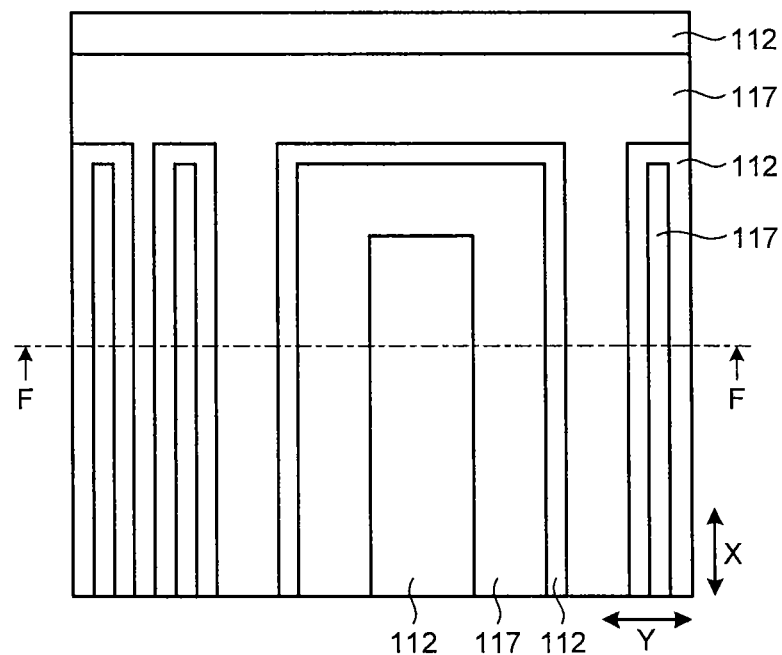
Figure 13I:
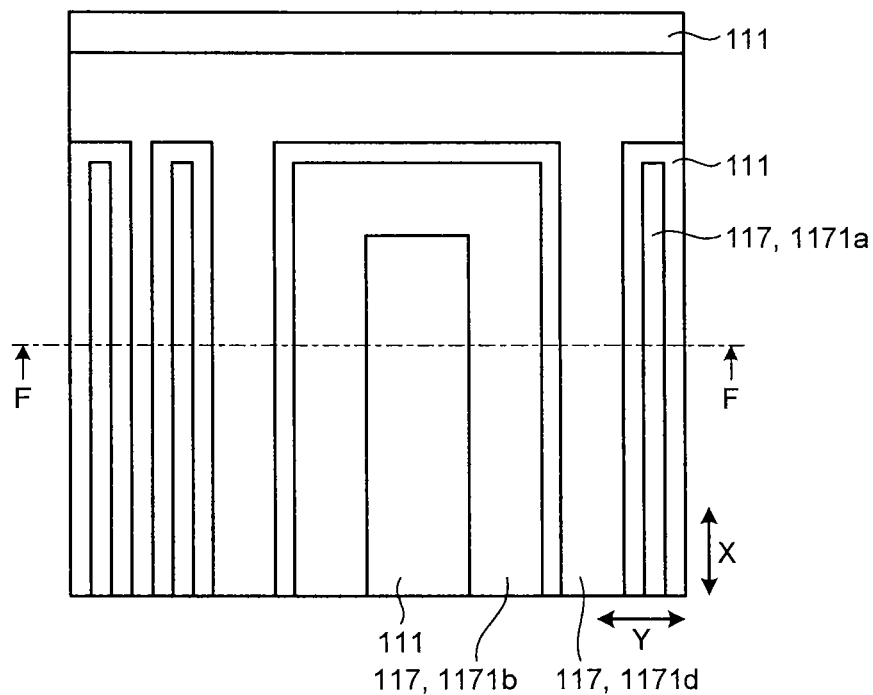
Figure 13J:
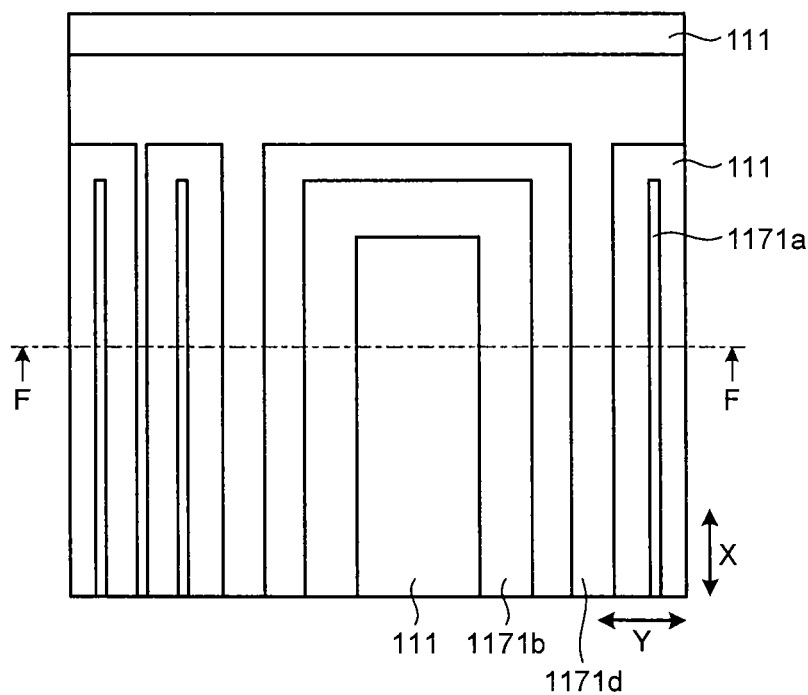
Figure 13K:
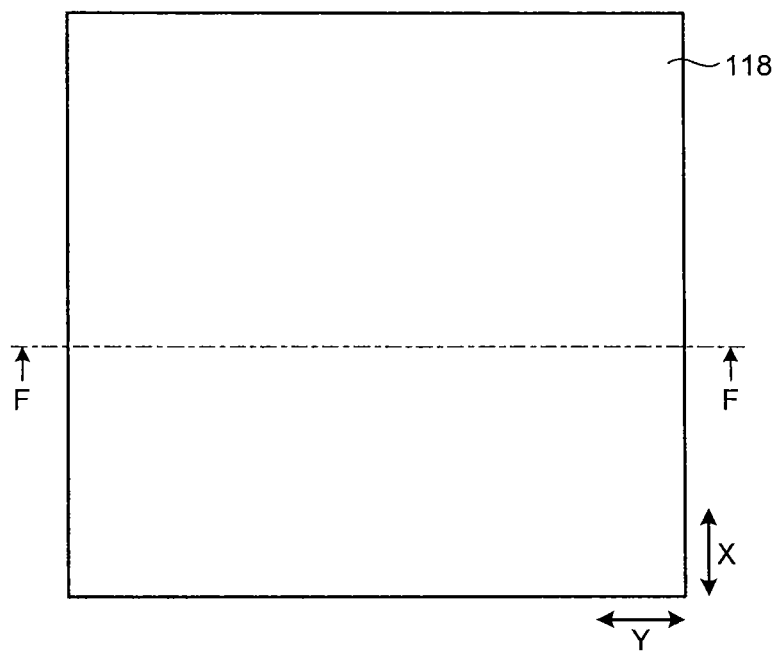
Figure 13L:
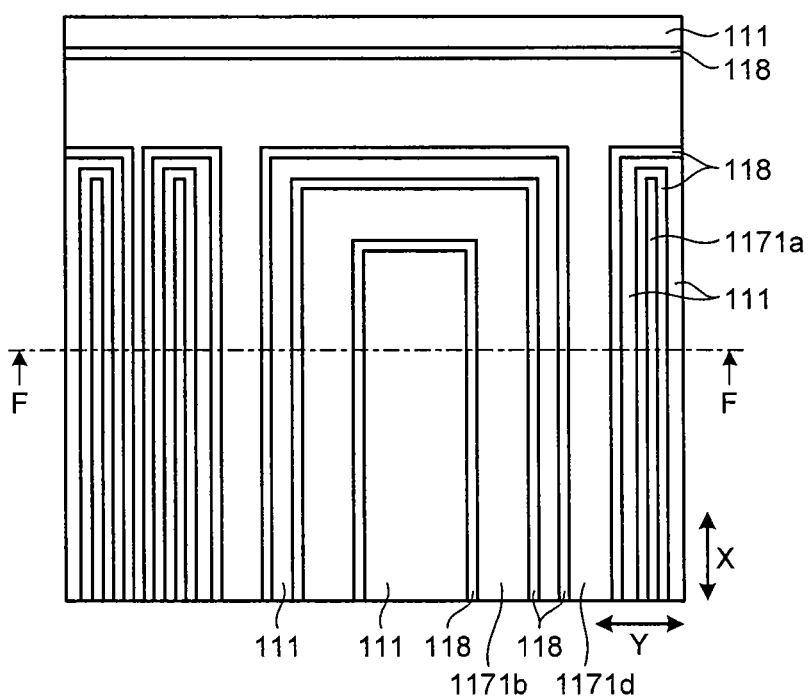
Figure 13O:
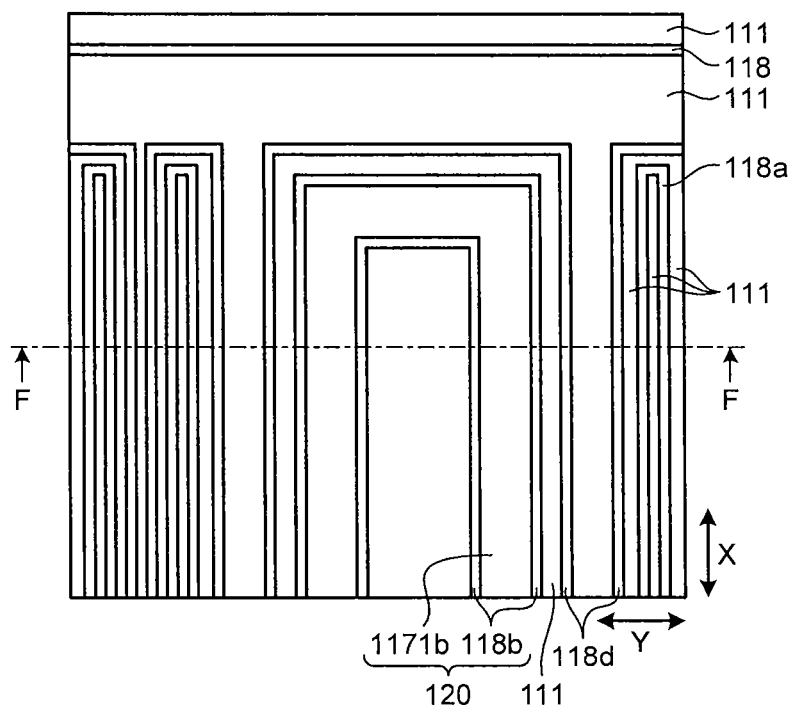
Figure 13P:
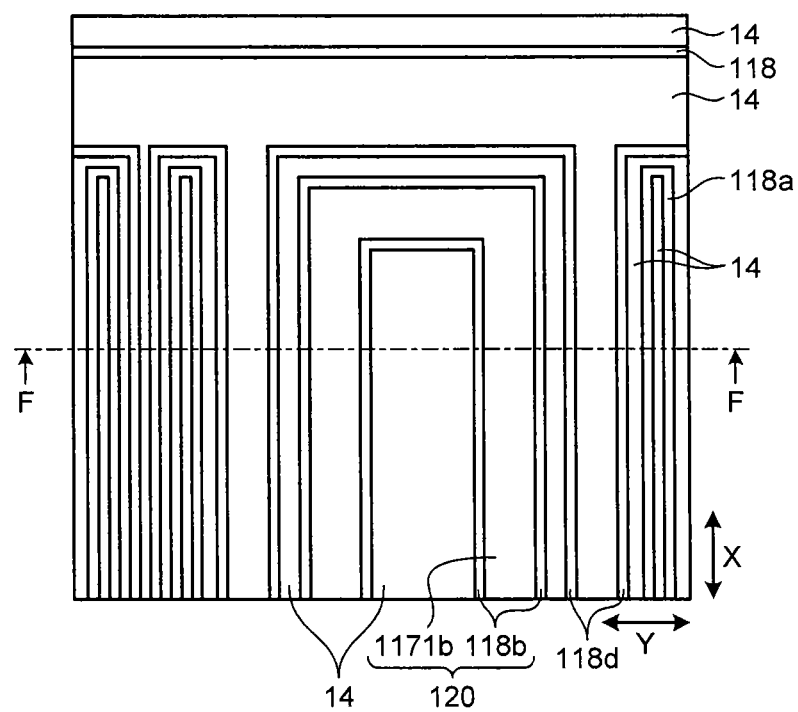
Figure 13Q:
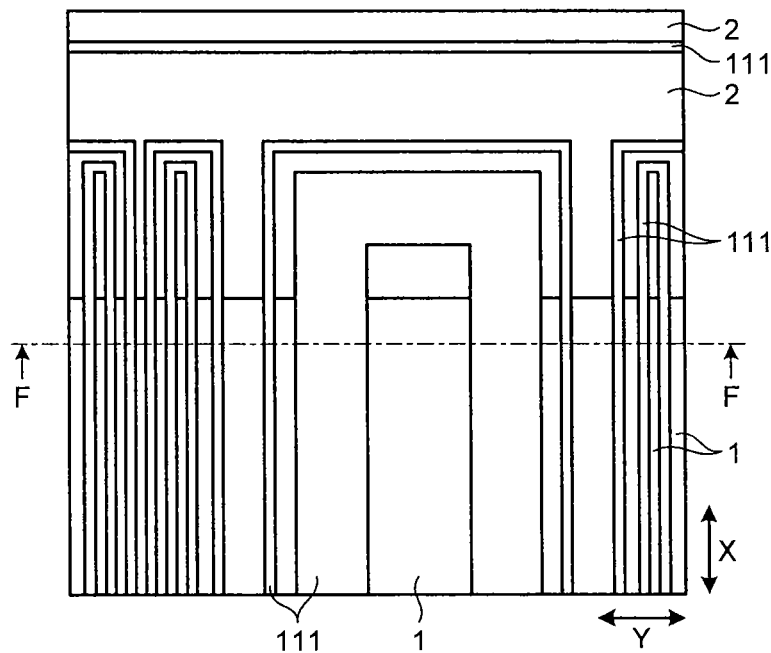
Figure 13R:
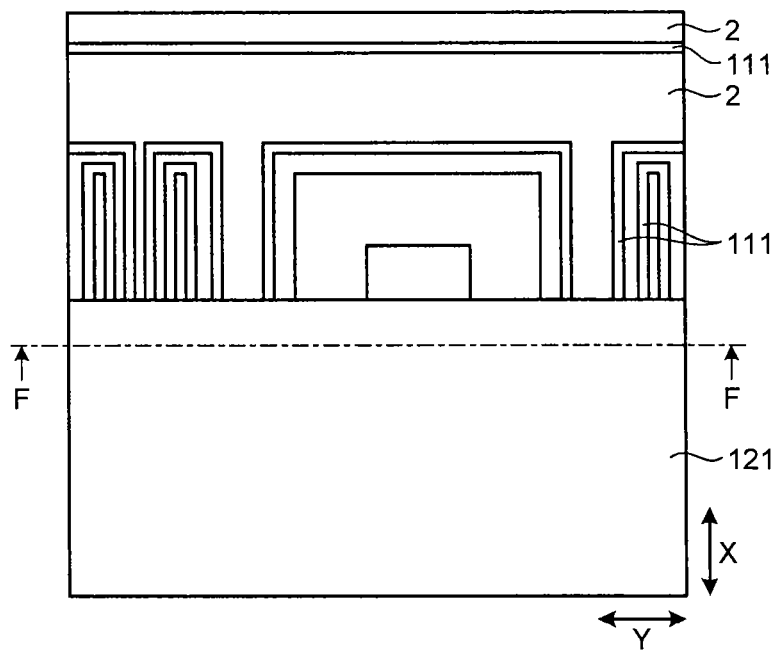
Figure 13S:
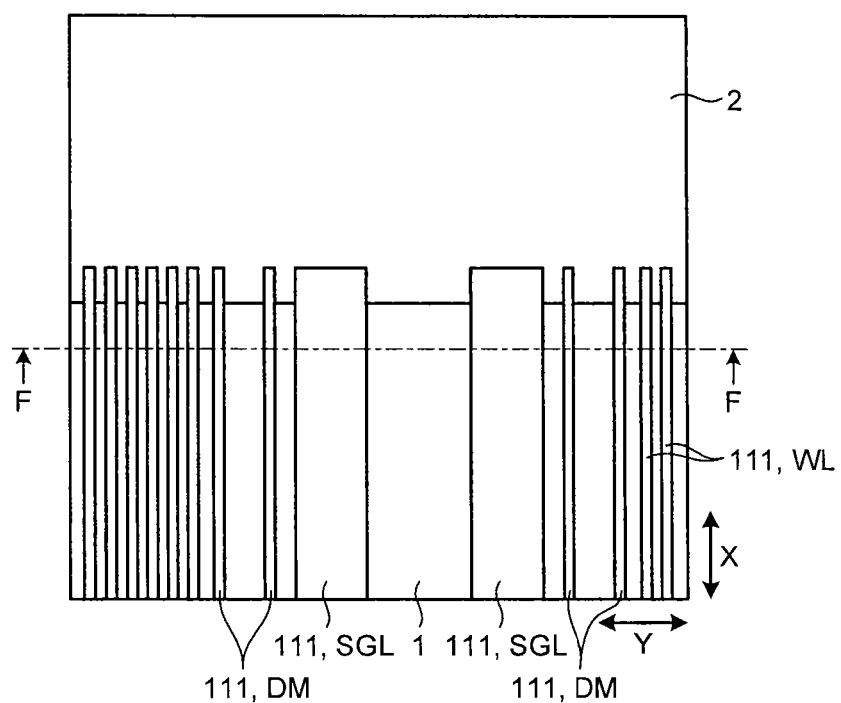

FIGS. 12A to 12S are schematic partial cross-sectional views illustrating an example of a pattern forming method according to the fifth embodiment, and FIGS. 13A to 13S are schematic partial plan views illustrating the example of the pattern forming method according to the fifth embodiment. In addition, FIGS. 12A to 12S correspond to cross-sectional views taken line F-F of FIGS. 13A to 13S. In addition, these figures illustrate a portion where the two memory units Su are disposed to be adjacent to each other in the bit line direction. In addition, in this example, the case where the word line WL and the selection gate lines SGL1 and SGL2 (hereinafter, in this embodiment, simply indicated by SGL) are formed by processing a stacked films of a tunnel insulating film 11, a floating gate electrode film 12, an inter-electrode insulating film 13, and a control gate electrode film 14 formed on the semiconductor substrate 1 will be described. In addition, the control gate electrode film 14 is assumed to be made of Si.

First, as illustrated in FIGS. 12A and 13A, a mask film 111, a stopper film 112, and a core film 113 are sequentially formed on the entire surface of the processing object (control gate electrode film 14). For example, a TEOS film having a thickness of 150 nm may be used as the mask film 111. For example, a silicon film having a thickness of 30 nm may be used as the stopper film 112. For example, a carbon film having a thickness of 100 nm may be used as the core film 113. In addition, a resist is applied on the core film 113 through a mask film 114 made of a spin on glass (SOG) film or the like, and resist patterns 115 are formed by the lithography technique. As the resist pattern 115, the line-and-space shaped core forming patterns 115a which extends in the X direction is formed in the area where the word lines WL is formed, and the pattern 115b is formed in the area for forming the two facing selection gate lines SGL of the memory units Su which are adjacent to each other in the Y direction so as to cover the area. Herein, the widths of the line in the Y direction and the space of the line-and-space shaped patterns 115a are set to 60 nm, and the width of the pattern 115b in the Y direction is set to 300 nm.

Next, as illustrated in FIGS. 12B and 13B, the resist patterns 115 are transferred to the mask film 114 by the RIE method, and the pattern is transferred to the core film 113. At this time, the process is performed under the condition that the selection ratio to the stopper film 112 is high so that the stopper film 112 is used as a stopper. For example, a gas such as $O_2/CH_4$ of which the selection ratio to the stopper film 112 can be easily taken may be used as a processing gas.

After the resist patterns 115 is transferred to the core film 113, sliming is performed until the widths of the core films 113 in the Y direction become a substantially half widths, that is, 30 nm. The sliming process may be performed according to the RIE method subsequent to the transferring of the resist patterns 115 to the core film 113. However, in the case where it is difficult to perform the sliming by using only the RIE method, the widths of the line-and-space shaped patterns 115a may be reduced in advance by using the lithography technique. Therefore, the line-and-space shaped core patterns 113a are formed in the area for forming the word lines WL, and the core pattern 113b is formed in the area for forming the selection gate lines SGL so as to cover the area. In addition, the widths of the line of the core patterns 113a in Y direction become 30 nm, and the widths of the spaces thereof in the Y direction become 90 nm. In addition, similarly to the fourth embodiment, the pattern 115b illustrated in FIGS. 12A and 13A which covers the area for forming the two selection gate lines SGL may not be formed, and herein, the core pattern 113b may not be formed in the area for forming the selection gate lines SGL.

After that, as illustrated in FIGS. 12C and 13C, a sidewall film 116 is formed above the entire surface of the processing object. The sidewall film 116 is formed so as to conformally cover the core patterns 113a and 113b formed on the stopper film 112. For example, an SiN film having a thickness of 30 nm which is substantially equal to the widths of the core patterns 113a may be used as the sidewall film 116.

Next, as illustrated in FIGS. 12D and 13D, etch-back is performed on the formed sidewall film 116 by the anisotropic etching such as the RIE method until the upper surfaces of the core patterns 113a and 113b are exposed. Herein, the process is performed under the condition where the selection ratio to the core patterns 113a and 113b and the stopper film 112 is high. For example, $CH_2F_2/Ar$ or the like may be used as a processing gas.

After that, as illustrated in FIGS. 12E and 13E, the core patterns 113a and 113b are removed. Herein, since carbon films are used as the core patterns 113a and 113b, a stripping technique using $O_2$ plasma may be used. Therefore, line-and-space shaped sidewall patterns 116a of which the line width and the space width are 30 nm are formed in the area for forming the word lines WL, and a sidewall pattern 116b is formed so as to surround the area for forming the adjacent two selection gate lines SGL. In addition, the sidewall patterns 116a and 116b are connected to other sidewall patterns 116a and 116b through the end portions in the X direction, so that closed loop structures are formed. In addition, although the sidewall patterns 116a are disposed at a substantially equal interval in the Y direction, the distances (spaces) between the sidewall pattern 116b and the sidewall pattern 116a adjacent to the sidewall pattern 116b is configured to be larger than the interval between the sidewall patterns 116a.

Next, as illustrated in FIGS. 12F and 13F, a core film 117 which becomes a mask for etching the selection gate lines SGL and becomes a core for forming the word lines WL is formed on the stopper film 112 where the sidewall patterns 116a and 116b are formed. At this time, the core film 117 is formed so that a portion between the adjacent sidewall patterns 116a and a portion between the sidewall pattern 116a and the sidewall pattern 116b are embedded and so that a film having a thickness required for processing the selection gate lines SGL is formed in an inner side surface of the closed-loop-shaped sidewall pattern 116b. *For example, Si with a thickness of 75 nm is formed as the core film 117*. In addition, herein, although not shown, in the case where a pattern of a peripheral circuit or the like is formed in an area excluding the area for forming the word lines WL, after that, a resist pattern for covering the core film 117 is formed by using the lithography technique.

After that, as illustrated in FIGS. 12G and 13G, etch-back of the formed core film 117 is performed by the anisotropic etching such as the RIE method until the upper surfaces of the sidewall patterns 116a and 116b are exposed. Herein, the process is performed under the condition where the selection ratio to the mask film 111 is high. For example, $Cl_2$ or the like may be used as the processing gas. In addition, since the stopper film 112 is also made of Si, it is preferable that the end point, where the etch-back of the entire surface is ended so that too much etching is not performed, be defined in advance by using a light emitting monitor or the like.

Next, as illustrated in FIGS. 12H and 13H, the sidewall patterns 116a and 116b are removed by the etching process. Wet etching using phosphoric acid or the like may be used for removing the sidewall patterns 116a and 116b. After that, as illustrated in FIGS. 12I and 13I, etch-back of the entire surface of the stopper film 112 is performed by the anisotropic etching such as the RIE method. Herein, the process is performed under the condition where the selection ratio to the mask film 111 is high. For example, $Cl_2/O_2$ or the like may be used as a processing gas. Therefore, core patterns can be obtained. Hereinafter, the pattern where the stopper films 112 and the core films 117 are stacked is denoted by core patterns 1171. More specifically, line-and-space shaped core patterns 1171a, a pair of dummy core patterns 1171d disposed at the end portion of a group in the Y direction including a plurality of the core patterns 1171a, and a core pattern 1171b for forming the selection gate lines SGL are formed.

Next, as illustrated in FIGS. 12J and 13J, sliming of the core pattern 1171 is performed by the isotropic etching until the widths of the core patterns 1171a in the Y direction become a substantially half widths, that is, 15 nm. For example, CDE may be sued as the isotropic etching. Therefore, the width of the core pattern 1171b in the Y direction becomes 55 nm.

After that, as illustrated in FIGS. 12K and 13K, a sidewall film 118 is formed above the entire surface of the processing object. The sidewall film 118 is formed so as to conformally cover the pattern of the core patterns 1171 formed on the mask film 111. For example, an SiN film having a thickness of 15 nm which is substantially equal to the widths of the core patterns 1171a after sliming may be used as the sidewall film 118.

Next, as illustrated in FIGS. 12L and 13L, etch-back of the formed sidewall film 118 is performed by the anisotropic etching such as the RIE method until the upper surfaces of the core patterns 1171a, 1171b, and 1171d are exposed. Herein, the process is performed on the core patterns 1171a, 1171b, and 1171d and the mask film 111 under the condition of a high selection ratio. For example, $CH_2F_2/Ar$ or the like may be used as a processing gas.

After that, as illustrated in FIGS. 12M and 13M, a resist is applied above the entire surface of the processing object, and patterning is performed by the lithography technique so that an area including a pair of the selection gate lines SGL, which are adjacent to each other in the Y direction, is covered and the other areas are exposed, so that a resist pattern 119 is formed. Next, as illustrated in FIGS. 12N and 13N, the core patterns 1171a and 1171d are removed by the etching process. Wet etching using choline may be used as the etching process. In addition, as illustrated in FIGS. 12O and 13O, the resist pattern 119 is removed by the resist stripping technique using $O_2$ plasma. Therefore, sidewall patterns 118a which become patterns for forming the word lines WL and a dummy pattern 118d are formed in the area for forming the word lines WL, and a pattern 120 for forming the selection gate lines SGL which is made of the core pattern 1171b and sidewall patterns 118b formed to surround the side surface thereof is formed in the area for forming the selection gate lines SGL.

Next, as illustrated in FIGS. 12P and 13P, the mask film 111 is processed by the anisotropic etching such as the RIE method using the pattern 120, the sidewall patterns 118a, and the dummy pattern 118d, which are obtained by the processes up to the process of FIGS. 12O and 13O, as a mask. Herein, the process is performed under the condition where the selection ratio to the processing object is high. For example, a gas such as $C_4F_8/Ar/O_2$ may be used as the processing gas. Therefore, mask patterns 111a for forming the line-and-space shaped word lines WL of which the line width and the space width are 15 nm and mask patterns 111d for forming the dummy pattern of which the line width is 15 nm and which is located at the both ends of a group in the Y direction including a predetermined number of the mask patterns 111a for forming the word lines WL are formed in the area for forming the word lines WL, and mask pattern 111b for forming the selection gate lines SGL of which the width in the Y direction is 85 nm are formed in the area for forming the selection gate lines SGL.

After that, as illustrated in FIGS. 12Q and 13Q, the processing object is etched by the anisotropic etching such as the RIE method using the mask patterns 111a, 111b, and 111d as a mask. Therefore, the word lines WL which are arranged at a predetermined interval in the Y direction and the dummy patterns DM are formed to extend in the X direction between a pair of the selection gate lines SGL which extend in the X direction. In addition, FIG. 13Q illustrates the state where the semiconductor substrate (silicon substrate) 1 which constitutes STI2 as the base is exposed by etching the processing object. In addition, the two dummy patterns DM are disposed between the selection gate line SGL and the word line WL. Unlike the word lines WL, since these patterns are not arranged at a predetermined interval in the Y direction, these patterns become the dummy patterns which are not used as wire lines for the memory cell.

In this manner, the patterned processing objects (the selection gate line SGL, the word lines WL, and the dummy pattern DM) constitute closed loop structures. In other words, the end portions of the selection gate lines SGL, the word lines WL, and the dummy patterns DM in the X direction are connected to the other selection gate lines SGL, the other word lines WL, and the other dummy patterns DM. Therefore, a process for removing the connection portions of the end portions in the X direction is performed. Herein, as illustrated in FIGS. 12R and 13R, a resist is applied on the processing object, the connection portions of the end portions of the selection gate lines SGL and the word lines WL in the X direction are exposed by the lithography technique, and patterning is performed so as to cover other portions, so that a resist pattern 121 is formed.

Next, as illustrated in FIGS. 12S and 13S, the processing object is etched by the anisotropic etching such as the RIE method using the resist pattern 121 as a mask, so that closed loops cutting process is performed. Herein, the selection gate line SGL, the word line WL, and the dummy pattern DM in the area which is not covered by the resist pattern 121 are removed. After that, the resist pattern 121 is removed by the resist stripping technique. Accordingly, the line-and-space shaped word lines WL which are arranged at a predetermined interval in the Y direction are formed to extend in the X direction between a pair of the selection gate lines SGL which extend in the X direction.

In the fifth embodiment, the effects as those of the fourth embodiment can also be obtained.

In addition, although a pattern forming method for the selection gate lines SGL and the word lines WL in a NAND type flash memory is described in the above embodiments, the above embodiment may be applied to a case of forming a fine pattern and a pattern of which the size is larger than that of the fine pattern.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A pattern forming method comprising:
   forming a first mask film above a processing target;
   forming an opening pattern in a predetermined area of the first mask film;
   conformally forming a second mask film of a material different from that of the first mask film above the processing target above which the opening pattern is formed;
   performing etch-back of the second mask film until an upper surface of the first mask film is exposed so that the second mask film remains on a side surface of the first mask film;

forming a third mask film formed of the same material as the first mask film above the processing target after the second mask film remains on the side surface of the first mask film;
planarizing an upper surface of the third mask film by using the second mask film as a stopper;
forming line-and-space-shaped first core patterns, that are made of a first core film and in which widths of line patterns have smaller than a width of the second mask film remaining on the side surface of the first mask film, in an area other than an area forming the opening pattern of the processing target after the third mask film is planarized;
conformally forming a first sidewall film above the processing target above which the first core patterns are formed;
performing etch-back of the first sidewall film so that upper surfaces of the first core patterns are exposed;
forming first sidewall patterns made of the first sidewall film by removing the first core patterns;
forming mask patterns by etching the first mask film and the third mask film using the first sidewall patterns; and
patterning the processing target by using the second mask film and the mask patterns as masks.

2. The pattern forming method according to claim 1, wherein in the forming of the first core patterns, after processing the first core film to line-and-space shaped patterns having first widths, the first core films are slimmed until widths of the patterns become substantially half the first widths.

3. The pattern forming method according to claim 1, wherein
in the forming of the first core patterns, a second core film of a material different from that of the first core film is formed between the third mask film and the first core film, and
the forming the mask patterns includes,
forming second core patterns by etching the second core film using the first sidewall patterns,
slimming the second core patterns,
conformally forming a second sidewall film above the processing target above which the slimmed second core patterns are formed,
performing etch-back of the second sidewall film so that upper surfaces of the second core patterns are exposed,
forming second sidewall patterns made of the second sidewall film by removing the second core patterns, and
etching the first mask film and the third mask film using the second sidewall patterns.

4. The pattern forming method according to claim 3, wherein
the processing target is an object where a plurality of memory units are formed in a semiconductor substrate including element isolation insulating films which extend in a first direction and are arranged at a predetermined interval in a second direction perpendicular to the first direction, each memory unit including a gate insulating film, a floating gate electrode film, an inter-electrode insulating film and a control gate electrode film which are stacked in order on the semiconductor substrate,
in the forming of the opening pattern, the opening pattern is formed in such a manner that an area including a pair of selection gate lines, extending in the second direction and facing each other, of the memory units that are adjacent to each other in the first direction is open, and
in the forming of the first core patterns, the first core patterns are formed in an area including line-and-space shaped word lines formed between a pair of the selection gate lines that are disposed at respective both ends of the memory unit in the first direction.

5. The pattern forming method according to claim 4, wherein
in the performing of etch-back of the second mask film, the etch-back of the second mask film is performed so that the second mask film remains at a formation position of the selection gate line, and
in the forming of the second sidewall patterns, the second sidewall patterns are formed at a formation position of the word lines.

6. A pattern forming method comprising:
forming a core film above a processing target;
forming core patterns including line-and-space shaped patterns by processing the core film;
conformally forming a first sidewall film above the processing target above which the core patterns are formed;
performing etch-back of the first sidewall film so that upper surfaces of the core patterns are exposed;
forming first sidewall patterns made of the first sidewall film above the processing target by removing the core patterns;
conformally forming a mask film above the processing target above which the first sidewall patterns are formed, so as to embed portions between the adjacent first sidewall patterns formed in an area forming the line-and-space shaped patterns;
performing etch-back of the mask film until upper surfaces of the first sidewall patterns are exposed so that the mask film formed on side surfaces of the first sidewall patterns of end portions without being embedded between the adjacent first sidewall patterns remains;
forming mask patterns that include line-and-space shaped first patterns corresponding to the mask film embedded between the adjacent first sidewall patterns and a second pattern corresponding to the mask film remaining on the side surfaces of the first sidewall patterns of the end portions, by removing the first sidewall patterns; and
patterning the processing target by using the mask patterns.

7. The pattern forming method according to claim 6, wherein in the forming of the core patterns, after processing the core film so as to include line-and-space shaped patterns having first widths, the core films are slimmed until the widths of the patterns become substantially half the first widths.

8. The pattern forming method according to claim 6, wherein the patterning the processing target includes,
slimming the mask patterns until the mask patterns have widths substantially half widths of the first patterns,
conformally forming a second sidewall film above the processing target above which the slimmed mask patterns are formed,
performing etch-back of the second sidewall film so that upper surfaces of the slimmed mask patterns are exposed,
forming second sidewall patterns made of the second sidewall film formed in an area forming the line-and-space shaped patterns by selectively removing the first patterns among the exposed mask patterns so that the second pattern surrounded by the second sidewall film is not removed, and etching the processing target using the second sidewall patterns and the second pattern surrounded by the second sidewall film as masks.

9. The pattern forming method according to claim 6, wherein
the processing target is an object where a plurality of memory units are formed in a semiconductor substrate including element isolation insulating films which extend in a first direction and are arranged at a predetermined interval in a second direction perpendicular to the first direction, each memory unit including a gate insulating film, a floating gate electrode film, an inter-electrode insulating film and a control gate electrode film that are stacked in order on the semiconductor substrate,
in the forming of the core patterns, the line-and-space shaped patterns are formed in an area including line-and-space shaped word lines formed between a pair of selection gate lines which are disposed at respective both ends of the memory unit in the first direction and extend in the second direction.

10. The pattern forming method according to claim 9, wherein in the forming of the core patterns, the core patterns further including a pattern covering an area including a pair of the selection gate lines, facing each other, of the memory units that are adjacent to each other in the first direction are formed.

11. The pattern forming method according to claim 9, wherein in the forming of the mask patterns, the first patterns are formed at a formation position of the word lines, and the second pattern is formed at a formation position of the selection gate line.

* * * * *